(12) United States Patent
Thompson et al.

(10) Patent No.: US 10,644,386 B2
(45) Date of Patent: May 5, 2020

(54) DEPLOYABLE RADIO FREQUENCY TRANSMISSION LINE

(71) Applicant: EURECO TECHNOLOGIES LIMITED, Ryde, Isle of Wight (GB)

(72) Inventors: Alan Thompson, Ryde (GB); Martin Thompson, Ryde (GB)

(73) Assignee: EURECO TECHNOLOGIES LIMITED, Ryde, Isle of Wight (GB)

( * ) Notice: Subject to any disclaimer, the term of this patent is extended or adjusted under 35 U.S.C. 154(b) by 0 days.

(21) Appl. No.: 15/570,349

(22) PCT Filed: Apr. 29, 2016

(86) PCT No.: PCT/GB2016/051244
§ 371 (c)(1),
(2) Date: Oct. 29, 2017

(87) PCT Pub. No.: WO2016/174467
PCT Pub. Date: Nov. 3, 2016

(65) Prior Publication Data
US 2018/0151948 A1 May 31, 2018

(30) Foreign Application Priority Data

Apr. 29, 2015 (GB) .................................. 1507353.9

(51) Int. Cl.
| | |
|---|---|
| *H01Q 1/28* | (2006.01) |
| *H01P 1/06* | (2006.01) |
| *H01Q 1/08* | (2006.01) |
| *H01P 1/04* | (2006.01) |
| *H01Q 1/06* | (2006.01) |
| *H01Q 15/14* | (2006.01) |

(Continued)

(52) U.S. Cl.
CPC ............ *H01Q 1/288* (2013.01); *H01P 1/047* (2013.01); *H01P 1/064* (2013.01); *H01Q 1/06* (2013.01); *H01Q 1/08* (2013.01); *H01Q 15/14* (2013.01); *H01R 12/732* (2013.01); *H05K 1/148* (2013.01)

(58) Field of Classification Search
CPC ............ H01Q 1/288; H01Q 1/06; H01Q 1/08; H01Q 15/14
See application file for complete search history.

(56) References Cited

U.S. PATENT DOCUMENTS

| | | |
|---|---|---|
| 3,221,286 A | 11/1965 | Feede |
| 5,239,793 A | 8/1993 | Chiappetta et al. |

(Continued)

FOREIGN PATENT DOCUMENTS

| | | |
|---|---|---|
| EP | 1704703 A1 | 9/2006 |
| GB | 2426635 A | 11/2006 |

(Continued)

OTHER PUBLICATIONS

European Examination Report issued in European Patent Application No. 16 725 200.6 dated Jan. 24, 2019.

*Primary Examiner* — Hoang V Nguyen
(74) *Attorney, Agent, or Firm* — Baker & Hostetler LLP

(57) ABSTRACT

A deployable radio frequency (RF) transmission line, comprising at least two members, hinged together for deployment between a folded state and an unfolded state; and at least one bridge component disposed at each inter-member junction to provide RF coupling for the transfer of RF energy between the at least two hinged members.

23 Claims, 40 Drawing Sheets

(51) Int. Cl.
  *H05K 1/14*   (2006.01)
  *H01R 12/73*  (2011.01)

(56) References Cited

U.S. PATENT DOCUMENTS

| | | | |
|---|---|---|---|
| 6,512,426 | B1 | 1/2003 | Wixforth |
| 6,831,602 | B2 | 12/2004 | McKinzie, III et al. |
| 6,861,989 | B2 * | 3/2005 | Morningstar .......... H01Q 1/243 343/702 |
| 7,593,524 | B2 * | 9/2009 | Maenpaa ............ H04M 1/0216 379/433.13 |
| 2005/0001773 | A1 | 1/2005 | Morningstar et al. |
| 2007/0202306 | A1 | 8/2007 | Nikaldo et al. |
| 2008/0125195 | A1 | 5/2008 | Maenpaa |
| 2009/0000062 | A1 * | 1/2009 | Yamanami ............ G06F 1/1616 16/366 |
| 2010/0289706 | A1 | 11/2010 | Hsieh et al. |
| 2012/0086609 | A1 * | 4/2012 | Kikuchi ................ H01Q 1/243 343/702 |
| 2013/0319739 | A1 | 12/2013 | Arnold |
| 2015/0028968 | A1 | 1/2015 | Katipally et al. |

FOREIGN PATENT DOCUMENTS

| | | | |
|---|---|---|---|
| GB | 2455311 | A | 6/2009 |
| JP | 2011054455 | A | 3/2011 |

* cited by examiner

DEPLOYABLE RADIO FREQUENCY TRANSMISSION LINE

This invention relates to satellite communications, radar and navigation antennas, specifically to the use of deployable radio frequency transmission lines in such antennas.

It is sometimes necessary for a communications or radar satellite to carry a relatively large antenna to satisfy the performance requirements of a system. This antenna is folded and stowed in a launch vehicle and deployed in orbit. One form of antenna is a direct radiating array, which is arranged on panels that are hinged together for the purpose of stowage and deployment. For example, UK patent GB2455311 to Thompson (2012) discloses a deployable structure for a direct radiating array antenna. The radiating elements of the direct radiating array antenna are disposed on a surface of each panel and are usually arranged as subarrays.

Coaxial cable is typically used to convey radio frequency energy between electronic subsystems of a payload, mounted on the satellite platform, and each subarray of radiating elements in the deployed antenna. The coaxial cable must be sufficiently flexible to allow easy movement of the panels during deployment and the required flexibility of the coaxial cable is achieved by using a relatively small cable diameter. However, the use of a small cable diameter causes excessive loss in the transmission of the radio frequency energy, which reduces the efficiency of the antenna and limits the system performance. For example, in an antenna of a P-band synthetic aperture radar instrument, the loss associated with the coaxial cable can halve the radar sensitivity of the instrument. To recover this loss in sensitivity, the area of the antenna would need to be more than doubled, due to diminishing returns caused by additional losses in the coaxial cable. In addition, temperature variations over long lengths of coaxial cable have a strong impact on the amplitude and phase errors across the antenna aperture, which can degrade the radiometric stability of radar instruments and thus reduce the scientific value of Earth observation missions. The objectives of such missions include the provision of maps of forest biomass stocks and the improvement of forest biomass inventories, which have been identified by the United Nations Framework Convention on Climate Change as an Essential Climate Variable needed to reduce uncertainties in our knowledge of the Climate Observing System. Other Earth observation radar missions are concerned with ice sounding measurements of the polar regions.

At the inter-panel junctions of a direct radiating aperture, it is necessary to loop the coaxial cables around drums to reduce resistive torque for easing deployment. These loops increase the lengths of the coaxial cables, causing additional loss and, together with the drums, increase the overall mass of the antenna without contributing to its rigidity.

In a satellite communications system, coaxial cables and their connectors are a potential source of passive intermodulation. Passive intermodulation occurs when two or more high power radio frequency signals encounter non-linear electrical junctions or materials, which can cause new signals to be generated from the original radio frequency inputs. If these signals fall within the bandwidth of the communications receiver then the increased noise floor can cause reduced data rates, decreased service quality and a reduction in communications system capacity. These conditions cause frustration for users and lost revenue for the communication service providers.

Another form of relatively large antenna is a deployable mesh reflector that is illuminated from a feed array comprising radiating elements mounted on a deployable hinged panel. One or more coaxial cables are required between the satellite payload electronics and the deployable panel, which can cause issues for deployment and system performance.

To minimise loss, improve antenna efficiency, reduce the level of passive intermodulation, minimise deployment torque and minimise mass for a given performance, the present invention proposes an improved deployable radio frequency (RF) transmission line.

According to at least one embodiment of the disclosure there may be provided a deployable radio frequency (RF) transmission, comprising a number of transmission line sections (such as "panels" or "members", for example), hinged together for deployment between a ("stowed") folded state and a ("deployed") unfolded state, with (optionally elastically and/or resiliently bendable/deformable and/or slidable) bridges disposed at each inter-panel junction so as to provide radio frequency coupling for the transfer of radio frequency energy from transmission lines disposed in (or on) one panel to transmission lines disposed in (or on) a neighbouring panel, whereby radio frequency energy is conveyed throughout deployed panels to feed one or more radiating elements of an antenna.

As used herein, the term "member" preferably connotes a "section" or "panel" (e.g. a "component part") of a transmission line or an antenna, for example. Furthermore, as used herein, the term "bridges" preferably connotes at least one bridge component, which comprise an assembly or a composite arrangement, for example. The bridges are preferably arranged to provide an electromagnetic coupling between at least two neighbouring panels (or "members"), which may be hinged together. A gap may be present between two neighbouring, preferably hinged, panels (e.g. at an inter-panel junction), and the bridge component may therefore be arranged to span across the gap, optionally to maintain the electromagnetic coupling.

According to at least one embodiment of the disclosure there may be provided an apparatus for conveying an electrical signal, comprising: a first member; a second member, hinged to the first member; and at least one bridge component arranged to provide an electromagnetic coupling between the first and second members, whereby a portion of the bridge member spans a gap between the first and second members; wherein the bridge component is configured to be able to move relative to at least one of the first member or second member while maintaining the electromagnetic coupling between the first and second members, such that the length of said portion of the bridge component that spans the gap between the first and second members is variable so as to allow the first and second members to move between a folded state and an unfolded state.

The at least one bridge component may be arranged to slide relative to at least one of the first member or second member and/or may be arranged to be moveable relative to both the first member and second member while remaining attached thereto.

At least one guide assembly may be provided on at least one of the first member or second member within which at least one guide assembly the at least one bridge component is arranged to slide. Preferably, the guide assembly is arranged to limit the range of movement of the at least one bridge component, preferably relative to the member. The guide assembly may comprise means for limiting the range of movement of the at least one bridge component. The at least one guide assembly may further comprise a cover arranged to retain the at least one bridge component within the guide assembly.

The at least one bridge component may be sufficiently flexible to allow it to be moved between a folded state, preferably where an angle between the first and second member is less than about 15 degrees, and an unfolded state, preferably where the angle between the first member and second member is between about 90 degrees and about 180 degrees.

The at least one bridge component may be arranged to bias apart the first and second hinged members from a folded state to an unfolded state, optionally wherein the at least one bridge component is resiliently deformable such that it is placed under strain when the first and second members are folded together.

A further bridge component may be provided, the further bridge component being arranged to provide an electromagnetic coupling between the first and second members, wherein said at least one (first) bridge component is arranged on a first surface of each of the first and second hinged members, and the further (second) bridge component is arranged on a second surface of each of the first and second hinged members. The further (second) bridge component is preferably configured to be able to move relative to at least one of the first member or second member while maintaining the electromagnetic coupling between the first and second members, such that the length of a portion of said further (second) bridge component that spans the gap between the first and second members is variable so as to allow the first and second members to move between a folded state and an unfolded state.

The further (second) bridge component arranged on said second surface may be configured to move relative to said at least one of the first member or second member in an opposing direction to said (first) bridge component arranged on said first surface, for example such that as the length of said portion of said (first) bridge component increases (or decreases), the length of said portion of said further (second) bridge component decreases (or increases). The further (second) bridge component may be arranged to act as a ground plane. The further (second) bridge component may be wider than said (first) bridge component.

At least one of said (first) bridge component or the further (second) bridge component may comprise at least one electrically conductive trace. At least one of the ground plane or the electrically conductive trace may have a length that is approximately equal to a fraction of the wavelength corresponding to a desired operating frequency of an electrical signal to be conveyed by the bridge component. The fraction may be a multiple of about one eighth; optionally wherein the fraction is about one eighth; optionally wherein the fraction is about one quarter, or optionally wherein the fraction is about one half.

Means for inhibiting passive intermodulation in the electrical signal may be further provided. At least one bridge component may comprise a dielectric medium. At least one of the first member or second member may comprise low-density foam, optionally a low-density foam comprising polymethacrylimide or a quartz honeycomb, for example. A low-friction film may be provided between the at least one bridge component and at least one of the first member or second member, optionally a film comprising fluorinated ethylenepropylene, for example.

At least one of the first member or second member may comprise a transmission line medium, optionally a planar transmission line medium, optionally a stripline transmission line or a microstrip transmission line. Preferably, the electrical signal to be conveyed by the apparatus is a radio frequency (RF) signal.

According to at least one embodiment of the disclosure there may be provided a deployable radio frequency (RF) transmission line, incorporating an apparatus as described above and herein.

According to at least one embodiment of the disclosure there may be provided a deployable radio frequency (RF) transmission line, comprising: at least two members, hinged together for deployment between a folded state and an unfolded state; and at least one bridge component disposed at each inter-member junction to provide RF coupling for the transfer of RF energy between the at least two hinged members.

The at least one bridge component may be elastically deformable, optionally such that it can be deformed in a folded state and then return substantially to its original form in an unfolded state.

The at least two members may comprise a transmission line medium, optionally wherein the transmission line medium is disposed in (or on) at least one (or each) of the at least two members. The transmission line medium may comprise a planar transmission line, optionally a stripline transmission line or a microstrip transmission line.

At least one bridge component may be bendable, optionally such that it is sufficiently flexible to allow the at least two hinged members to be folded together. The at least one bridge component may be slidable relative to at least one member to which it is attached.

The at least one bridge component may be resiliently deformable such that folding the first member and second member together places the at least one bridge component under at least one of compressive stress, tensile stress or strain, whereby the at least one bridge component acts to bias apart the first and second hinged members from a folded state to an unfolded state, preferably during deployment of the RF transmission line.

Means for mechanically powering the deployment of the RF transmission line from the folded state to the unfolded state may optionally be provided. The means for mechanically powering the deployment may be provided by the bridge component, optionally wherein the bridge component is arranged to bias apart the first member and second member from a folded state to an unfolded state.

A plurality of bridge components may be provided, optionally spanning the same gap between two hinged members. A plurality of hinged members may be provided, the plurality of hinged members being arranged such that they can be folded together for deployment, optionally wherein the plurality of hinged members can be folded in a substantially concertina arrangement.

The apparatus or the deployable RF transmission line is preferably arranged such that RF energy is conveyed throughout the at least two hinged members once deployed to feed one or more radiating elements of an antenna. Each member of the deployable RF transmission line may be a panel of a deployable antenna. The deployable RF transmission line may be arranged to convey RF energy between the body of a satellite and at least one radiating component disposed on a deployable panel, optionally for the purpose of illuminating a reflector antenna of the satellite.

According to at least one embodiment of the disclosure there may be provided an antenna for a satellite, incorporating a deployable radio frequency (RF) transmission line as described above and herein.

The invention may extend to an apparatus, a deployable radio frequency (RF) transmission line, and an satellite comprising a deployable RF transmission line substantially as described herein and shown in the accompanying figures.

As used herein, the term "bridge component" preferably connotes some or all components arranged to bridge between two members, including without limitation a flexible dielectric trace bridge, a trace-bridge assembly, a flexible dielectric ground plane bridge, and a ground-bridge assembly.

As used herein, the term "guide assembly" preferably connotes some or all components arrange to limit the range of movement of the bridge component, preferably relative to the member on which it is arranged or disposed, including a dielectric guide base, a dielectric guide cover, guide spacers, stops, and notches provided on the bridge component, for example.

Any method feature described and/or claimed herein may also be provided as an apparatus feature, and vice versa. Furthermore, any feature in a particular embodiment of the invention may be provided independently and/or applied to other embodiments of the invention, in any appropriate combination. As used herein, means plus function features may be expressed alternatively in terms of their corresponding structure.

The invention will now be described merely by way of example and with reference to the accompanying drawings, wherein.

Figure 1A:
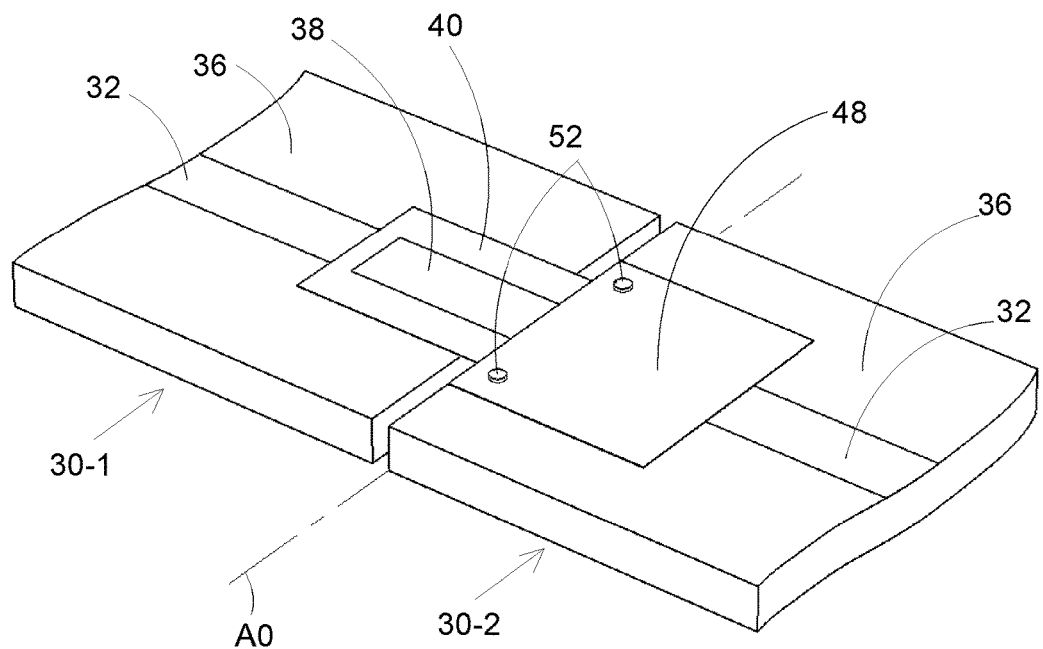
FIG. 1A shows a trace view of a two-section microstrip transmission line in a deployed state, with dielectric guide cover in situ.

Where necessary in the figures, a hyphen, followed by a number/letter, is appended to the reference numeral of a generic part to avoid ambiguity in the following description.

One embodiment of a deployable radio frequency transmission line is illustrated in FIGS. 1 to 4, which show different aspects of a deployed two-section microstrip transmission line, comprising a first microstrip transmission line 30-1 and a second microstrip transmission line 30-2, mechanically coupled together by means of a hinge (not shown) to allow relative rotation of the first and second microstrip transmission lines about rotation axis A0.

Figure 1B:
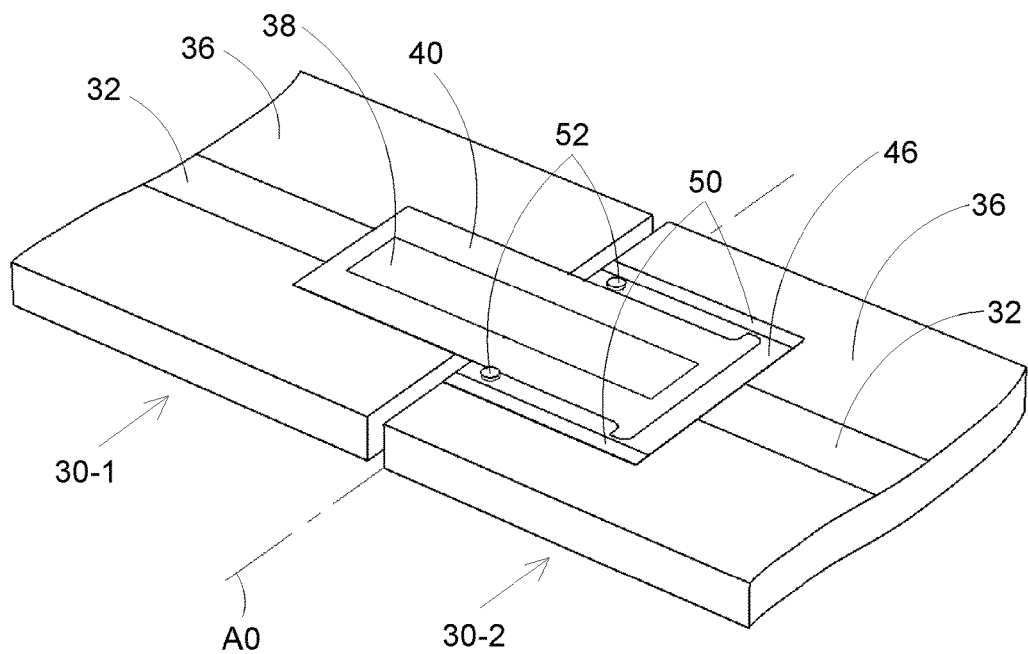
FIG. 1B shows a trace view of a two-section microstrip transmission line in a deployed state, with dielectric guide cover removed to reveal more detail.
Figure 2:
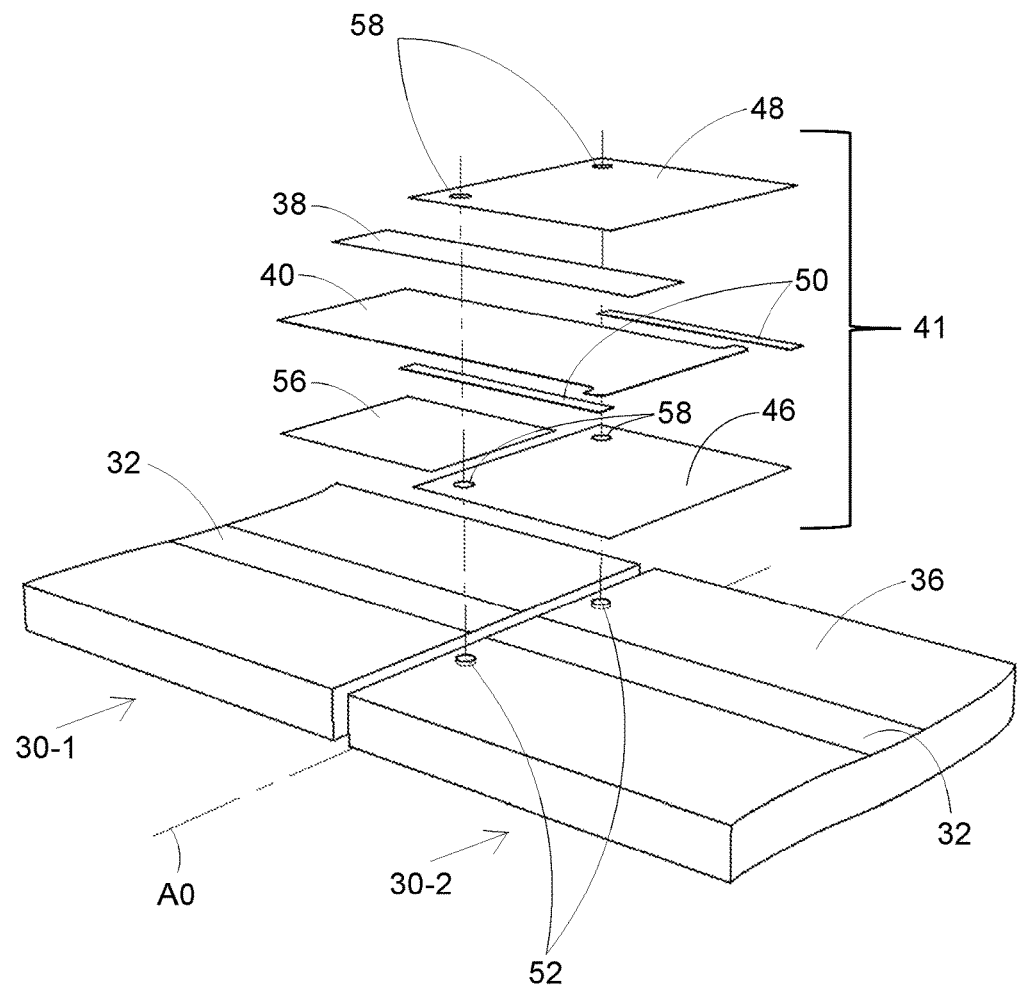
FIG. 2 shows a trace view of a two-section microstrip transmission line in a deployed state, with an exploded view of the trace-bridge assembly.
Figure 3A:
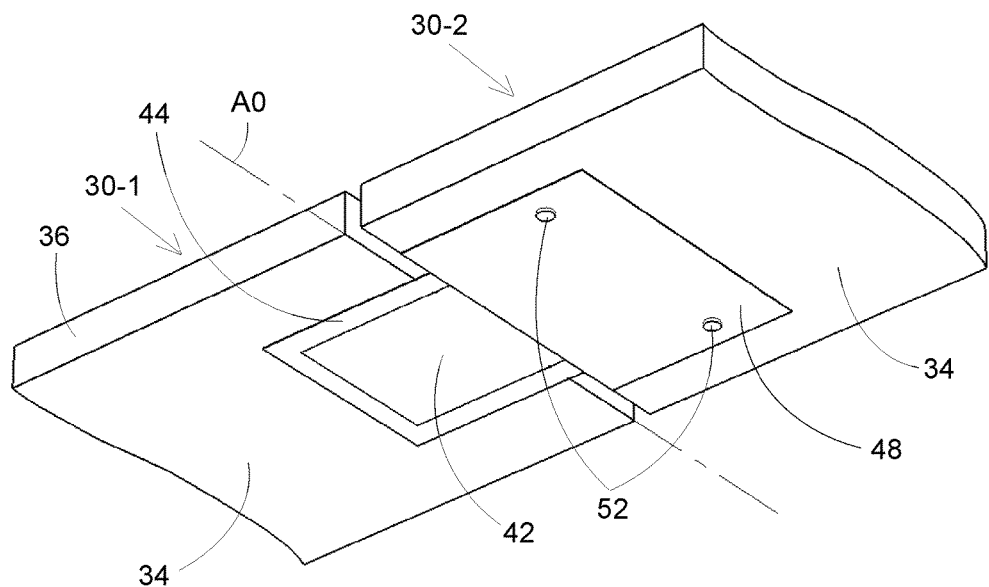
FIG. 3A shows a ground plane view of a two-section microstrip transmission line in a deployed state, with dielectric guide cover in situ.
Figure 3B:
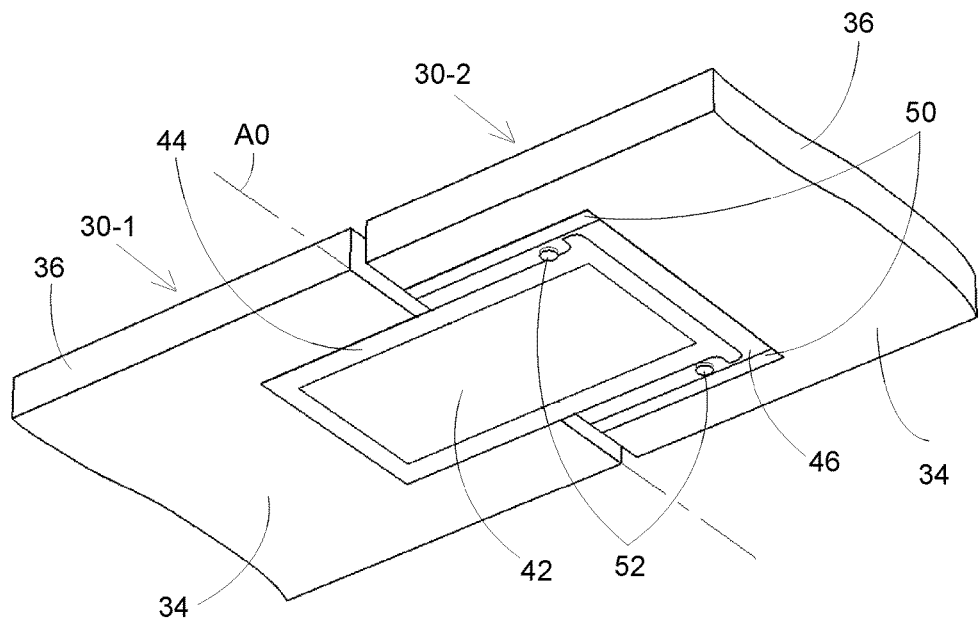
FIG. 3B shows a ground plane view of a two-section microstrip transmission line in a deployed state, with dielectric guide cover removed to reveal more detail.
Figure 4:
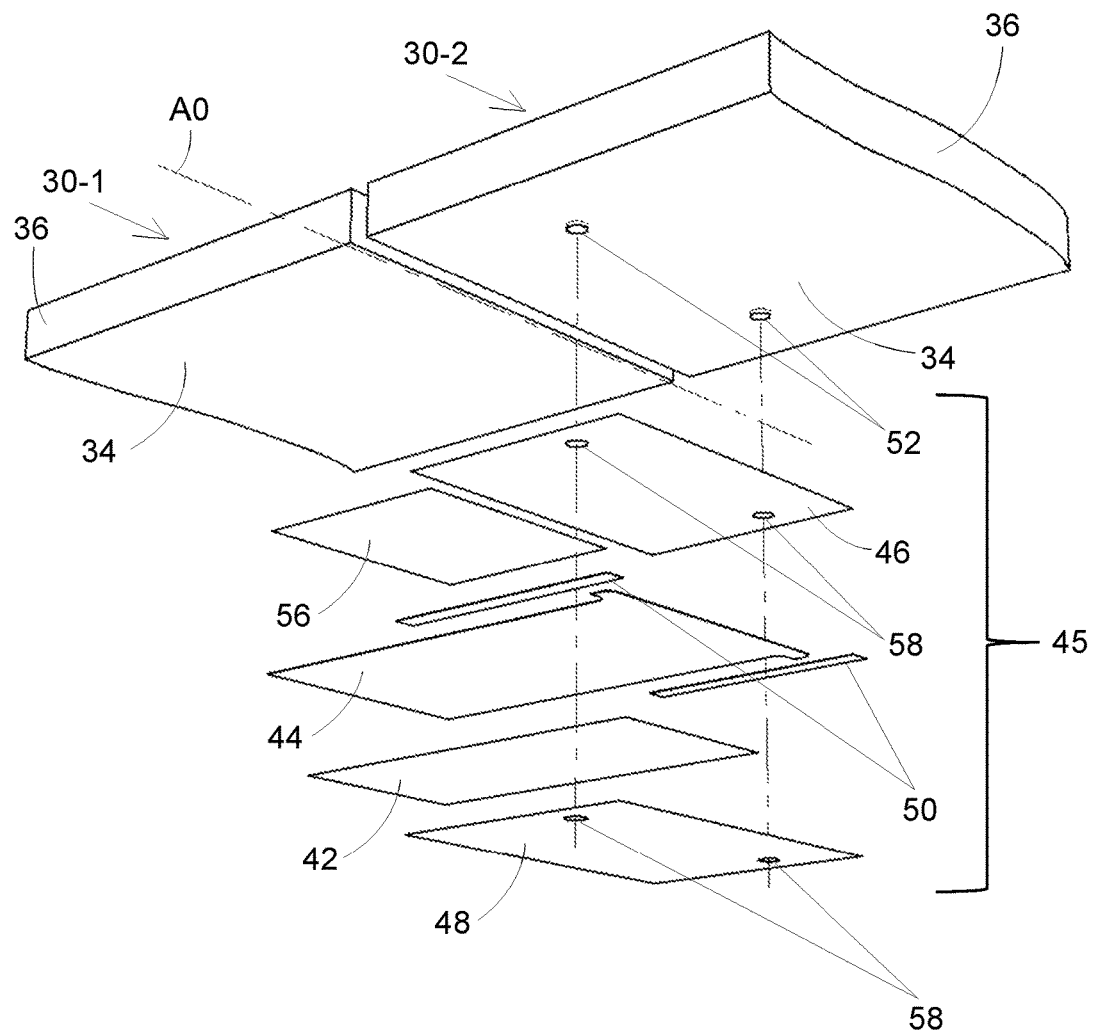
FIG. 4 shows a ground plane view of a two-section microstrip transmission line in a deployed state, with an exploded view of the ground-bridge assembly.

For clarity, dielectric guide covers 48, which are shown in FIGS. 1A and 3A, and in the exploded views of FIGS. 2 and 4, are not shown in FIGS. 1B and 3B.

Electrically-conducting traces 32 are spaced apart from electrically-conducting ground planes 34 (FIG. 3) by rigid dielectric substrates 36 to form the respective first and second microstrip transmission lines 30-1, 30-2.

Referring to FIG. 1 and the exploded view in FIG. 2, flexible electrically-conducting trace 38 is bonded to flexible dielectric trace bridge 40, which is firmly attached to rigid dielectric substrate 36 of first microstrip transmission line 30-1. Flexible dielectric trace bridge 40 and flexible electrically-conducting trace 38 are kept in close proximity to second microstrip transmission line 30-2 by dielectric guide cover 48, which, together with guide spacers 50, is firmly attached to second microstrip transmission line 30-2. Flexible dielectric trace bridge 40 is free to slide relative to second microstrip transmission line 30-2 when there is relative rotation of the first and second microstrip transmission lines about rotation axis A0. Dielectric guide base 46, which is firmly attached to second microstrip transmission line 30-2, dielectric guide cover 48, flexible dielectric trace bridge 40 and flexible electrically-conducting trace 38 are made of low-friction material to facilitate easy sliding of flexible dielectric trace bridge 40 when there is relative rotation of the first and second microstrip transmission lines about rotation axis A0. Dielectric bridge support 56 is of a similar thickness to dielectric guide base 46 to ensure that flexible dielectric trace bridge 40 and flexible electrically-conducting trace 38 are not distorted. Stops 52, which are fixed to second microstrip transmission line 30-2, and holes 58 (FIG. 2) assist the alignment of dielectric guide base 46 and dielectric guide cover 48 during assembly. Trace-bridge assembly 41 (FIG. 2) thus provides a link between respective traces 32 of the first and second microstrip transmission lines.

Referring to FIG. 3 and the exploded view in FIG. 4, flexible electrically-conducting ground plane 42 is bonded to flexible dielectric ground plane bridge 44, which is firmly attached to rigid dielectric substrate 36 of first microstrip transmission line 30-1. Flexible dielectric ground plane bridge 44 and flexible electrically-conducting ground plane 42 are kept in close proximity to second microstrip transmission line 30-2 by dielectric guide cover 48, which, together with guide spacers 50, is firmly attached to second microstrip transmission line 30-2. Flexible dielectric ground plane bridge 44 is free to slide relative to second microstrip transmission line 30-2 when there is relative rotation of the first and second microstrip transmission lines about rotation axis A0. Dielectric guide base 46, which is firmly attached to microstrip transmission line 30-2, dielectric guide cover 48, flexible dielectric ground plane bridge 44 and flexible electrically-conducting ground plane 42 are made of low-friction material to facilitate easy sliding of flexible dielectric ground plane bridge 44 when there is relative rotation of the first and second microstrip transmission lines about rotation axis A0. Dielectric bridge support 56 is of a similar thickness to dielectric guide base 46 to ensure that flexible dielectric ground bridge 44 and flexible electrically-conducting ground plane 42 are not distorted. Stops 52, which are fixed to second microstrip transmission line 30-2, and holes 58 (FIG. 4) assist the alignment of dielectric guide base 46 and dielectric guide cover 48 during assembly. Ground-bridge assembly 45 (FIG. 4) thus provides a link between respective ground planes 34 of the two-section microstrip transmission line.

Referring to FIGS. 1 to 4, the close proximity of flexible electrically-conducting trace 38 to the respective electrically-conducting traces 32 of the first and second microstrip transmission lines, as well as the close proximity of flexible electrically-conducting ground plane 42 to the respective electrically-conducting ground planes 34 of the first and second microstrip transmission lines, enable the transfer of radio frequency energy between the first and second microstrip transmission lines, as explained in the following paragraph.

Flexible electrically-conducting trace 38, electrically conducting traces 32 and intervening dielectric regions, comprising dielectric bridge support 56, dielectric guide base 46 and flexible dielectric trace bridge 40, form two parallel-plate transmission lines that are in series with the two-section microstrip transmission line. Similarly, flexible electrically conducting ground plane 42, electrically conducting ground planes 34 and intervening dielectric regions, comprising dielectric bridge support 56, dielectric guide base 46 and flexible dielectric ground plane bridge 44, form two parallel-plate transmission lines that are also in series with the two-section microstrip transmission line. The physical lengths of flexible electrically conducting trace 38 and flexible electrically-conducting ground plane 42 are predetermined such that the electrical length within the dielectric medium of each parallel-plate transmission line is nominally a quarter of a wavelength at the desired operating frequency. The open circuit, which exists at each distal end of flexible electrically conducting trace 38 and flexible electrically conducting ground plane 42 respectively, is transformed to give a short circuit condition at the proximal end of each parallel-plate transmission line, thus allowing an efficient transfer of radio frequency energy between the first and second microstrip transmission lines The range of operating frequencies is extended when each of the four parallel plate transmission lines has a very low characteristic impedance. A very low characteristic impedance is obtained through the use of thin materials for dielectric bridge supports 56, dielectric guide bases 46, flexible dielectric trace bridge 40 and flexible dielectric ground plane bridge 44. The use of these thin dielectric materials also minimises radiation from flexible electrically-conducting trace 38 and flexible electrically-conducting ground plane 42. Increasing the width of flexible electrically-conducting ground plane 42 beyond the width of flexible electrically-conducting trace 38, e.g. by three times, further reduces the characteristic impedance of the two parallel-plate transmission lines associated with the ground plane coupling. For best performance, the separation of the two sections of microstrip transmission line is predetermined and should be very much less than a quarter-wavelength, and the width of flexible trace 38 should also be predetermined to maintain the desired characteristic impedance of the microstrip transmission line.

The mechanical operation of a deployable radio frequency transmission line is now described by reference to FIGS. 5, 6 and 7, which respectively show a stowed state, an intermediate state and a deployed state of a three-section microstrip transmission line. A first section 30-1, a second section 30-2 and a third section 30-3 of the three-section microstrip transmission line are mechanically coupled together by means of hinges (not shown) to allow relative rotation about a first rotation axis A1 and a second rotation axis A2. For clarity, dielectric guide covers 48 (FIGS. 1A, 2, 3A and 4) are not shown in FIGS. 5, 6 and 7.

Figure 5A:
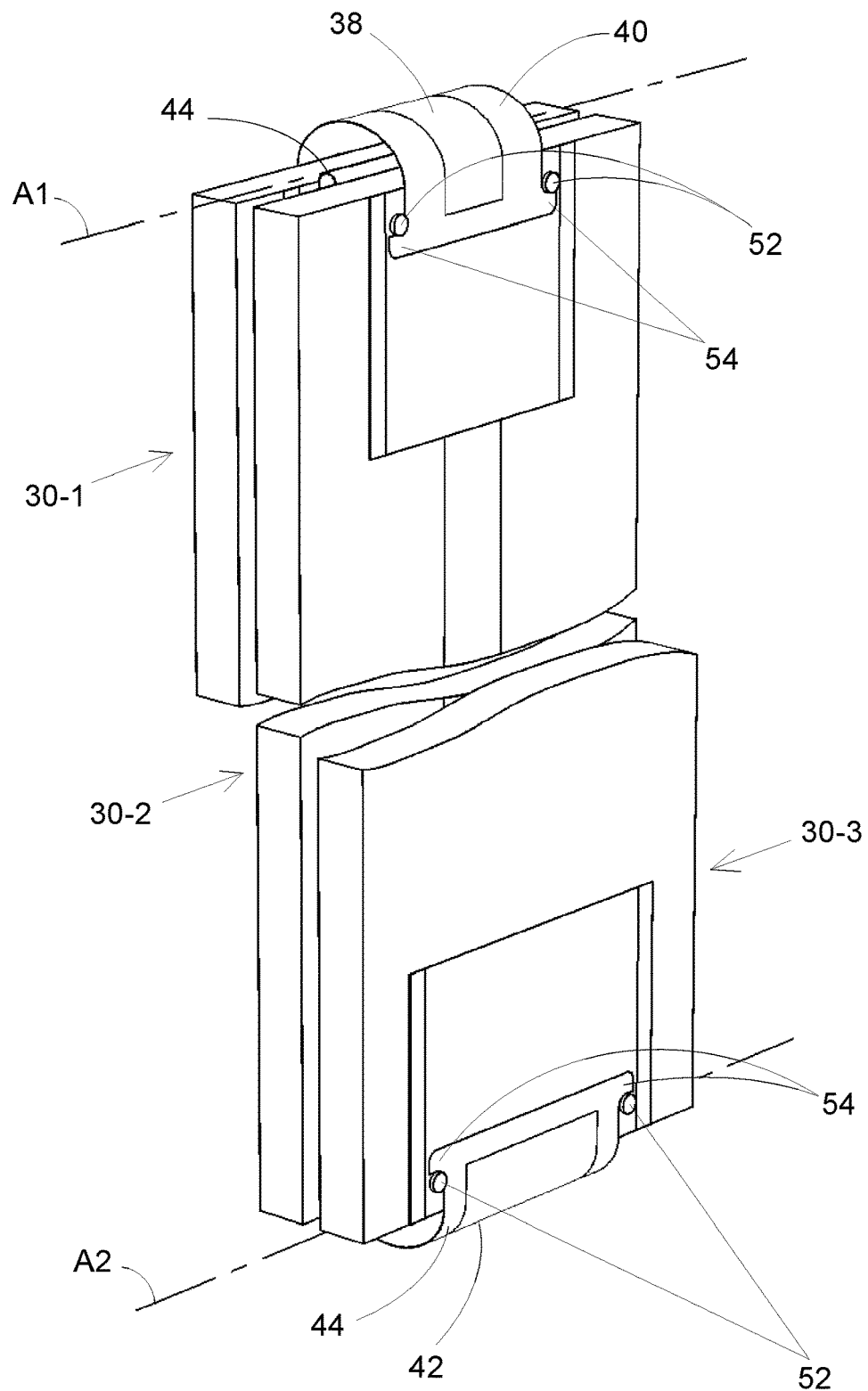
FIGS. 5A and 5B show different aspects of a three-section microstrip transmission line in a stowed state, with dielectric guide covers removed to reveal more detail.
Figure 5B:
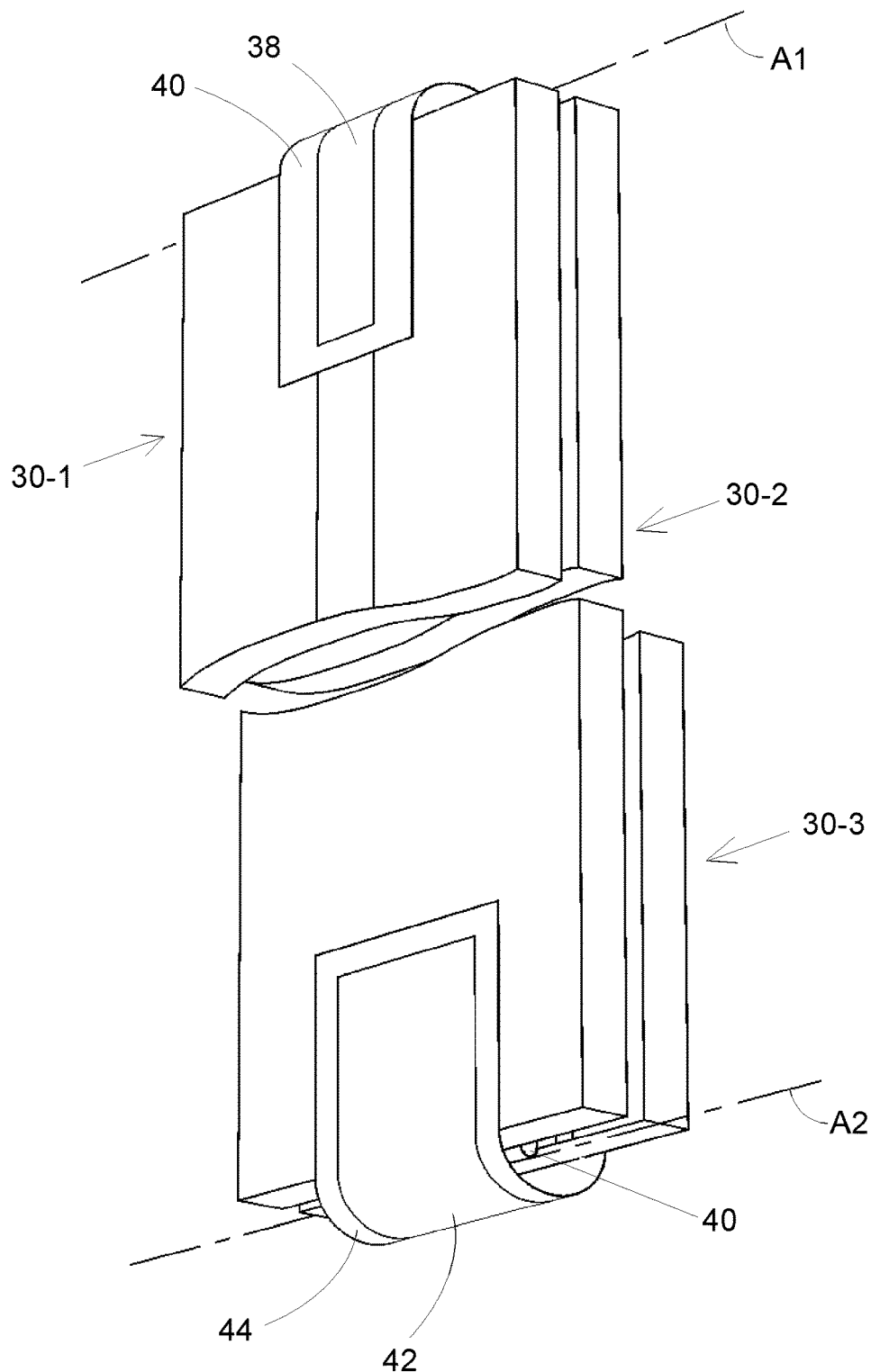

FIGS. 5A and 5B show different aspects of the three-section microstrip transmission line in a stowed state, which is adopted for storage, shipment and launch. Flexible dielectric trace bridges 40 and flexible dielectric ground plane bridges 44, together with their respective flexible electrically-conducting traces 38 (only one is visible) and flexible electrically-conducting ground planes 42 (only one is visible), are bent in smooth curves through 180 degrees, all being constrained by their respective dielectric guide covers (not shown). Tabs 54, shown resting against stops 52 (FIG. 5A), restrain flexible dielectric trace bridges 40 and flexible dielectric ground plane bridges 44 to prevent their ejection and also to withstand vibration during shipment and launch.

Figure 6A:
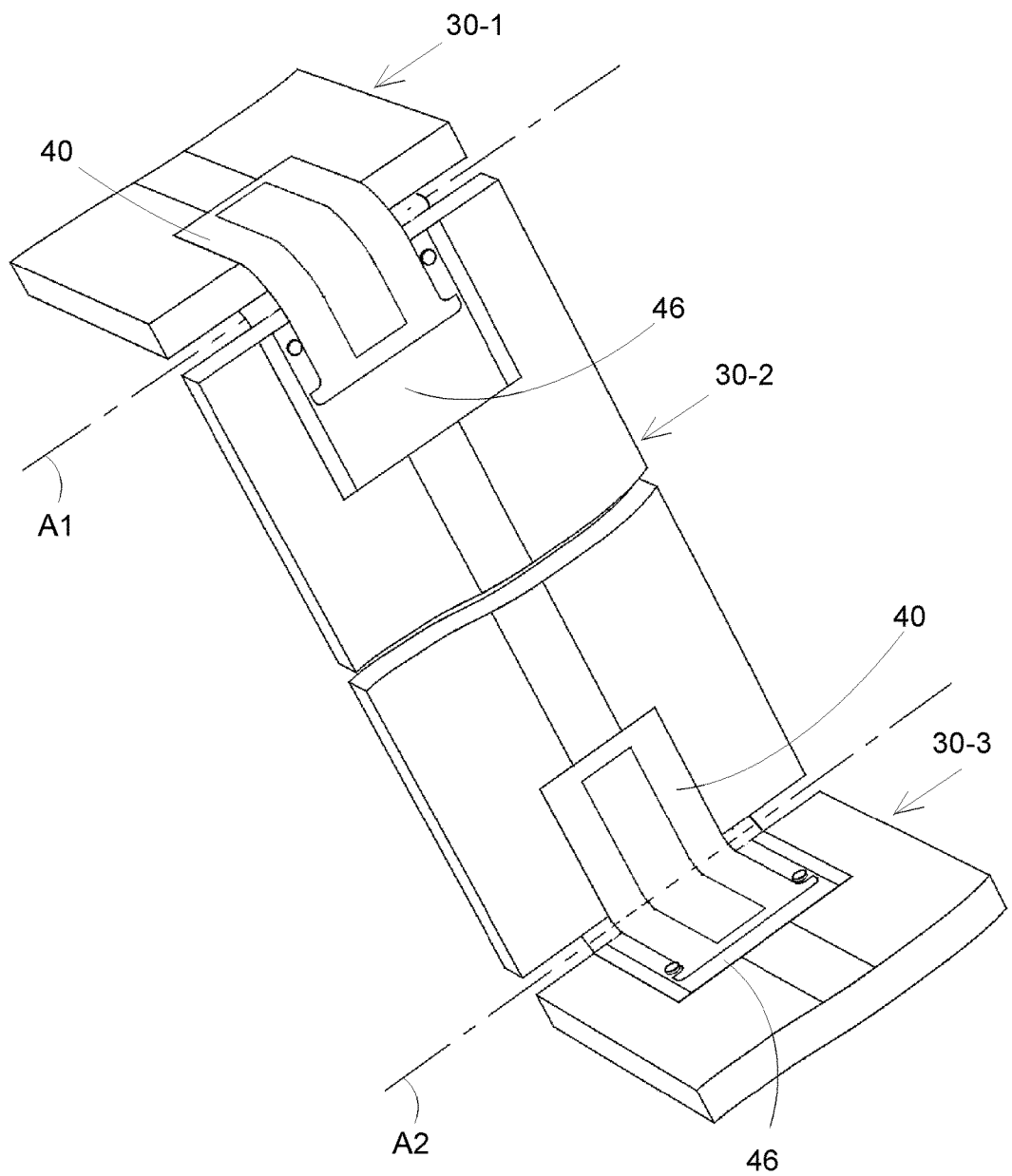
FIGS. 6A and 6B show different aspects of a three-section microstrip transmission line in an intermediate state, with dielectric guide covers removed to reveal more detail.
Figure 6B:
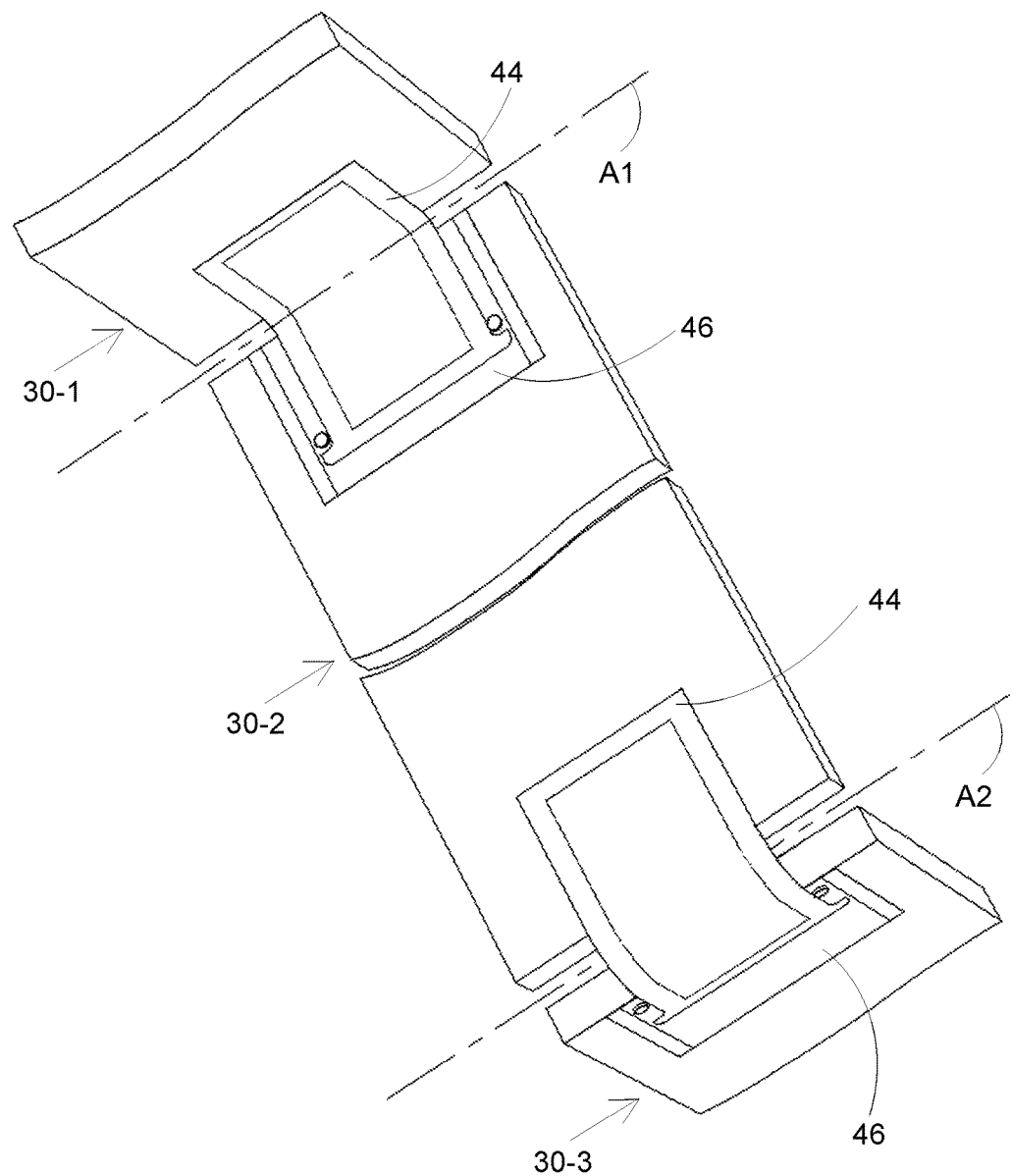

FIGS. 6A and 6B show different aspects of the three-section microstrip transmission line in an intermediate state. On moving of the respective microstrip transmission line sections 30-1, 30-2, 30-3 from the stowed state to this intermediate state (and onward to the deployed state) about first rotation axis A1 and second rotation axis A2, flexible dielectric trace bridges 40 (FIG. 6A) and flexible dielectric ground plane bridges 44 (FIG. 6B), all being constrained by their respective dielectric guide covers (not shown), slide between their respective dielectric guide bases 46 and dielectric guide covers.

Figure 7A:
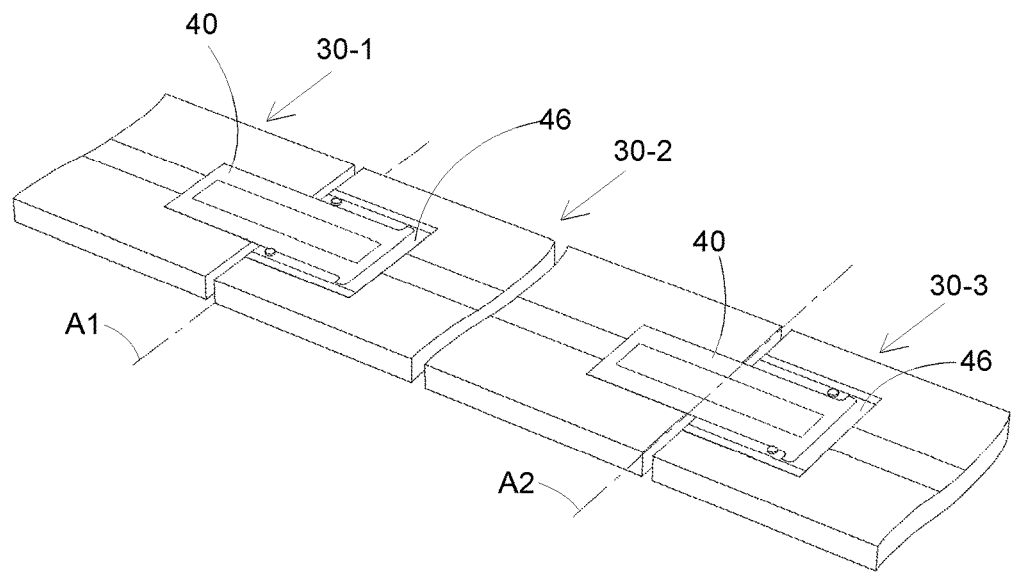
FIGS. 7A and 7B show different aspects of a three-section microstrip transmission line in a deployed state, with dielectric guide covers removed to reveal more detail.
Figure 7B:
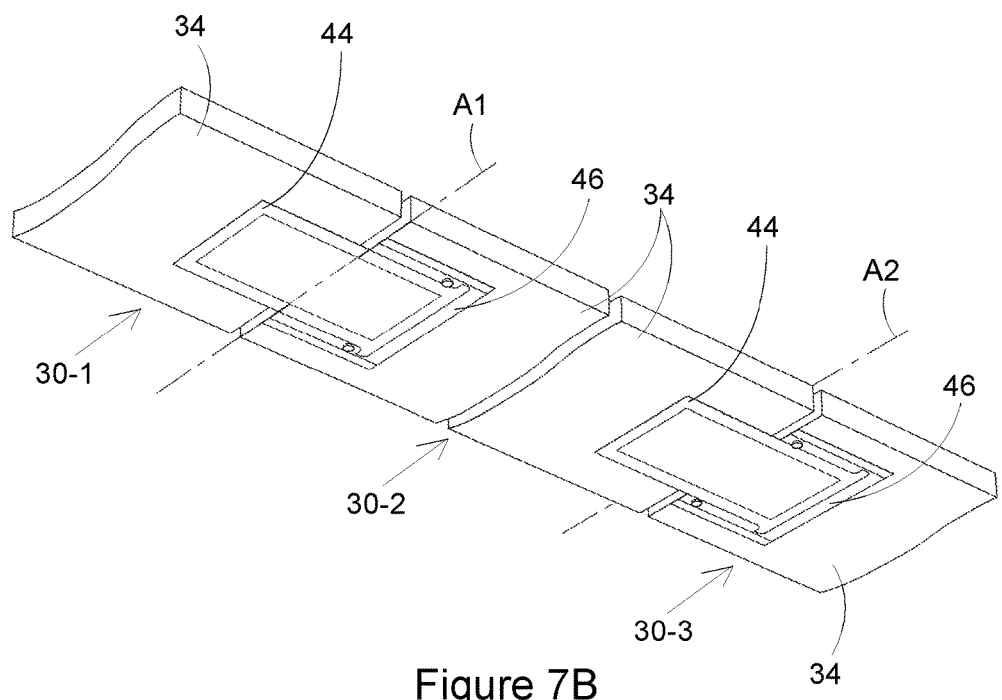

FIGS. 7A and 7B show different aspects of the three-section microstrip transmission line in a deployed state, where electrically-conductive ground planes 34 (FIG. 7B) of microstrip sections 30-1, 30-2 and 30-3 are substantially coplanar. Flexible dielectric trace bridges 40 (FIG. 7A) and flexible dielectric ground plane bridges 44 (FIG. 7B), having slid to their fullest extent, are kept in close proximity to their respective guide bases 46 by their respective guide covers (not shown).

In order to achieve the smooth bending of 180 degrees in the stowed state and to prevent buckling of the bridges when moving between the stowed and deployed states, the relevant flexible parts must have mechanical properties and selected dimensions that result in the required elastically bendable characteristics.

Furthermore, there must be sufficiently low friction between the sliding contact surfaces of flexible dielectric trace bridges 40, the sliding contact surfaces of flexible dielectric ground plane bridges 44 and the adjacent surfaces of their respective dielectric guide bases 46 and dielectric guide covers (not shown in FIG. 7) to prevent buckling during deployment.

A further embodiment of a deployable radio frequency transmission line is illustrated in FIGS. 8 and 9, which respectively show a deployed state and a stowed state of a three-section transmission line, which in this embodiment is stripline transmission line. A first section 60-1, a second section 60-2 and a third section 60-3 of the three-section stripline transmission line are mechanically coupled together by means of hinges (not shown) to provide relative rotation about a first rotation axis A1 and a second rotation axis A2.

Figure 8A:
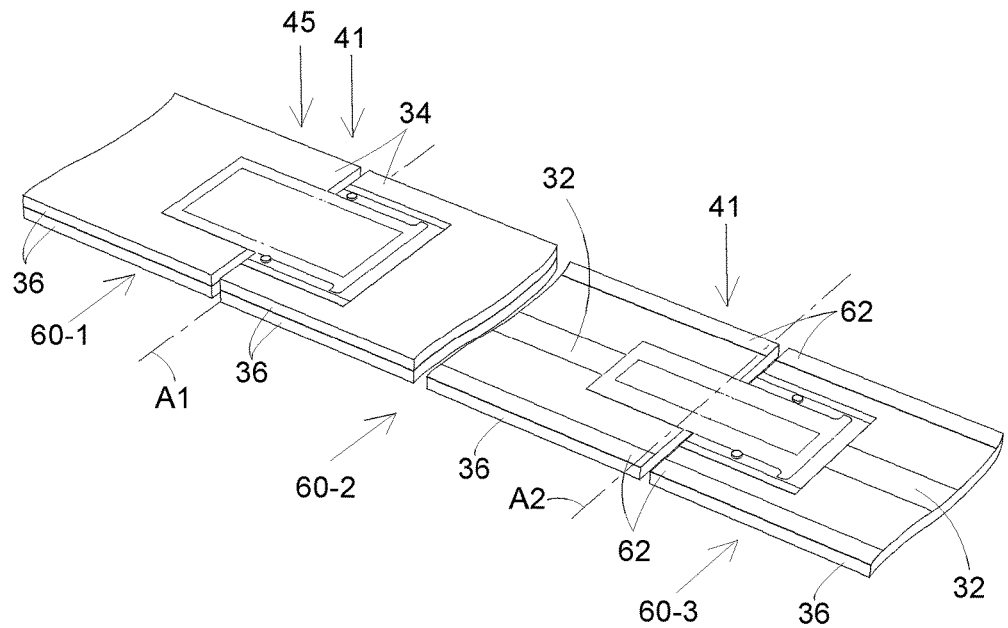
FIG. 8A shows a three-section stripline transmission line in a deployed state, with dielectric guide covers removed and rigid dielectric substrates partly removed to reveal more detail.
Figure 8B:
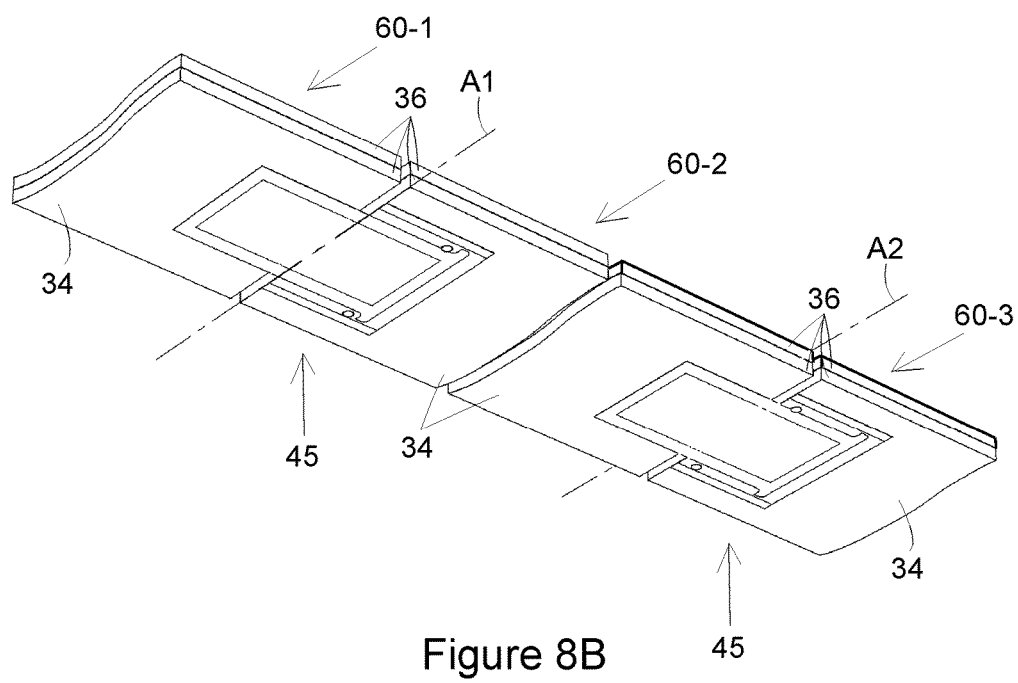
FIG. 8B shows a ground plane view of a three-section stripline transmission line in a deployed state, with dielectric guide covers removed to reveal more detail.

For clarity in FIG. 8A, the upper-half of stripline section 60-3 (FIG. 8B) and part of the upper-half of stripline section 60-2 (FIG. 8B) have been removed to reveal trace-bridge assembly 41 disposed near rotation axis A2. Another trace bridge assembly 41 is disposed near rotation axis A1 but is hidden from view. Also for clarity, guide covers 48 (FIGS. 1A, 2, 3A and 4) are not shown in FIGS. 8 and 9.

Electrically conducting traces 32 (FIG. 8A) are supported above the lower electrically-conducting ground planes 34 (FIG. 8B) by lower rigid dielectric substrates 36. Upper dielectric substrates 36, which are spaced off by dielectric-substrate spacers 62 to provide sufficient clearance for trace bridge assemblies 41, support the upper electrically conducting ground planes 34. Thus, upper and lower electrically conducting ground planes 34, centrally disposed electrically conducting traces 32 and dielectric substrates 36 together form the three-section stripline transmission line. A pair of ground bridge assemblies 45 are disposed near each rotation axis A1, A2.

Figure 9A:
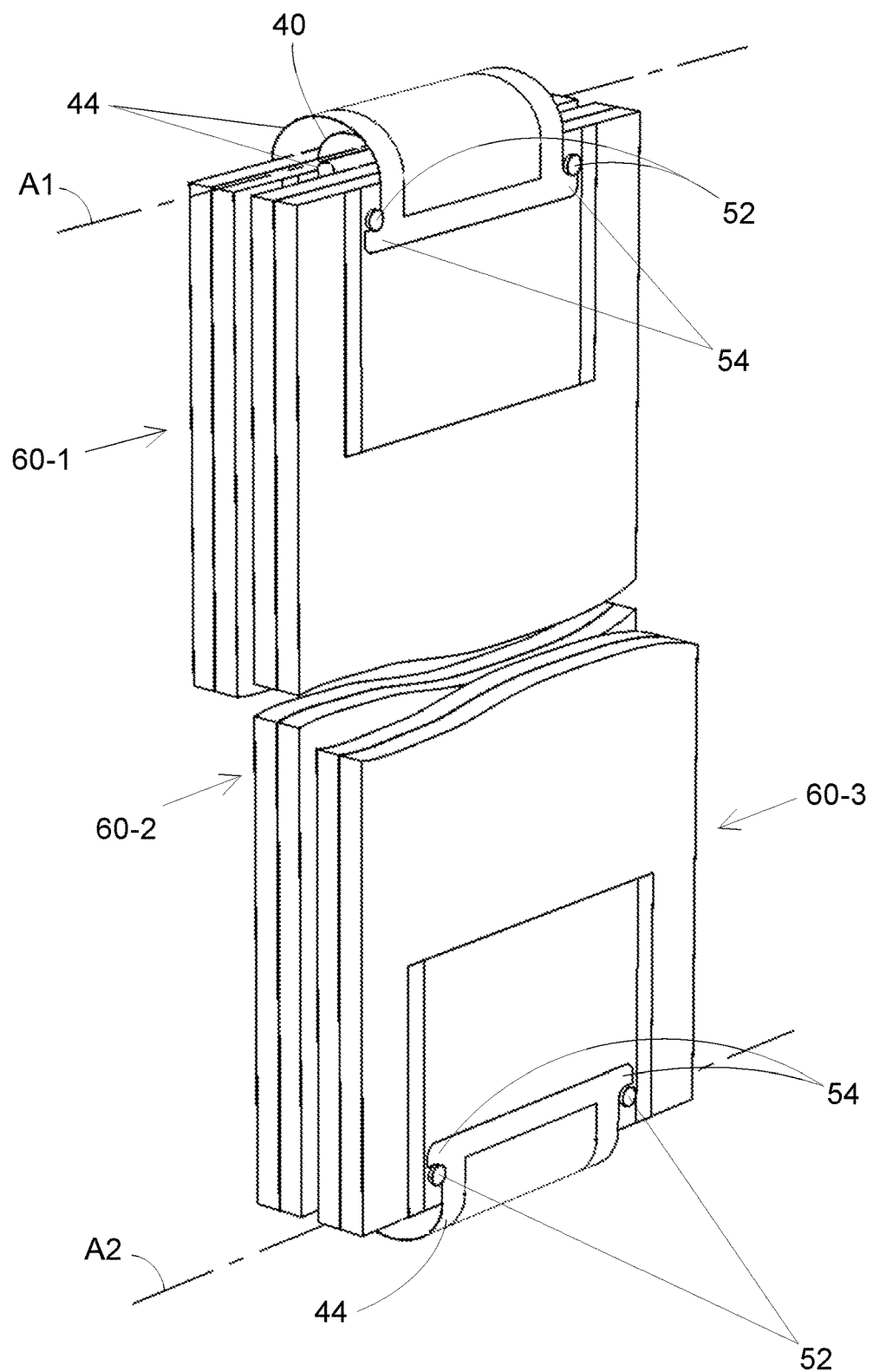
FIGS. 9A and 9B show different aspects of a three-section stripline transmission line in a stowed state, with dielectric guide covers removed to reveal more detail.
Figure 9B:
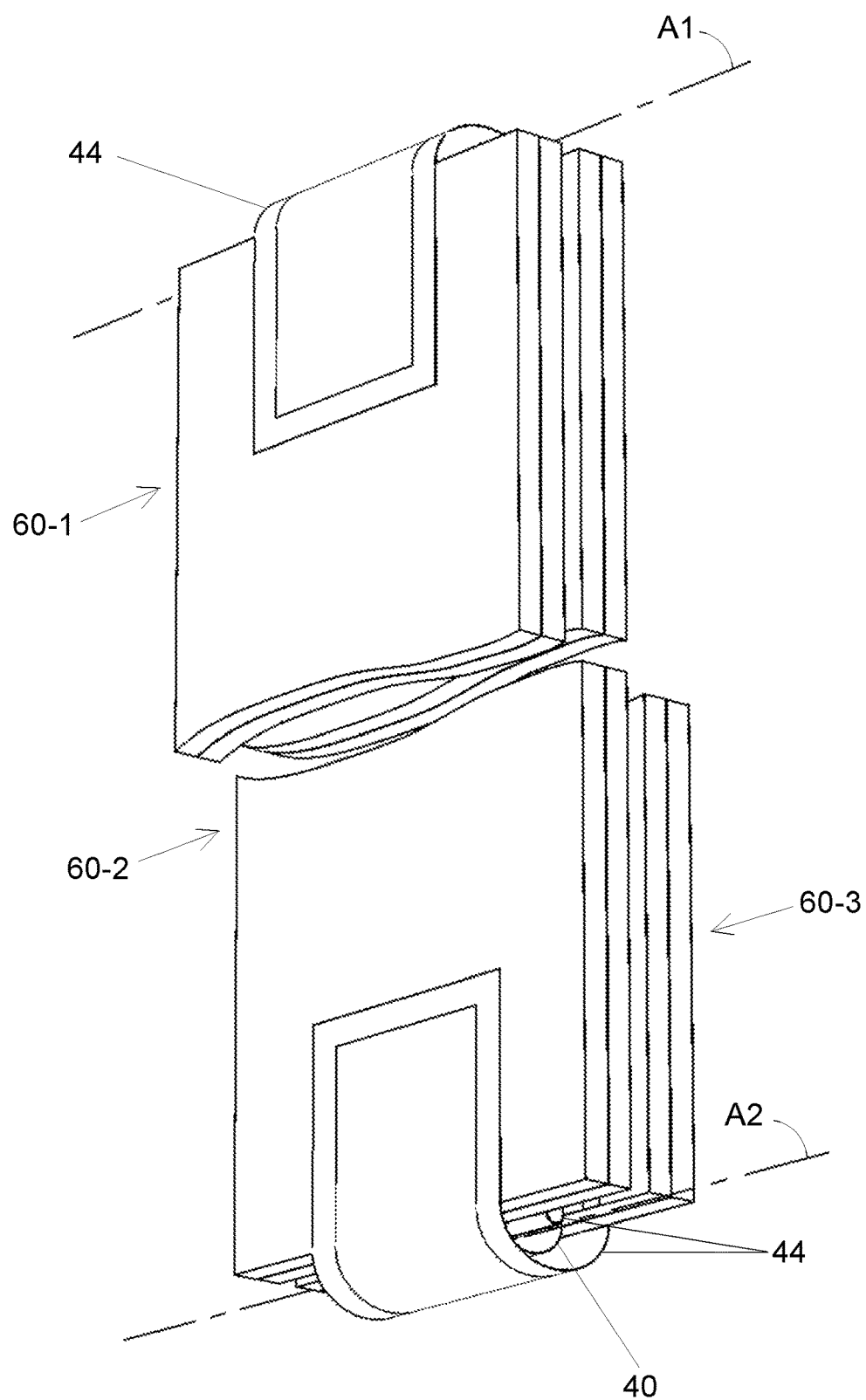

FIGS. 9A and 9B show different aspects of the three-section stripline transmission line 60-1, 60-2, 60-3 in a stowed state. Flexible dielectric trace bridges 40 and flexible dielectric ground plane bridges 44 are bent in smooth curves through 180 degrees, all being constrained by their respective guide covers (not shown). Tabs 54, shown resting against stops 52 (FIG. 9A), together with other stops and tabs hidden from view, restrain flexible dielectric trace bridges 40 and flexible ground plane bridges 44 to prevent their ejection and to withstand vibration during shipment and launch.

The electrical and mechanical operations of a deployable stripline transmission line are similar to those operations of a deployable microstrip transmission line described above.

There are various possibilities for the disposition of the flexible electrically-conducting trace and the dielectric trace bridge, as well as the disposition of the flexible electrically-conducting ground plane and the flexible dielectric ground plane bridge. Some examples of such dispositions will now be described with the aid of FIGS. 10 to 13. In the following descriptions, the term "flexible electrically-conducting strip" applies equally to either a flexible electrically-conducting trace or a flexible electrically-conducting ground plane. Also, the term "flexible dielectric bridge" applies equally to either a flexible dielectric trace bridge or a flexible dielectric ground plane bridge.

Figure 10A:
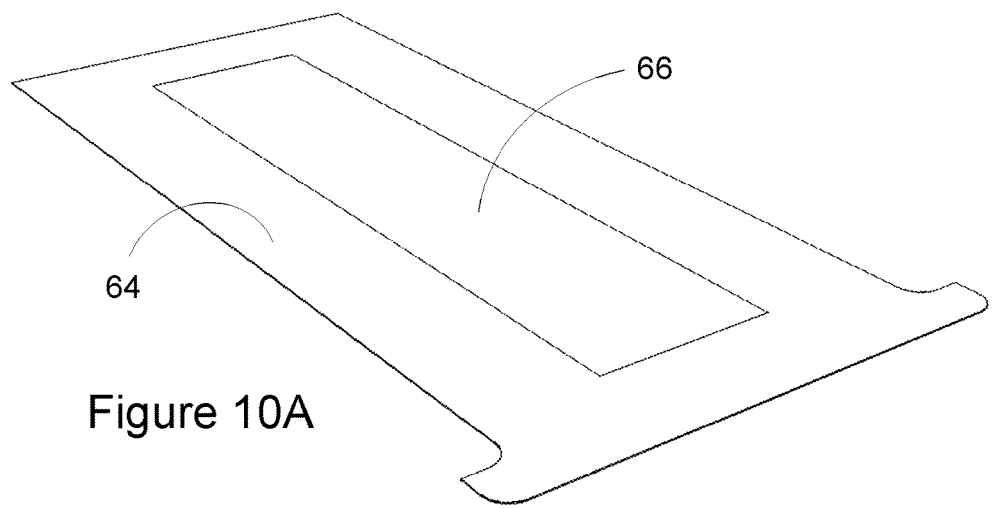
FIG. 10A shows a bridge comprising a flexible electrically-conducting strip bonded to one surface of a flexible dielectric sheet in accordance with one embodiment.
Figure 10B:
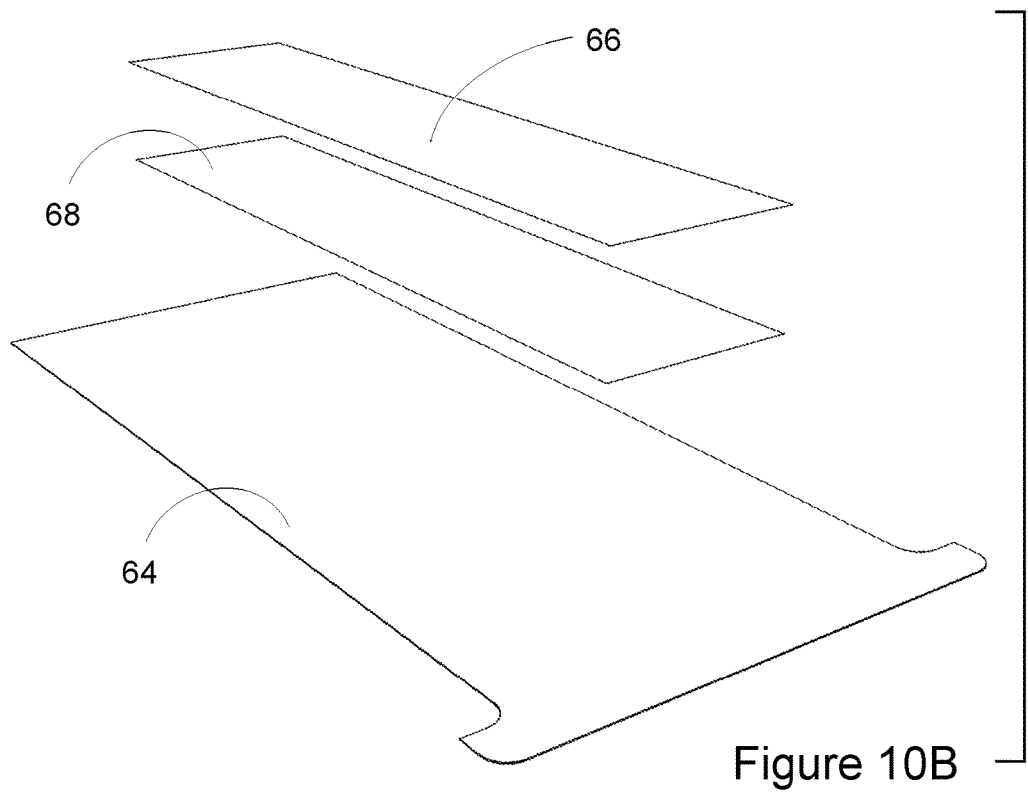
FIG. 10B shows an exploded view of a bridge comprising a flexible electrically-conducting strip bonded to one surface of a flexible dielectric sheet in accordance with one embodiment.

FIG. 10A and exploded view FIG. 10B show a bridge embodiment in which flexible electrically-conducting strip 66 is attached to flexible dielectric bridge 64 by means of adhesive film 68. There are mechanical and electrical disadvantages with this simple arrangement. There is a risk that the flexible electrically-conducting strip may separate from the flexible dielectric bridge either when these parts are fully bent and stressed in the stowed position or while bending during movement between the deployed and stowed states. When a relatively shorter flexible electrically-conducting strip is used, for example in higher radio frequency operation, or when there is a large bend radius, there is a risk that the edge of the free end of a flexible electrically-conducting strip may snag on the edge of dielectric guide cover 48 (FIGS. 1A and 2). The adhesive film may cause excessive transmission loss and limit power handling due to radio frequency energy dissipation.

Figure 11A:
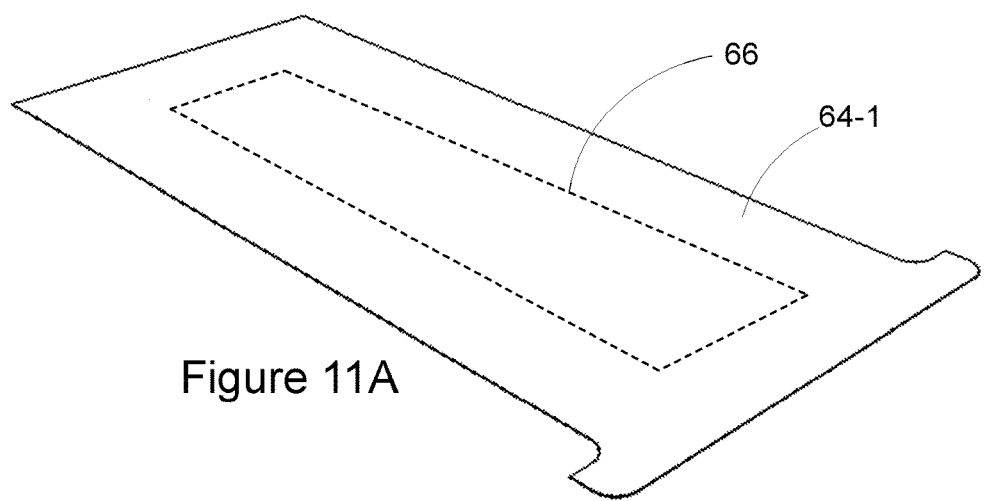
FIG. 11A shows a bridge comprising a flexible electrically-conducting strip sandwiched between two bonded-together flexible dielectric sheets in accordance with another embodiment.
Figure 11B:
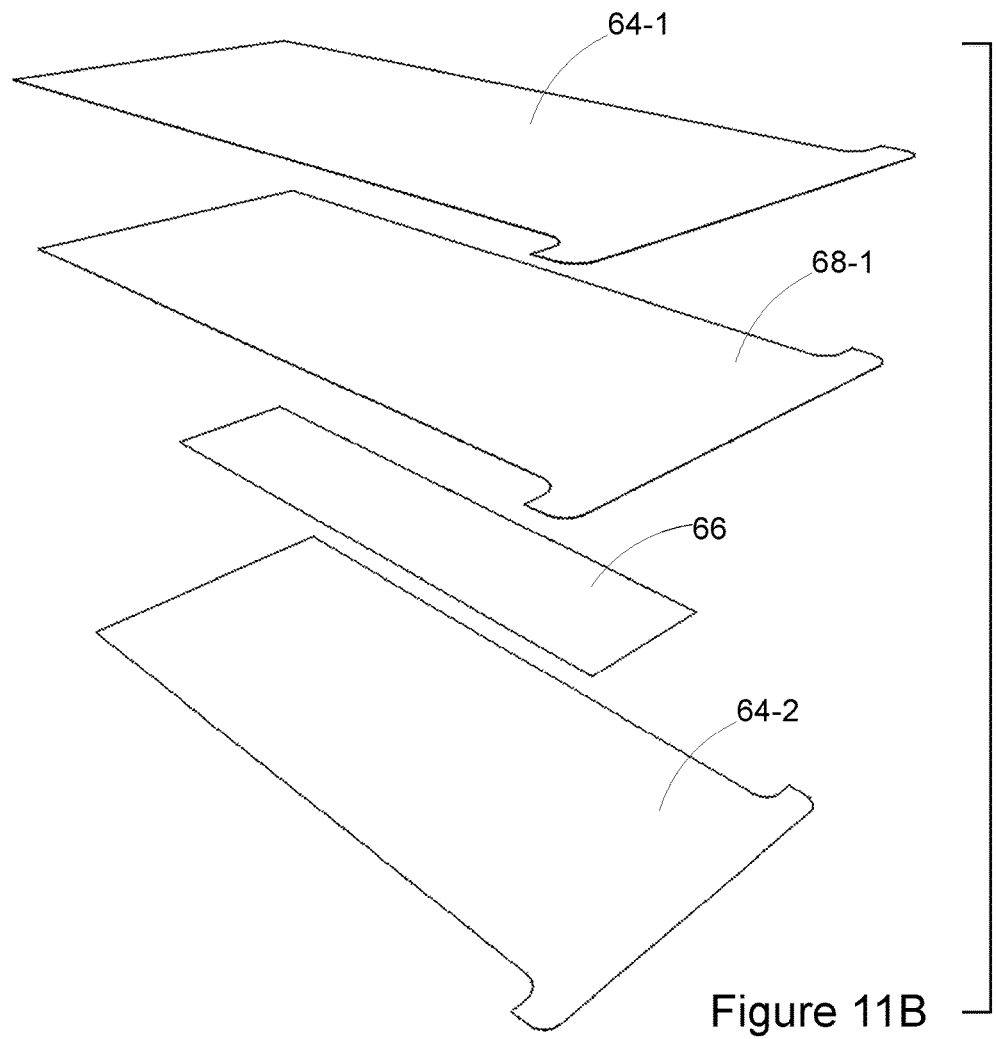
FIG. 11B shows an exploded view of a bridge comprising a flexible electrically-conducting strip sandwiched between two bonded-together flexible dielectric sheets in accordance with another embodiment.

FIG. 11A and exploded view in FIG. 11B show flexible electrically-conducting strip 66, sandwiched and protected from damage, between two flexible dielectric bridge layers 64-1, 64-2, which are bonded together by adhesive film 68-1. If required, an aperture (not shown) can be cut in a region of the adhesive film 68-1 coinciding with flexible electrically-conducting strip 66 in order to reduce transmission loss and improve power handling.

Figure 12A:
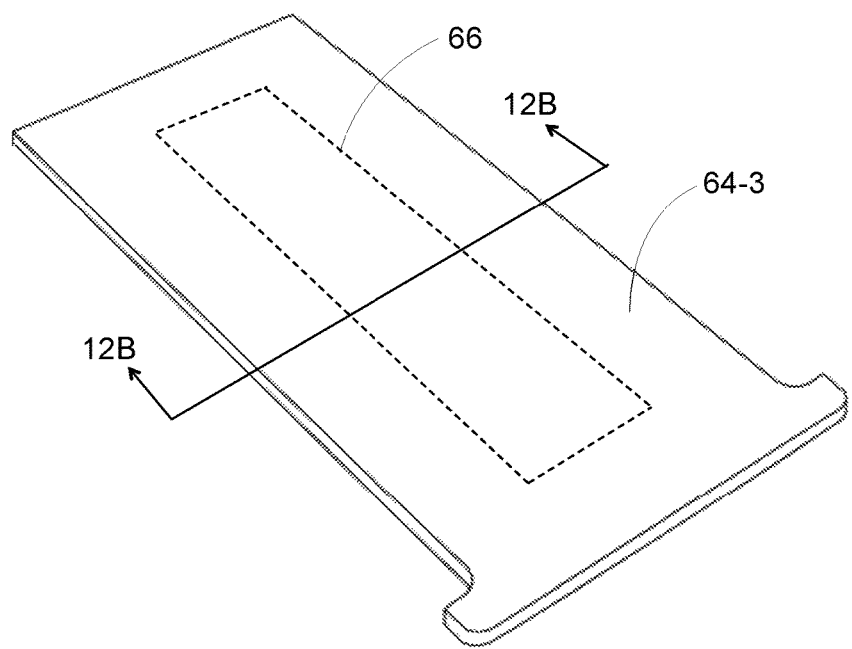
FIG. 12A shows a bridge comprising a flexible electrically-conducting strip embedded in a flexible dielectric sheet in accordance with another embodiment.
Figure 12B:
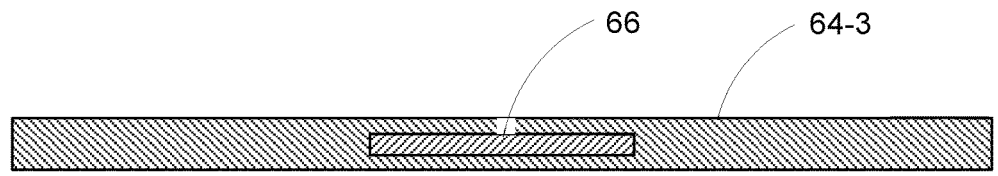
FIG. 12B shows a cross-section of a bridge comprising a flexible electrically-conducting strip embedded in an flexible dielectric sheet in accordance with another embodiment.

FIG. 12A and cross section view in FIG. 12B, show a bridge embodiment where flexible electrically-conducting strip 66 is encapsulated in flexible dielectric bridge 64-3, thus avoiding the disadvantages of adhesive. The material thicknesses are exaggerated for clarity in FIGS. 12A and 12B.

Figure 13A:
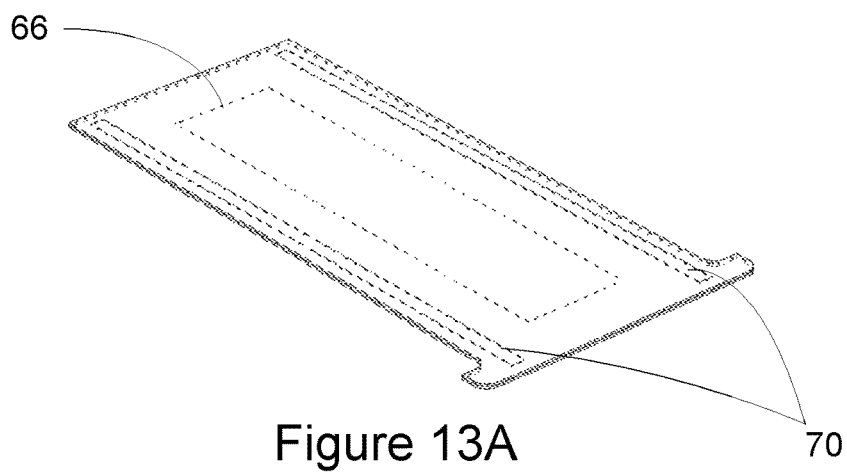
FIG. 13A shows a bridge comprising a flexible electrically-conducting strip and mechanical control strips sandwiched between two bonded-together flexible dielectric sheets in accordance with another embodiment.
Figure 13B:
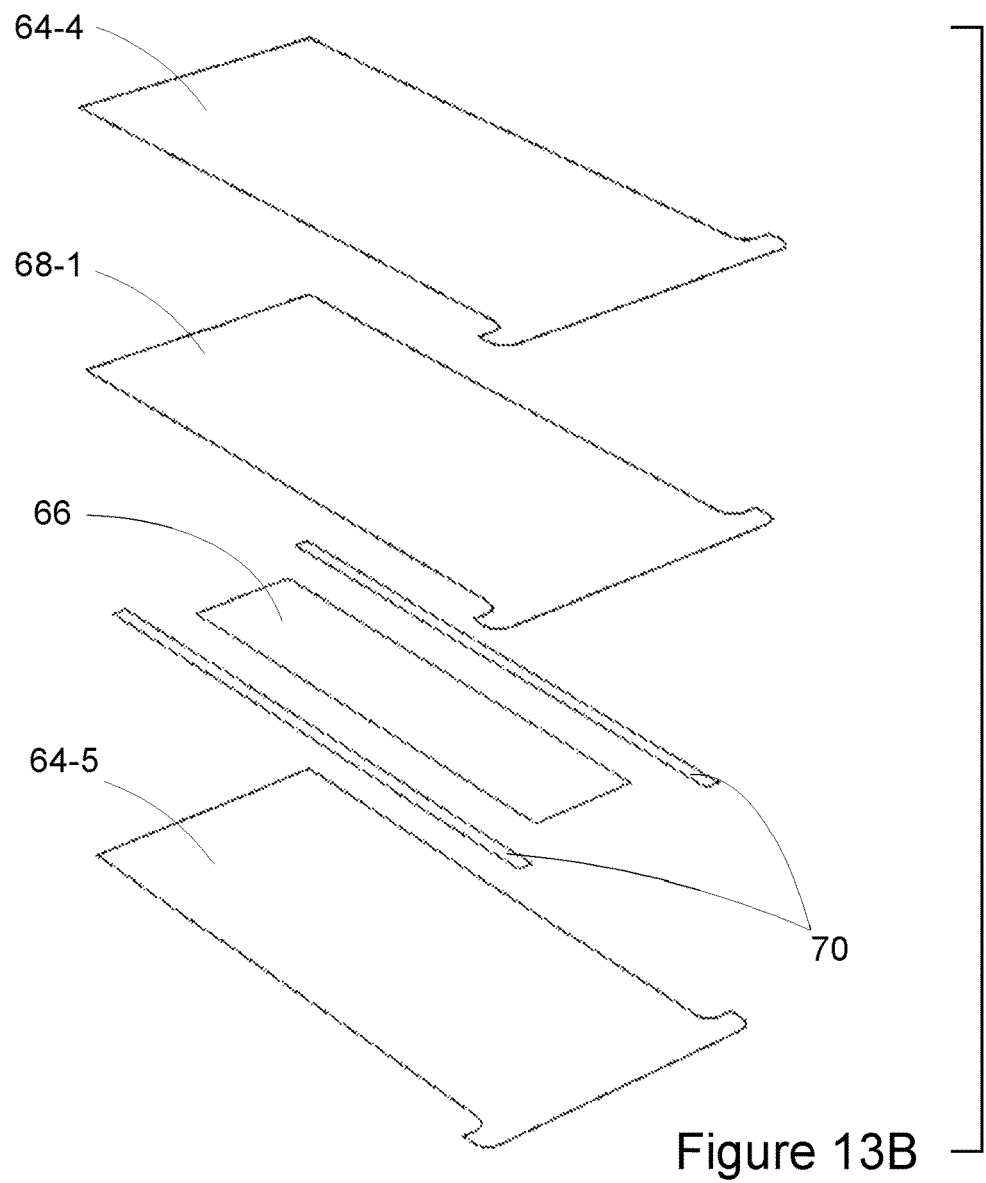
FIG. 13B shows an exploded view of a bridge comprising an electrically conducting strip and mechanical control strips sandwiched between two bonded-together flexible dielectric sheets in accordance with another embodiment.

FIG. 13A and the exploded view in FIG. 13B show flexible electrically-conducting strip 66 and mechanical control strips 70 sandwiched between two flexible dielectric bridge layers 64-4, 64-5, which are bonded together by adhesive film 68-1. In this embodiment, the material used for the mechanical control strips can be chosen to optimise the desired flexible characteristics of the composite assembly, while the material used for the flexible dielectric bridge layers can be optimised for the preferred radio frequency properties. Obviously, the adhesive layer could be eliminated by encapsulating flexible electrically-conducting strip 66 and mechanical control strips 70 in a single flexible dielectric bridge.

In the bridge embodiments described thus far, a flexible dielectric bridge adopts a straight form in a deployed state or a smooth bend in either a stowed or an intermediate state, through a sliding action according to the relative movement of the transmission line sections about a rotation axis. In certain applications of these embodiments, for example when a deployable transmission line is either attached to, or forms an integral part of, a relatively thick antenna panel, there may be an unacceptable risk of a flexible dielectric bridge buckling as the structure moves towards a deployed state. Two additional embodiments will now be described with the aid of FIGS. 14 and 15, where the thickness of each part is shown exaggerated for clarity.

Figure 14:
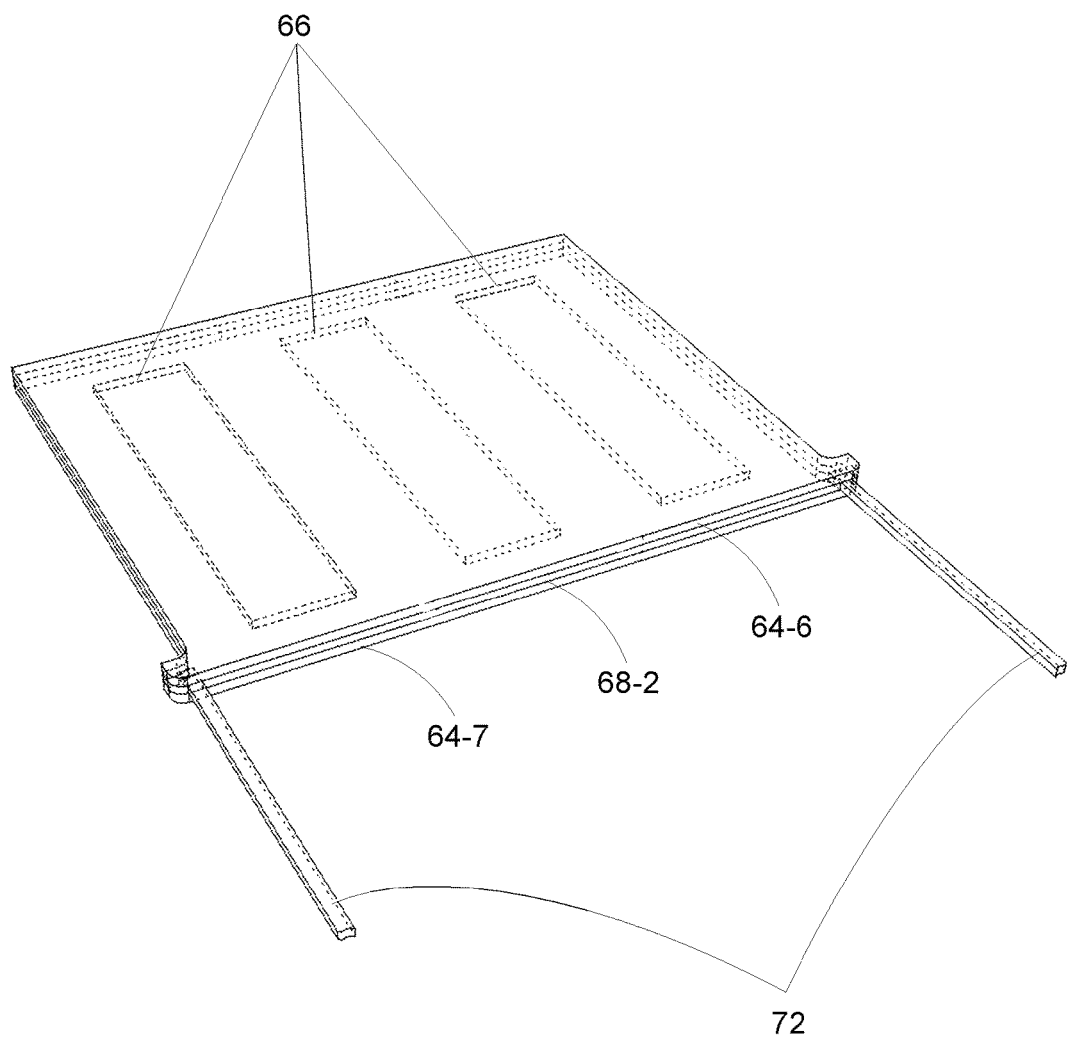
FIG. 14 shows a bridge comprising flexible electrically-conducting strips and tensioner-ends sandwiched between two bonded-together flexible dielectric sheets in accordance with another embodiment.

FIG. 14 illustrates a plurality of flexible electrically-conducting strips 66 and the ends of two tensioners 72 sandwiched between two flexible dielectric bridge layers 64-6, 64-7, which are bonded together by adhesive film 68-2. In this embodiment, possible buckling of the flexible dielectric bridge during deployment of the radio frequency transmission lines is avoided by winding the tensioners around a motor-driven capstan (not shown), or by making the tensioner from hyper-elastic elastomer. Obviously, the adhesive layer could be eliminated by encapsulating flexible electrically-conducting strips 66 and the ends of two tensioners 72 in a single flexible dielectric bridge.

Figure 15:
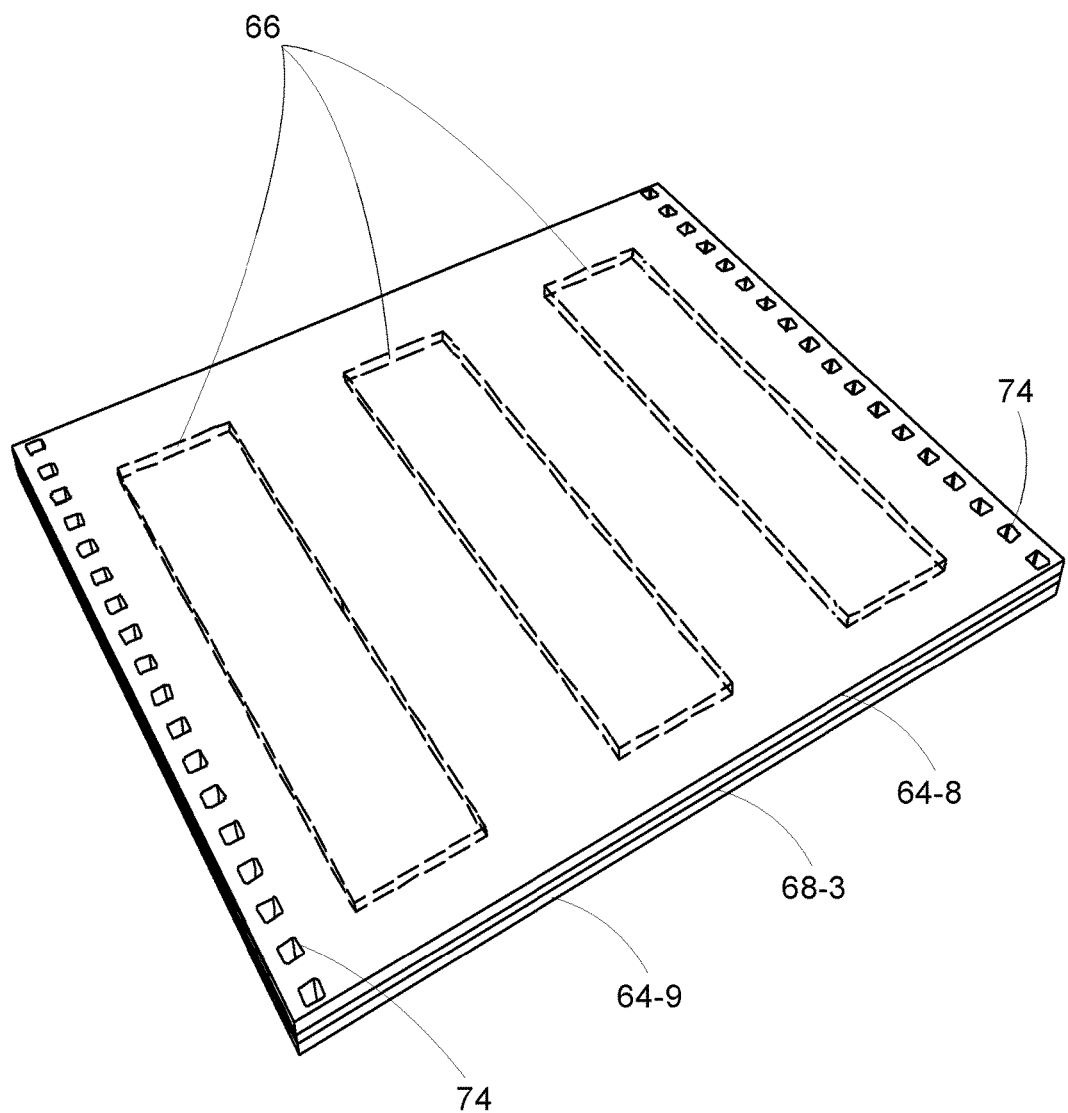
FIG. 15 shows a bridge comprising flexible electrically-conducting strips sandwiched between two bonded-together flexible dielectric sheets, with sprocket holes therein in accordance with another embodiment.

FIG. 15 illustrates a plurality of flexible electrically-conducting strips 66 sandwiched between two flexible dielectric bridge layers 64-8, 64-9, which are bonded together by adhesive film 68-3. In this embodiment, possible buckling of the flexible dielectric bridge during deployment of the radio frequency transmission lines is avoided by engaging motor-driven sprockets (not shown) in the sprocket holes 74 disposed along the sides of the flexible dielectric bridge. Obviously, the adhesive layer could be eliminated by encapsulating flexible electrically-conducting strips 66 in a single flexible dielectric bridge in which sprocket holes 74 are cut.

In some applications of deployable transmission lines, there may be insufficient space in one of the transmission line sections to accommodate the full length of one of the bridge embodiments hereinbefore described. To circumvent this problem, an example of a short bridge embodiment will now be described with the aid of FIGS. 16 to 19.

FIGS. 16 to 19 show different aspects of a deployed two-section microstrip transmission line, comprising a first microstrip transmission line 30-1A and a second microstrip transmission line 30-2, mechanically coupled together by means of a hinge (not shown) to allow relative rotation of the first and second microstrip transmission lines about rotation axis A0.

Figure 16A:
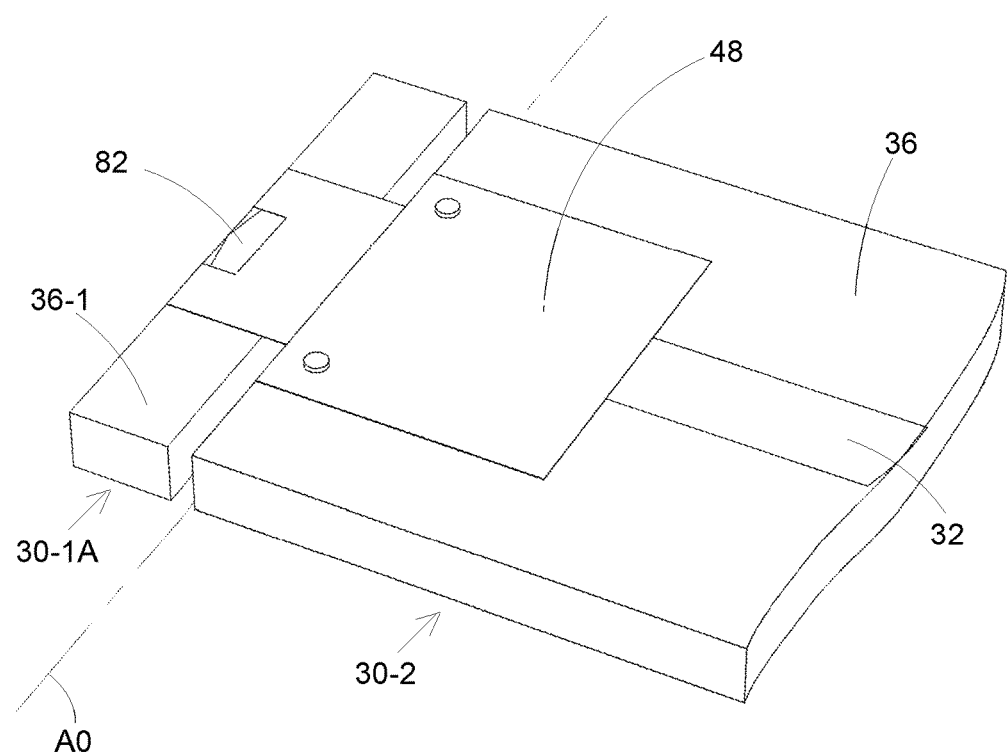
FIG. 16A shows a trace view of a shortened two-section microstrip transmission line in a deployed state, with dielectric guide cover in situ.
Figure 16B:
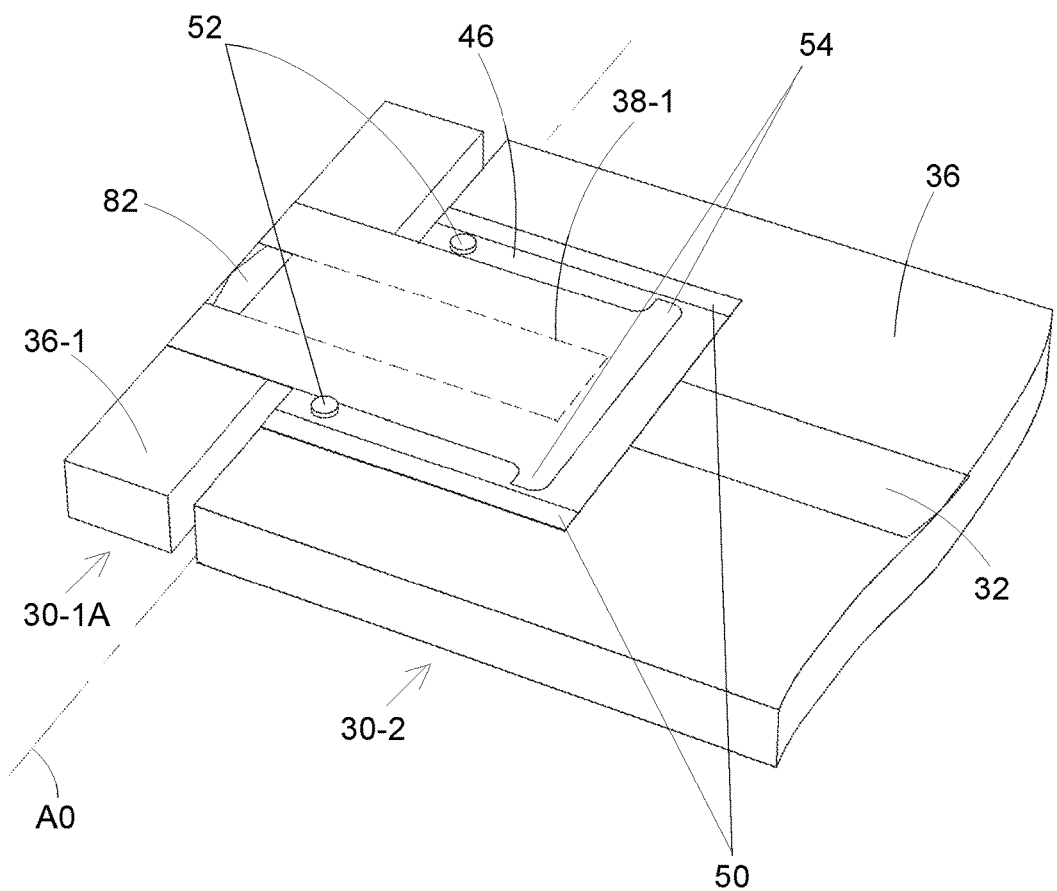
FIG. 16B shows a trace view of a shortened two-section microstrip transmission line in a deployed state, with dielectric guide cover removed to reveal more detail.
Figure 17:
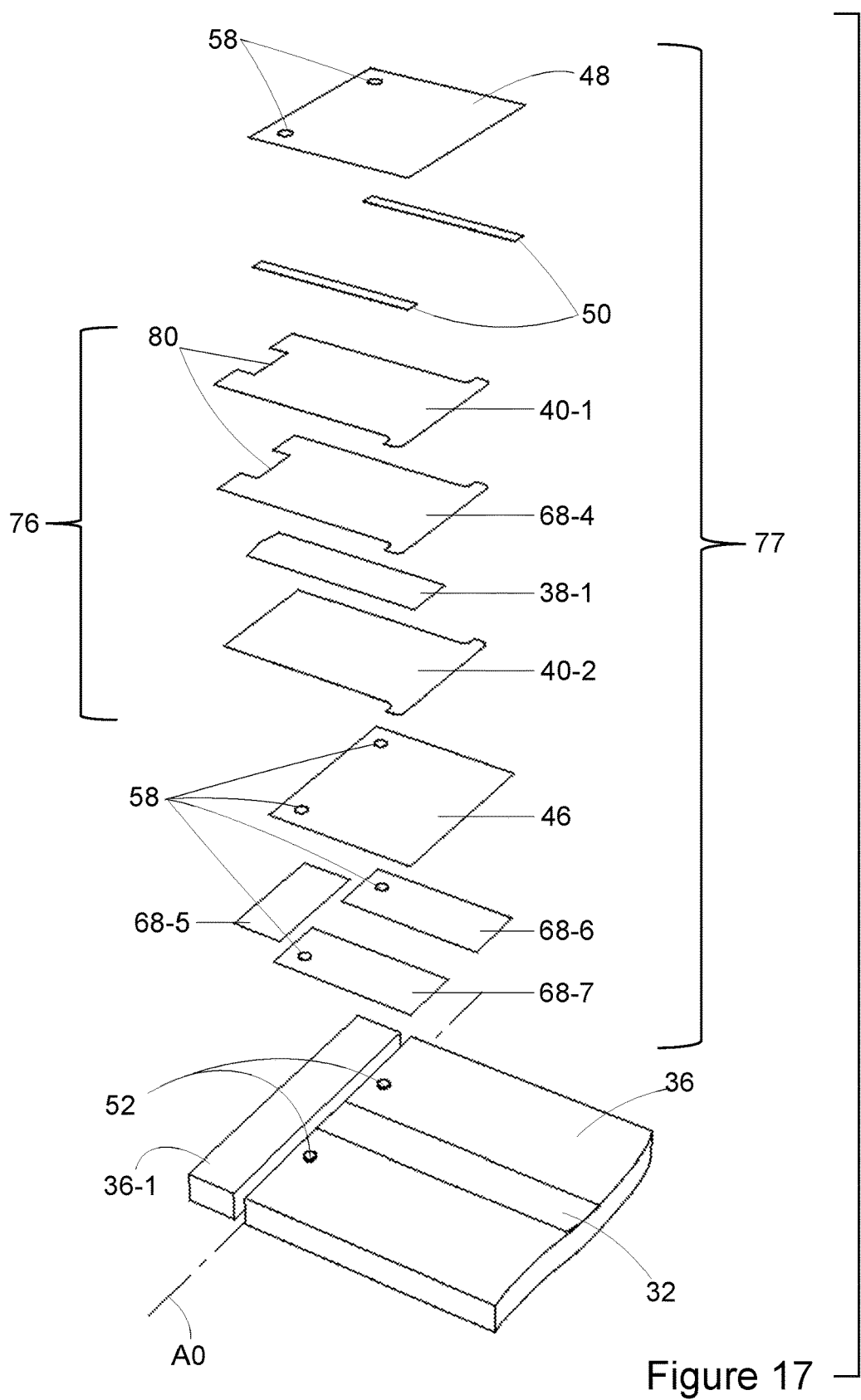
FIG. 17 shows a trace view of a shortened two-section microstrip transmission line in a deployed state, with an exploded view of a shortened trace-bridge assembly.
Figure 18A:
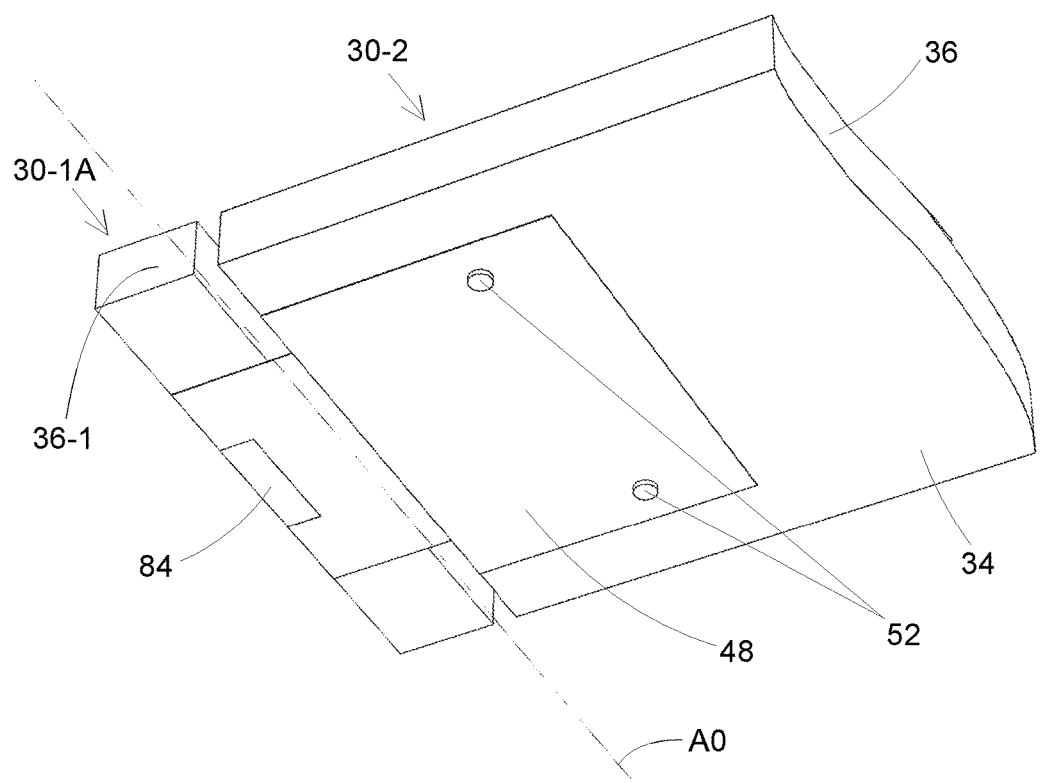
FIG. 18A shows a ground plane view of a shortened two-section microstrip transmission line in a deployed state, with dielectric guide cover in situ.
Figure 18B:
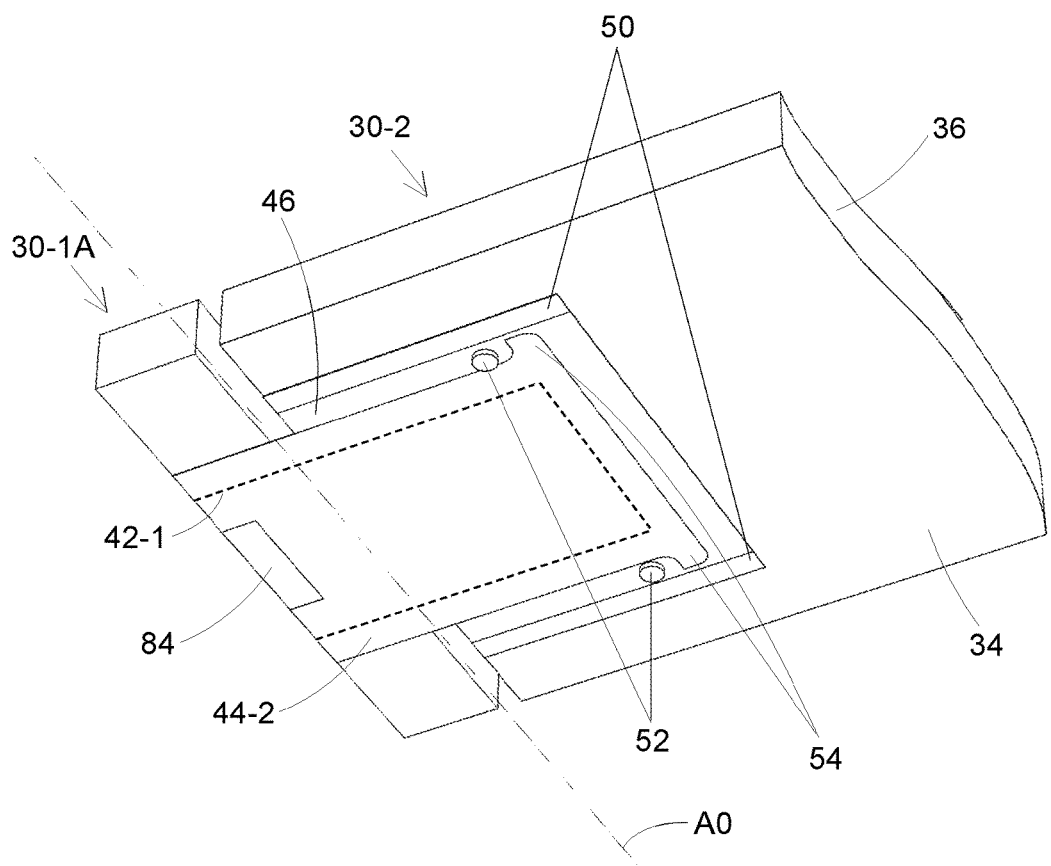
FIG. 18B shows a ground plane view of a shortened two-section microstrip transmission line in a deployed state, with dielectric guide cover removed to reveal more detail.
Figure 19:
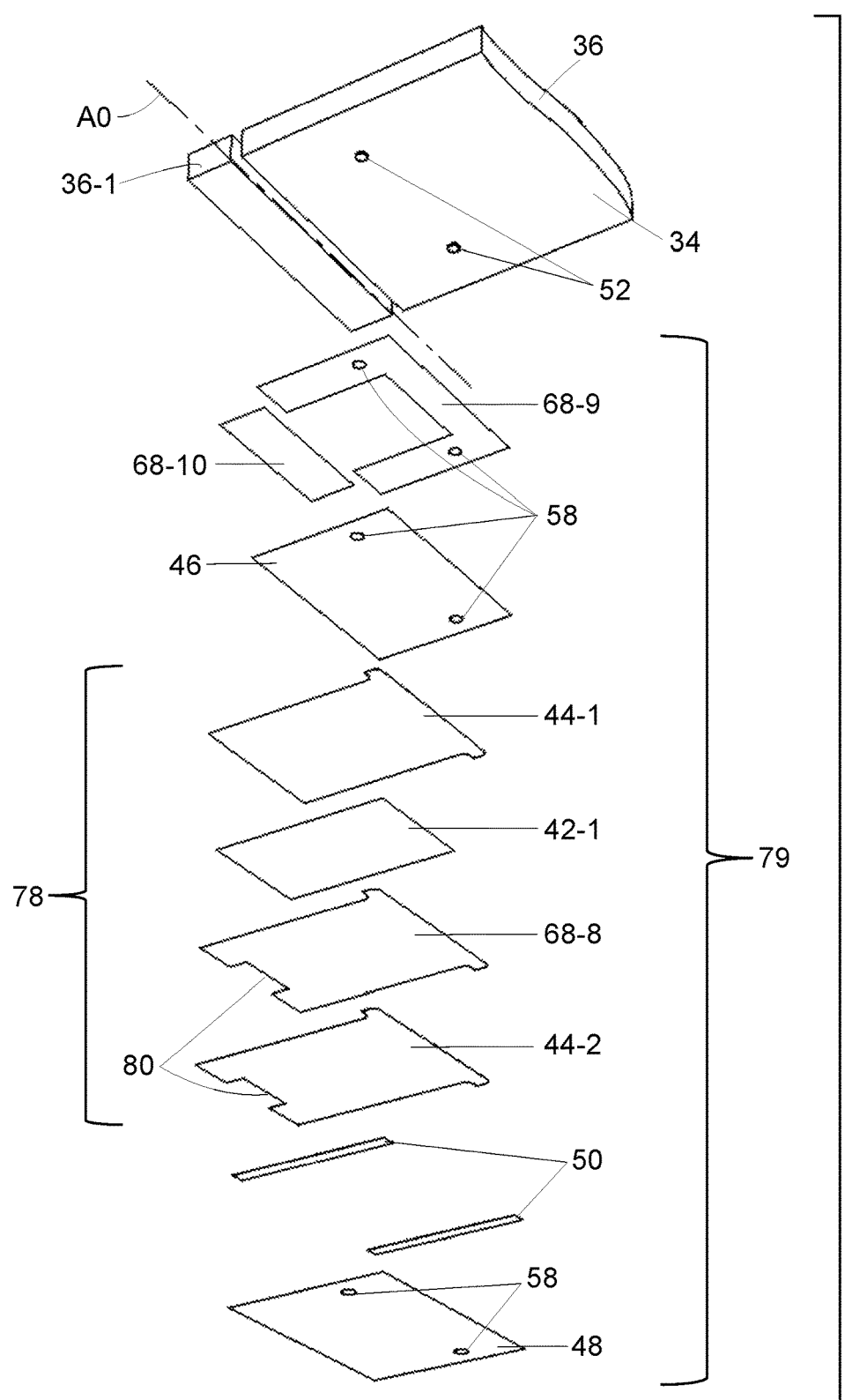
FIG. 19 shows a ground plane view of a shortened two-section microstrip transmission line in a deployed state, with an exploded view of a shortened ground-bridge assembly.

For clarity, dielectric guide covers 48, which are shown in FIGS. 16A and 18A, and in the exploded views of FIGS. 17 and 19, are not shown in FIGS. 16B and 18B.

Electrically-conducting trace 32 (FIGS. 16 and 17) is spaced apart from electrically-conducting ground plane 34 (FIGS. 18 and 19) by rigid dielectric substrate 36 to form second microstrip transmission line 30-2.

Referring to FIG. 16B and the exploded view in FIG. 17, flexible electrically-conducting trace 38-1 (indicated by dashed lines in FIG. 16B) is sandwiched between two flexible dielectric trace bridge layers 40-1, 40-2, which are bonded together by adhesive film 68-4 to form short flexible trace-bridge composite 76. Dielectric guide base 46 is bonded to rigid dielectric substrate 36 of second microstrip transmission line 30-2 by means of adhesive films 68-6, 68-7. One end region of short flexible trace-bridge composite 76 is bonded to rigid dielectric substrate 36-1 by means of adhesive film 68-5, thus forming first microstrip transmission line 30-1A. The remainder of short flexible trace-bridge composite 76 extends to second microstrip transmission line 30-2, with flexible electrically-conducting trace 38-1 overlaying dielectric guide base 46 and electrically conducting trace 32 by a predetermined length to form a parallel-plate transmission line whose length corresponds to a nominal quarter wavelength at the desired operating radio frequency, within the dielectric media comprising flexible dielectric trace bridge layer 40-2 and dielectric guide base 46. Short flexible trace-bridge composite 76 is kept in close proximity to dielectric guide base 46 by dielectric guide cover 48, which together with guide spacers 50, is firmly attached to dielectric guide base 46, using either adhesive (not shown) or fasteners (not shown). Short flexible trace-bridge composite 76 is free to slide between dielectric guide base 46 and dielectric guide cover 48 when there is relative rotation of first microstrip transmission line 30-1A and second microstrip transmission line 30-2 about rotation axis A0. Short trace-bridge assembly 77 thus provides a link between first microstrip transmission line 30-1A and second microstrip transmission line 30-2.

Referring to FIG. 18B and the exploded view in FIG. 19, flexible electrically-conducting ground plane 42-1 (indicated by dashed lines in FIG. 18B) is sandwiched between two flexible dielectric ground bridge layers 44-1, 44-2, which are bonded together by adhesive film 68-8 to form short flexible ground-bridge composite 78. Dielectric guide base 46 is bonded to electrically conducting ground plane 34 of microstrip transmission line 30-2 by means of adhesive film 68-9. One end region of short flexible ground-bridge composite 78 is bonded to rigid dielectric substrate 36-1 by means of adhesive film 68-10. The remainder of short flexible ground-bridge composite 78 extends to second microstrip transmission line 30-2, with flexible electrically-conducting ground plane 42-1 overlaying dielectric guide base 46 and electrically conducting ground plane 34 by a predetermined length to form a parallel-plate transmission line whose length corresponds to a nominal quarter wavelength at the desired operating radio frequency, within the dielectric media comprising flexible dielectric ground-bridge layer 44-1 and dielectric guide base 46. Short flexible ground-bridge composite 78 is kept in close proximity to dielectric guide base 46 by dielectric guide cover 48, which together with guide spacers 50, is firmly attached to dielec-tric guide base 46 using either adhesive (not shown) or fasteners (not shown). Short flexible ground-bridge composite 78 is free to slide between dielectric guide base 46 and dielectric guide cover 48 when there is relative rotation of first microstrip transmission line 30-1A and second microstrip transmission line 30-2 about rotation axis A0. Short ground-bridge assembly 79 thus provides a link between first microstrip transmission line 30-1A and second microstrip transmission line 30-2.

Stops 52 are bonded into dielectric substrate 36 of second microstrip transmission line 30-2. Holes 58 (FIGS. 17 and 19) and stops 52 assist the alignment of dielectric guide bases 46, dielectric guide covers 48 and adhesive films 68-6, 68-7 and 68-9 during assembly. In a stowed state, when second microstrip transmission line 30-2 is folded into close proximity with first microstrip transmission line 30-1A, tabs 54 (FIGS. 16B and 18B) rest against stops 52 thus restraining short flexible trace-bridge composite 76 and short flexible ground-bridge composite 78 to prevent their ejection and to withstand vibration during shipment and launch.

Notches 80 (FIGS. 17 and 19) facilitate connection of either a coaxial cable (not shown) or a coaxial connector (not shown) to trace connection region 82 (FIG. 16) and to ground plane connection region 84 (FIG. 18).

The short bridge embodiment described herein is shown by way of example as a deployable microstrip transmission line, but it is obvious to a person skilled in the art that the short bridge embodiment can also be applied to a deployable stripline transmission line.

In one aspect the invention provides a means of efficiently conveying radio frequency energy between the body of a satellite and one or more radiating elements disposed on a deployable panel for the purpose of illuminating a reflector antenna.

In another embodiment a deployable boom comprises a plurality of transmission line sections, each in the form of either stripline or microstrip transmission line panels, hinged together for deployment between a folded state and an elongate unfolded state, wherein the deployed transmission line sections, being linked together in the manner described herein, provide a continuous transmission line for conveying radio frequency energy between the body of the satellite and one or more radiating elements disposed at the distal end of the deployed boom.

Figure 20A:
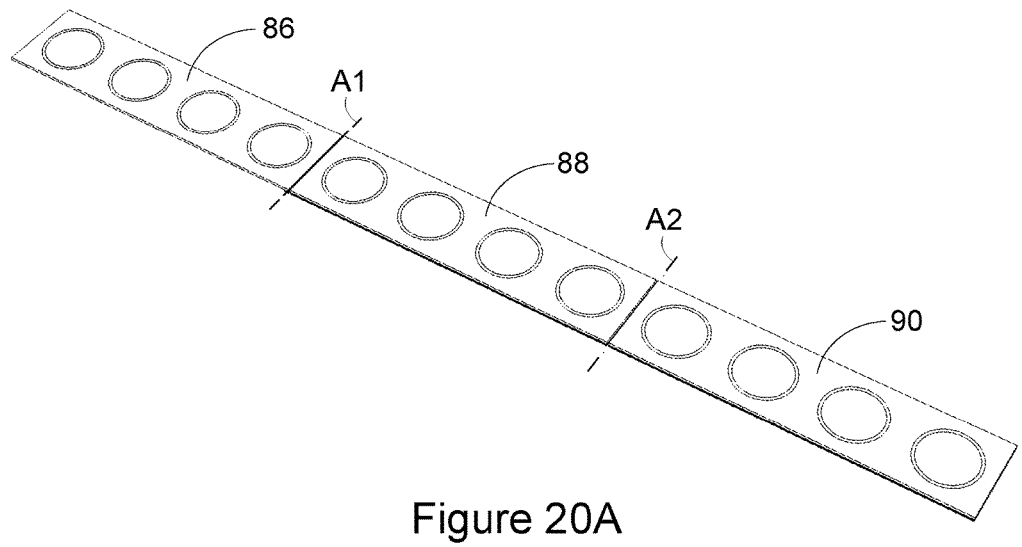
FIG. 20A shows a fixed subarray of radiating elements and two deployable subarrays of radiating elements in a deployed direct radiating array antenna.
Figure 20B:
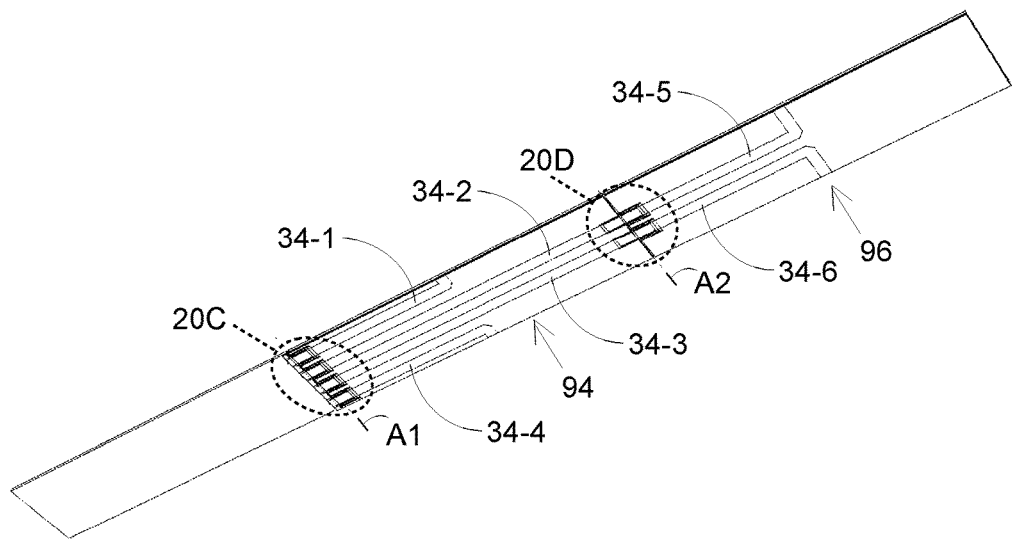
FIG. 20B shows a rear view of a fixed subarray of radiating elements and ground planes of two deployable stripline panels in a deployed direct radiating array antenna, with dielectric guide covers removed to reveal more detail.
Figures 20C, 20D:
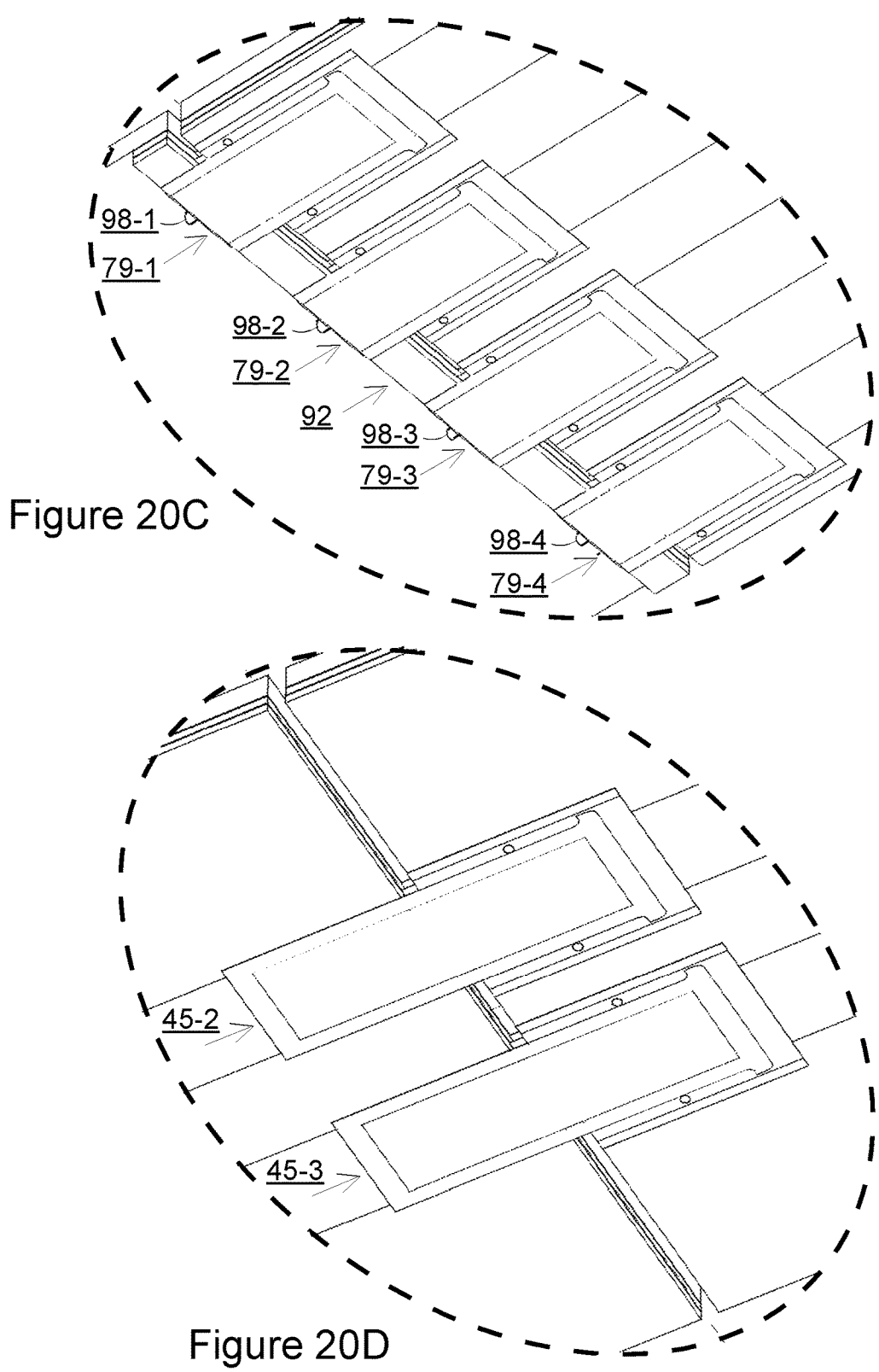
FIG. 20C shows an enlarged view of four shortened ground-bridge assemblies at the junction of a fixed stripline panel and a deployable stripline panel in a deployed direct radiating array antenna, with dielectric guide covers removed to reveal more detail.
FIG. 20D shows an enlarged view of two ground-bridge assemblies at the junction of a first and second deployable stripline panel in a deployed direct radiating array antenna, with dielectric guide covers removed to reveal more detail.

An application of some of the embodiments in a deployable direct radiating array antenna that uses stripline transmission line, disposed in deployable stripline panels, to distribute radio frequency energy to and from deployable subarrays of radiating elements in the antenna, will now be described with reference to FIGS. 20 to 23. Although a single row of subarrays of radiating is described and shown in these figures, it is obvious to a person skilled in the art that the embodiment in this so-called linear array can be extended for use in a planar array, to comprise either a plurality of such rows or integrated within a larger deployable structure. FIG. 20A shows a fixed subarray 86, a first deployable subarray 88 and a second deployable subarray 90 in a deployed state. Deployment is effected by rotation of the deployable subarrays about rotation axes A1, A2. Such rotation is typically powered by rotary actuators (not shown) located at hinges (not shown) to provide rotation axes A1, A2. FIG. 20B shows a rear view of the deployed antenna where a first deployable stripline panel 94 and a second deployable stripline panel 96 are mechanically and electrically connected to first deployable subarray 88 and second deployable subarray 90 respectively. Electrical connection between each deployable stripline panel and its deployable subarray is by means of pairs of blind mate coaxial connectors (not shown). Electrically conducting ground planes 34-1, 34-4 are parts of the stripline transmission lines feeding orthogonal polarisation signals to first deployable subarray panel 88. Electrically conducting ground planes 34-2, 34-5 and 34-3, 34-6 are parts of the stripline transmission lines feeding orthogonal polarisation signals to second deployable subarray 90. The enlarged view in FIG. 20C shows four coaxial connectors 98-1, 98-2, 98-3, 98-4, which are attached to fixed stripline panel 92. Connection between these four coaxial connectors and the transmitter and receiver subsystems of the satellite payload (not shown) is by means of fixed coaxial cables (not shown). No deployment of coaxial cables is required since there is no relative movement between the four coaxial connectors and the transmitter and receiver subsystems. FIG. 20C also shows four short ground-bridge assemblies, 79-1, 79-2, 79-3, 79-4, which link between fixed stripline panel 92 and first deployable stripline panel 94 to provide continuity of radio frequency ground currents in the respective stripline transmission lines disposed in fixed stripline panel 92 and first deployable stripline panel 94.

The enlarged view in FIG. 20D shows two ground-bridge assemblies 45-2, 45-3, which link between first deployable stripline panel 94 and second deployable stripline panel 96 to provide continuity of radio frequency ground currents in the respective stripline transmission lines disposed in first deployable stripline panel 94 and second deployable stripline panel 96 (FIG. 20B).

Figure 21A:
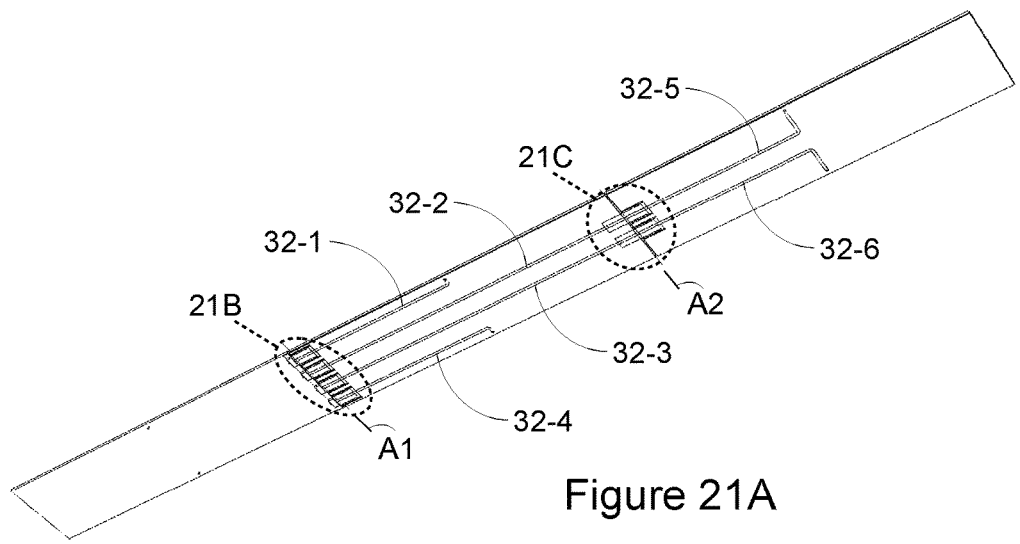
FIG. 21A shows the traces of two deployable stripline panels in a deployed direct radiating array antenna, with dielectric guide covers removed to reveal more detail.
Figure 21B:
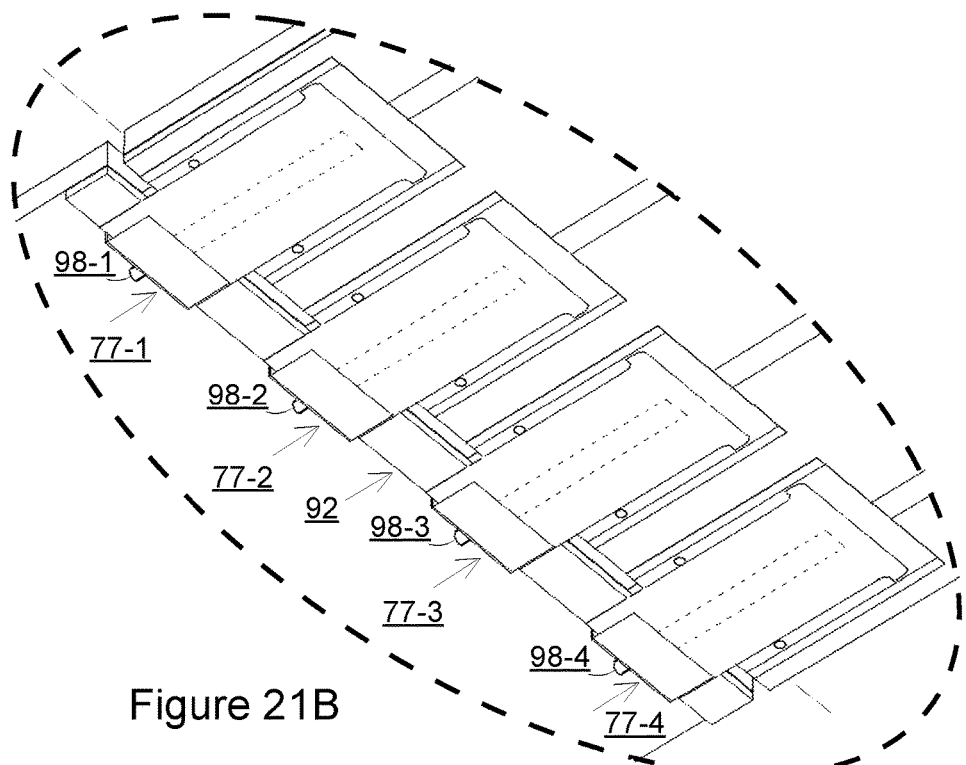
FIG. 21B shows an enlarged view of four shortened trace-bridge assemblies at the junction of a fixed stripline panel and a first deployable stripline panel in a deployed direct radiating array antenna, with dielectric guide covers removed to reveal more detail.
Figure 21C:
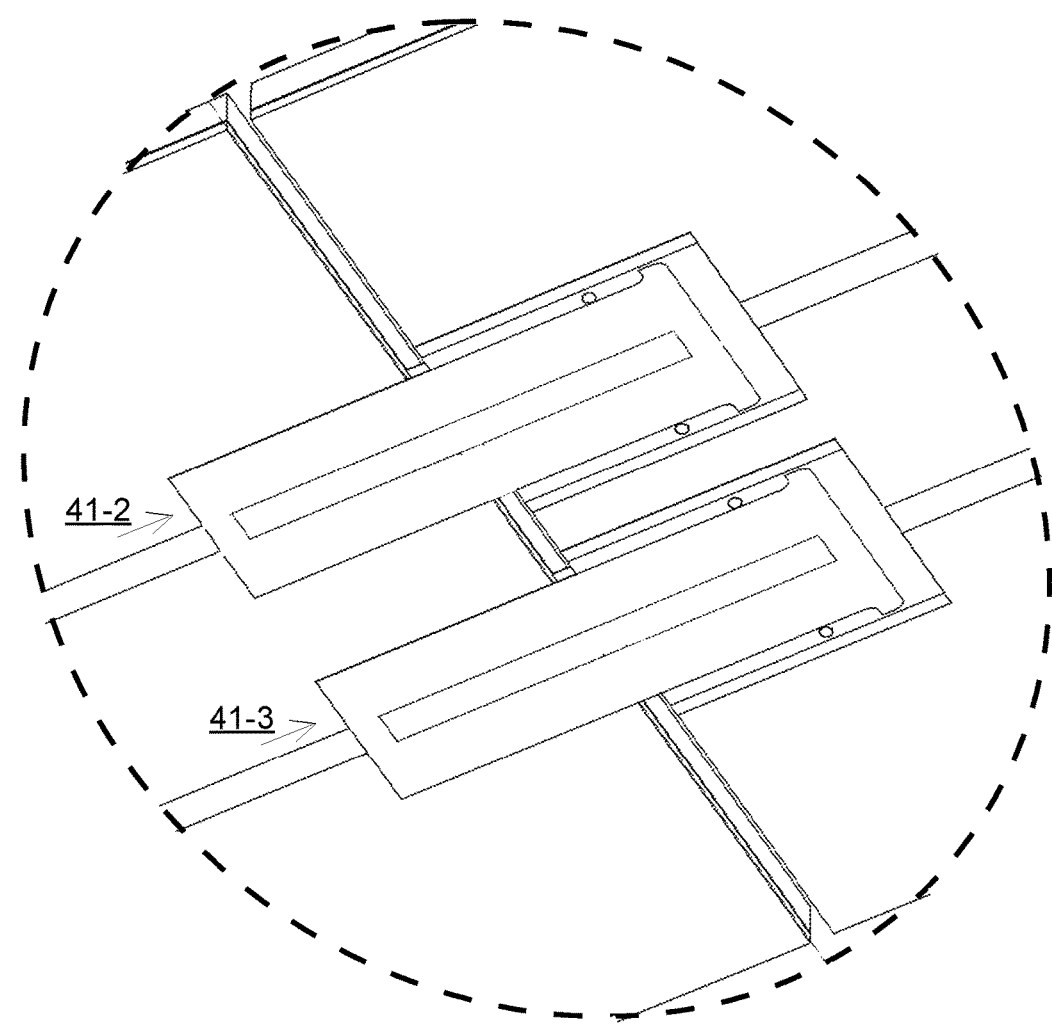
FIG. 21C shows an enlarged view of two trace-bridge assemblies at the junction of a first and second deployable stripline panel in a deployed direct radiating array antenna, with dielectric guide covers removed to reveal more detail.

In FIG. 21A, one half of each deployable stripline panel has been removed to reveal more detail. Electrically conducting traces 32-1, 32-4 are parts of stripline transmission lines feeding orthogonal polarisation signals to first deployable subarray panel 88 (FIG. 20A). Electrically conducting traces 32-2, 32-5 and 32-3, 32-6 are parts of stripline transmission lines feeding orthogonal polarisation signals to second deployable subarray panel 90. The enlarged view in FIG. 21B shows four short trace-bridge assemblies, 77-1, 77-2, 77-3, 77-4, which link between fixed stripline panel 92 and first deployable stripline panel 94 (FIG. 20B) to provide continuity of radio frequency trace currents in the respective stripline transmission lines disposed in fixed stripline panel 92 and first deployable stripline panel 94. The enlarged view in FIG. 21C shows two trace-bridge assemblies 41-2, 41-3, which link between first deployable stripline panel 94 (FIG. 20B) and second deployable stripline panel 96 (FIG. 20B) to provide continuity of radio frequency trace currents in the respective stripline transmission lines disposed in first deployable stripline panel 94 and second deployable stripline panel 96 (FIG. 20B).

Figure 22A:
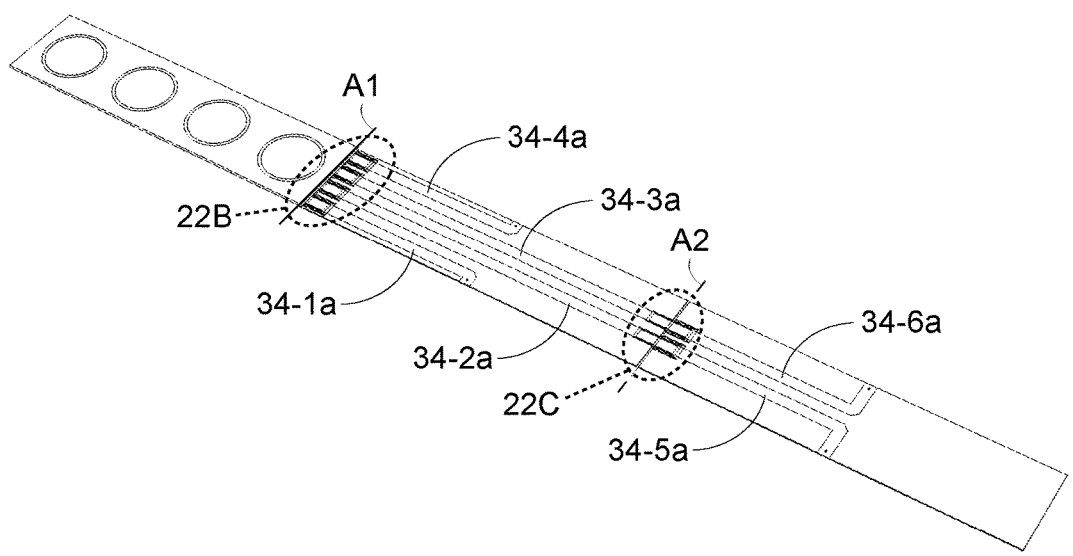
FIG. 22A shows a fixed subarray of radiating elements and ground planes of two deployable stripline panels in a deployed direct radiating array antenna, with dielectric guide covers removed and deployable subarrays of radiating elements removed to reveal more detail.
Figure 22B:
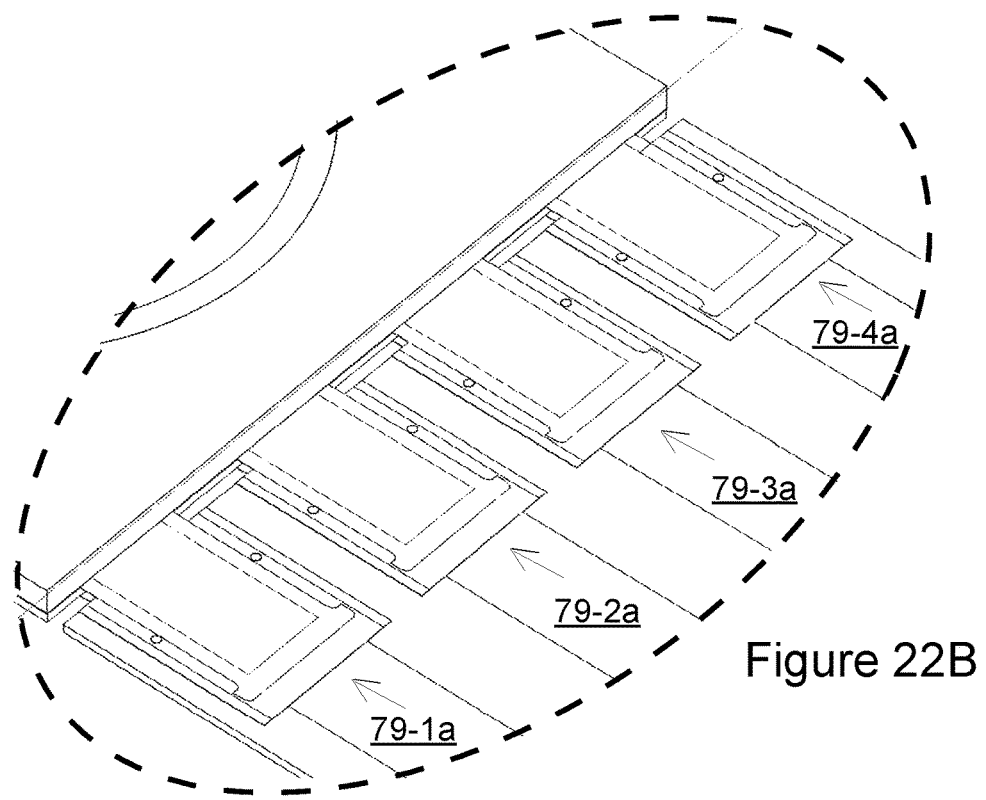
FIG. 22B shows an enlarged view of four shortened ground-bridge assemblies at the junction of a fixed stripline panel and a first deployable stripline panel in a deployed direct radiating array antenna, with dielectric guide covers removed to reveal more detail.
Figure 22C:
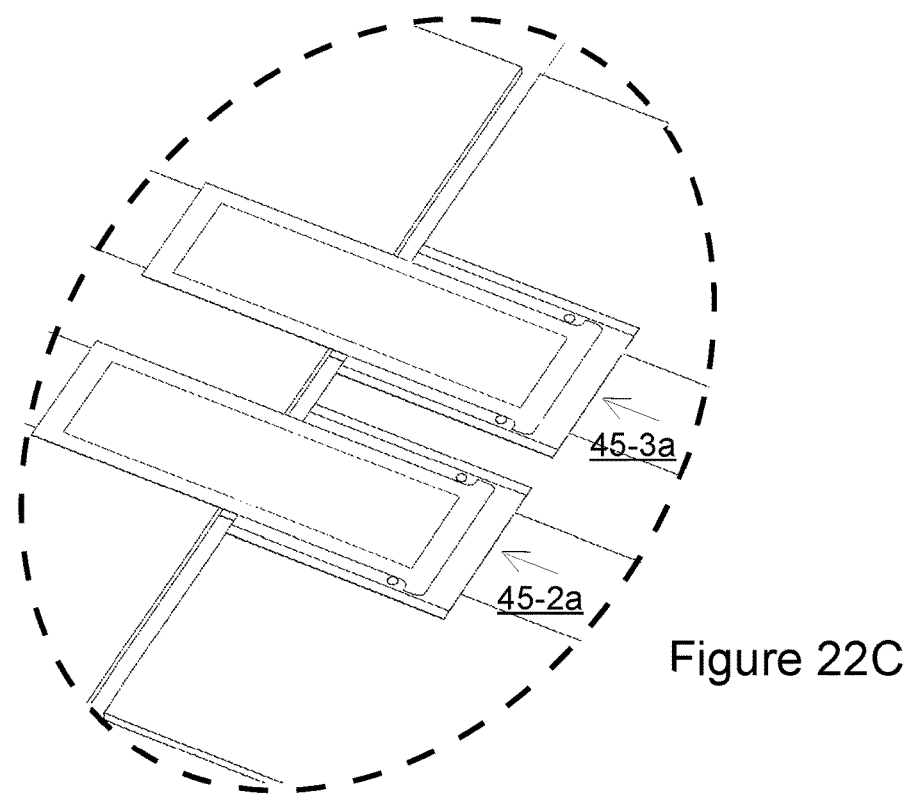
FIG. 22C shows an enlarged view of two ground-bridge assemblies at the junction of a first and second deployable stripline panels in a deployed direct radiating array antenna, with dielectric guide covers removed to reveal more detail.
Figure 23A:
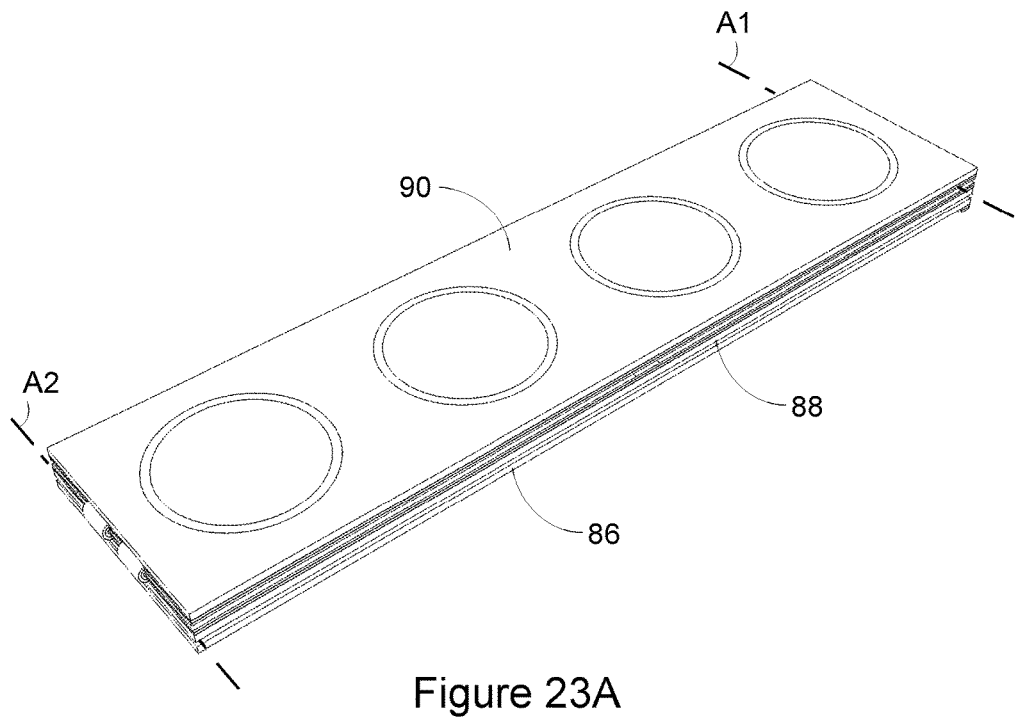
FIG. 23A shows a first aspect of a deployable direct radiating array antenna in a stowed state.
Figure 23B:
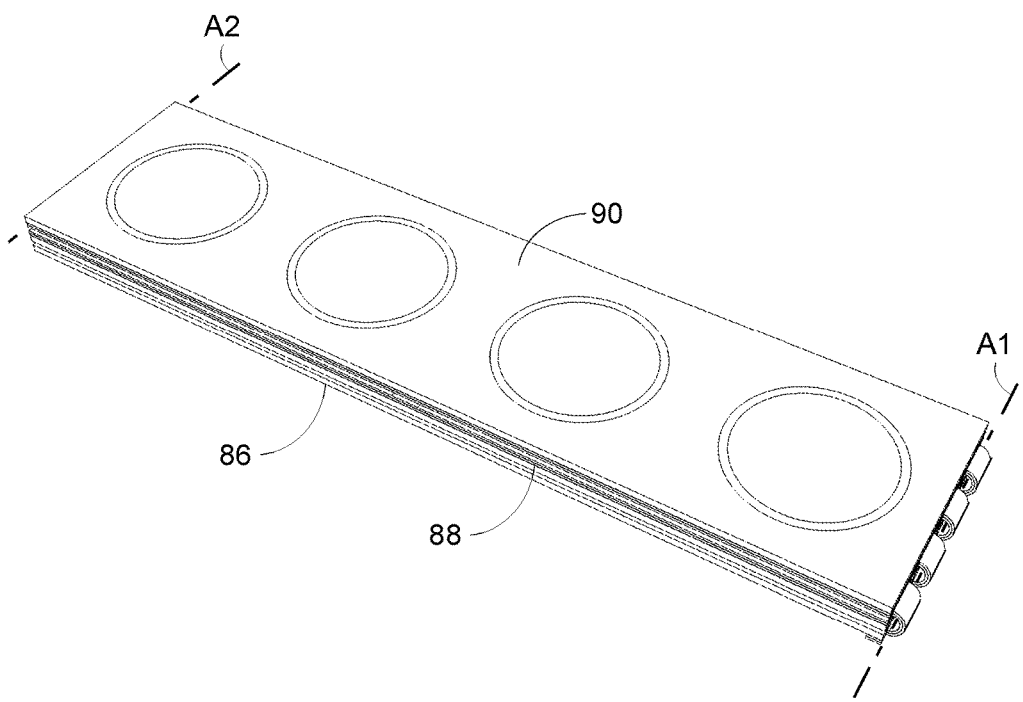
FIG. 23B shows a second aspect of a deployable direct radiating array antenna in a stowed state.
Figure 23C:
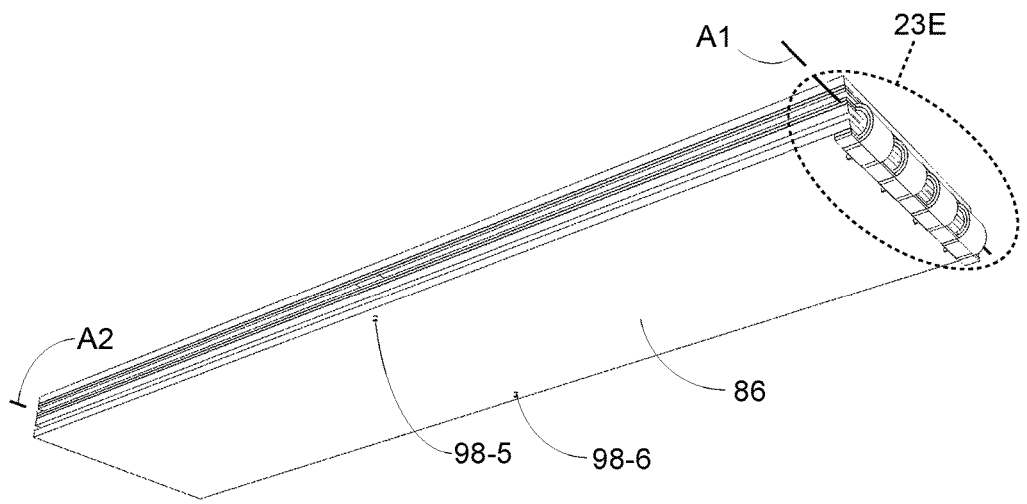
FIG. 23C shows a third aspect of a deployable direct radiating array antenna in a stowed state.
Figure 23D:
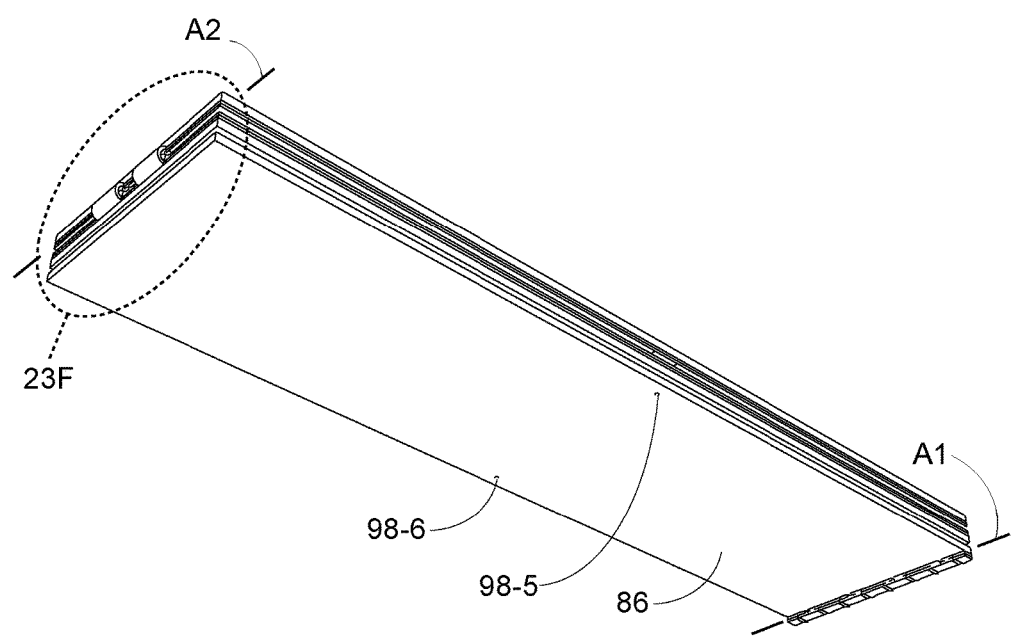
FIG. 23D shows a fourth aspect of a deployable direct radiating array antenna in a stowed state.
Figure 23E:
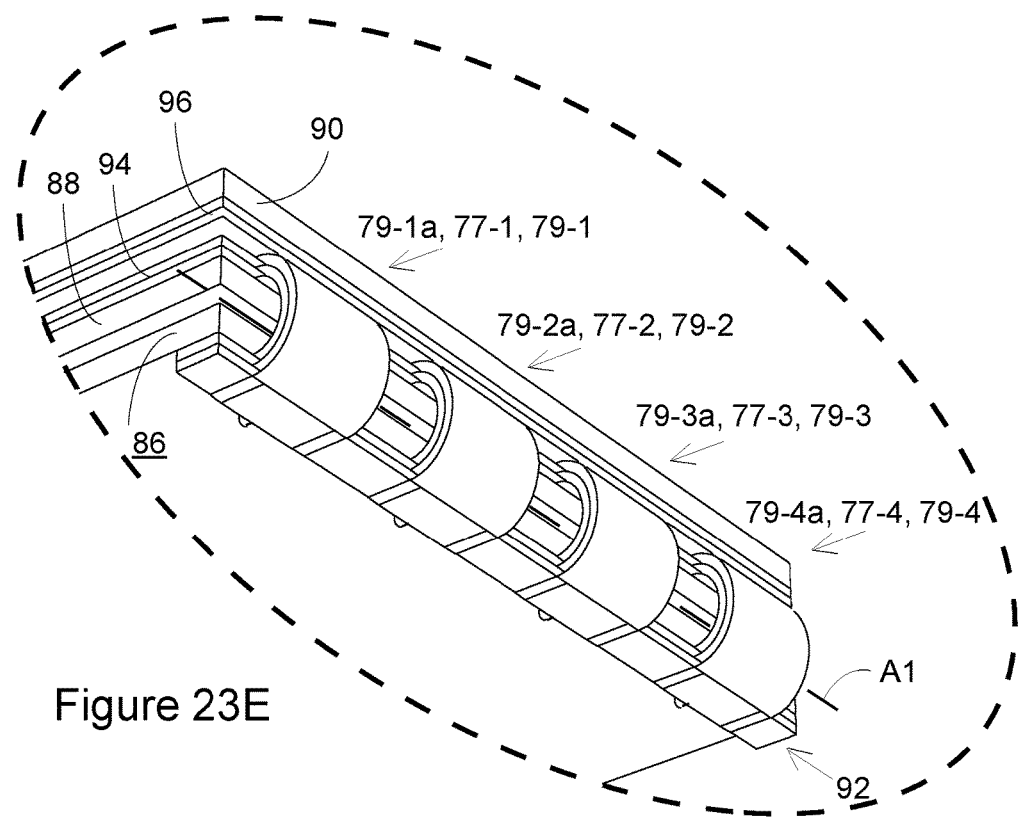
FIG. 23E shows an enlarged view of the proximal end of a deployable direct radiating array antenna in a stowed state.
Figure 23F:
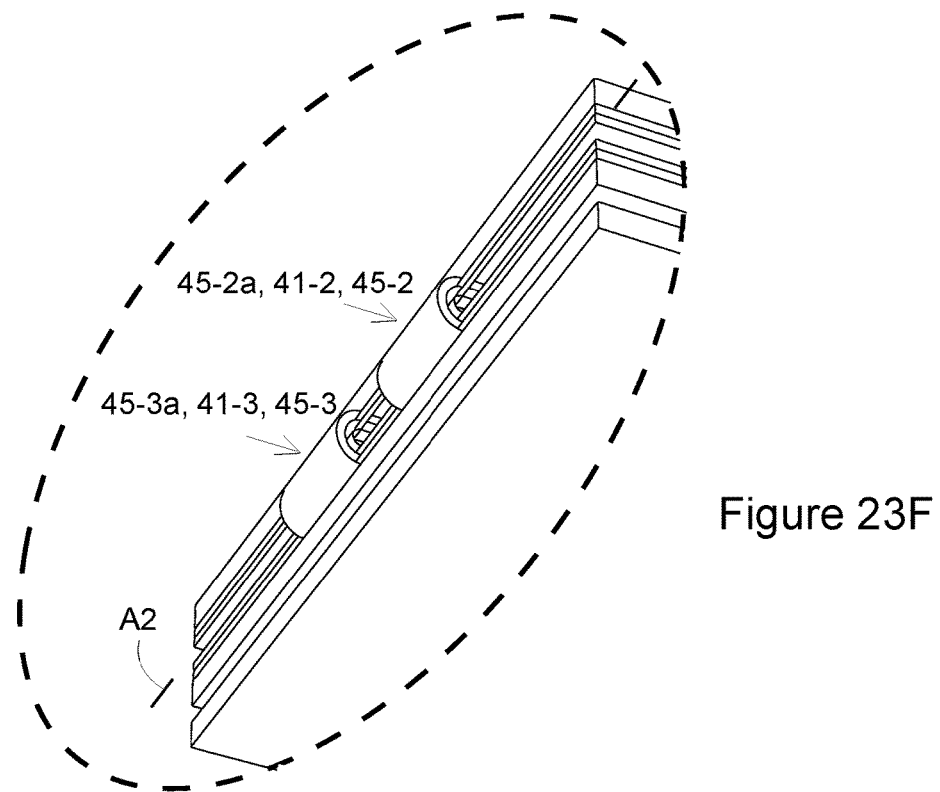
FIG. 23F shows an enlarged view of the distal end of a deployable direct radiating array antenna in a stowed state.

In FIG. 22A, first deployable subarray panel 88 (FIG. 20A) and second deployable subarray panel 90 (FIG. 20A) have been removed to reveal more detail. Electrically conducting ground planes 34-1a, 34-4a are parts of stripline transmission lines feeding orthogonal polarisation signals to first deployable subarray panel 88 (FIG. 20A). Electrically conducting ground planes 34-2a, 34-5a and 34-3a, 34-6a are parts of stripline transmission lines feeding orthogonal polarisation signals to second deployable subarray panel 90 (FIG. 20A). The enlarged view in FIG. 22B shows four short ground-bridge assemblies, 79-1a, 79-2a, 79-3a, 79-4a, which link between fixed stripline panel 92 and first deployable stripline panel 94 (FIG. 20B) to provide continuity of radio frequency ground currents in the respective stripline transmission lines disposed in fixed stripline panel 92 and first deployable stripline panel 94. The enlarged view in FIG. 22C shows two ground-bridge assemblies 45-2a, 45-3a, which link between first deployable stripline panel 94 (FIG. 20B) and second deployable stripline panel 96 (FIG. 20B) to provide continuity of radio frequency ground currents in the respective stripline transmission lines disposed in first deployable stripline panel 94 and second deployable stripline panel 96 (FIG. 20B).

FIG. 23 shows different aspects of the deployable direct radiating array antenna in a stowed state. FIGS. 23A and 23B show second deployable subarray panel 90 folded against first deployable subarray panel 88, which folded against fixed subarray panel 86. FIGS. 23C and 23D show the back of fixed subarray panel 86 and the coaxial connectors 98-5, 98-6 to which non-deployable coaxial cables (not shown) from the transmitter and receiver subsystems of the satellite payload (not shown) are connected. In FIG. 23E, the enlarged view of one end of the stowed direct radiating array antenna shows first deployable subarray panel 88, with first deployable stripline panel 94 attached, and second deployable subarray panel 90, with second deployable stripline panel 96 attached, folded into a stack above fixed subarray panel 86. The flexible dielectric parts of short ground-bridge assemblies 79-1a, 79-2a, 79-3a, 79-4a, short trace-bridge assemblies 77-1, 77-2, 77-3, 77-4 and short ground-bridge assemblies 79-1, 79-2, 79-3, 79-4 are all smoothly bent through 180 degrees. In FIG. 23F, the enlarged view of the opposite end of the stowed direct radiating array antenna shows the flexible parts of ground-bridge assemblies 45-2a, 45-3a, trace-bridge assemblies 41-2, 41-3 and ground-bridge assemblies 45-2, 45-3 all smoothly bent through 180 degrees.

Figure 24A:
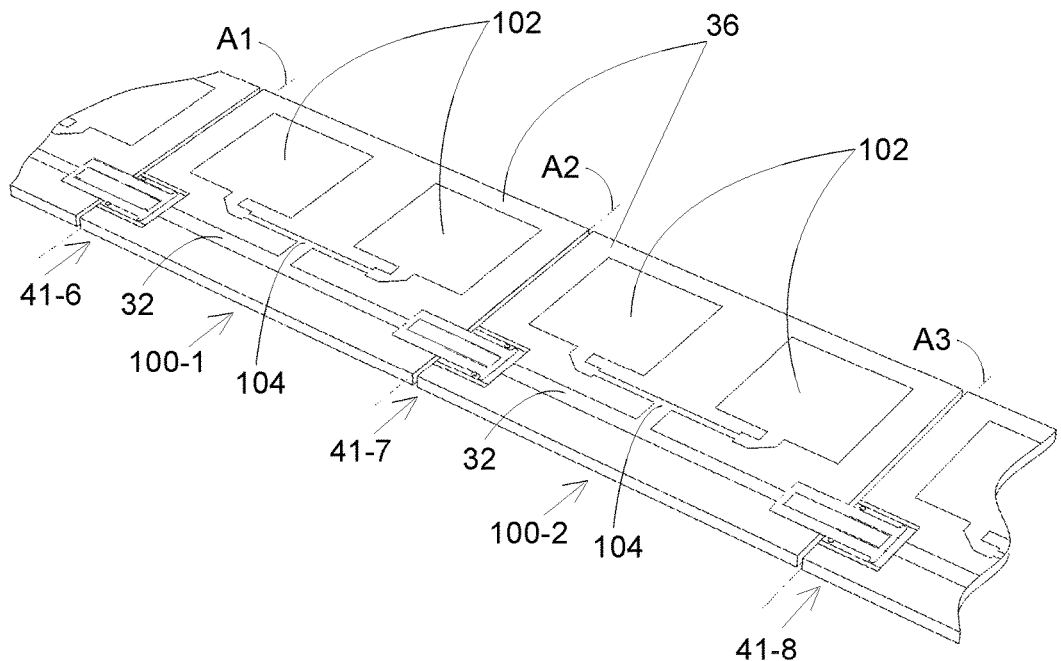
FIG. 24A shows part of a deployed microstrip patch antenna, viewed from the radiating element side, with dielectric guide covers removed to reveal more detail.
Figure 24B:
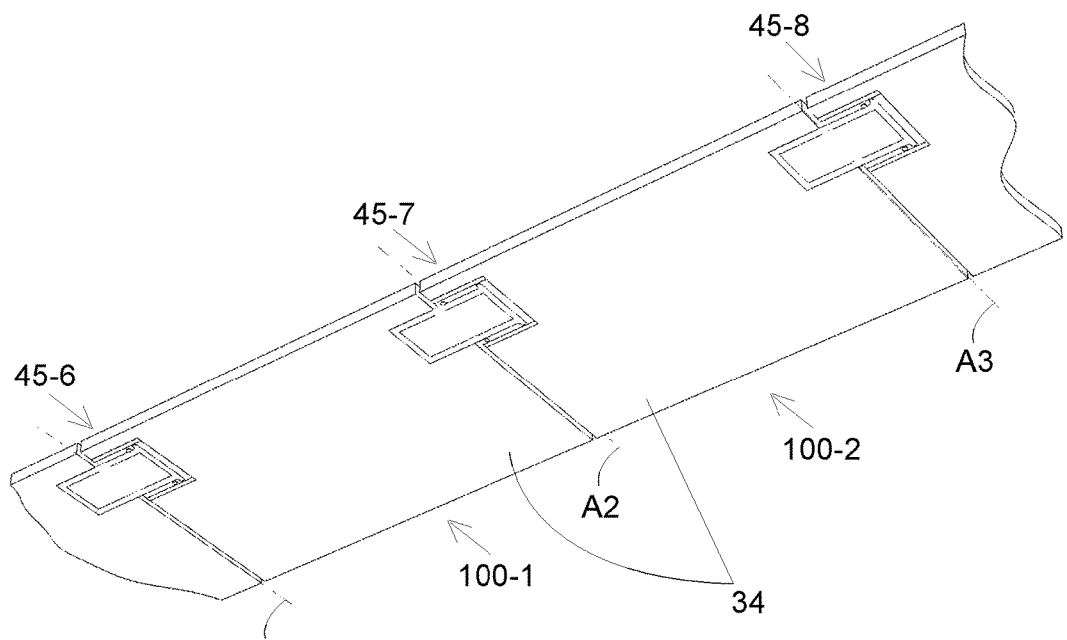
FIG. 24B shows part of a deployed microstrip patch antenna, viewed from the ground plane side, with dielectric guide covers removed to reveal more detail.

Another application of some of the embodiments in a deployable direct radiating array antenna that uses a deployable microstrip transmission line to distribute radio frequency energy to and from patch radiator panels will now be described with reference to FIGS. 24A and 24B. FIG. 24A shows part of a deployed direct radiating array antenna, where deployable patch radiator panels 100-1, 100-2 each comprise rigid dielectric substrate 36, patch radiating elements 102 and electrically-conducting ground plane 34 (FIG. 24B). Microstrip transmission line, comprising electrically-conducting trace 32, electrically-conducting ground plane 34 and rigid dielectric substrate 36 is integrated within each patch radiator panel 100-1, 100-2. Trace-bridge assemblies 41-6, 41-7, 41-8 link between the patch radiator panels to provide continuity of radio frequency current in the traces (FIG. 24A). Ground-bridge assemblies 45-6, 45-7, 45-8 (FIG. 24B) link between the patch radiator panels to provide continuity of radio frequency current in the ground planes. Radio frequency energy can thus be transferred between neighbouring deployed patch radiator panels and distributed to patch radiating elements 102 via the connecting feed traces 104 (FIG. 24A). Stowage is effected by relative rotation of patch radiator panels 100-1, 100-2 (and neighbouring panels) about rotation axes A1, A2, A3. Rotary actuators (not shown) and hinges (not shown), which are mechanically coupled to the patch radiator panels, are typically disposed at the inter-panel junctions to facilitate movement of the patch radiator panels between the stowed and deployed states.

In the embodiments described thus far herein, several of the parts associated with the trace-bridge assemblies and ground-bridge assemblies are disposed asymmetrically about a rotation axis. A symmetric embodiment, wherein all bridge assembly parts are disposed symmetrically about a rotation axis, will now be described with the aid of FIGS. 25 to 29.

An example of a symmetric bridge assembly embodiment in a deployable radio frequency transmission line is illustrated in FIGS. 25 to 28, which show different aspects of a deployed two-section microstrip transmission line, comprising a first microstrip transmission line 30-1 and a second microstrip transmission line 30-2, mechanically coupled together by means of a hinge (not shown) to allow relative rotation of the first and second microstrip transmission lines about rotation axis A0.

Figure 25A:
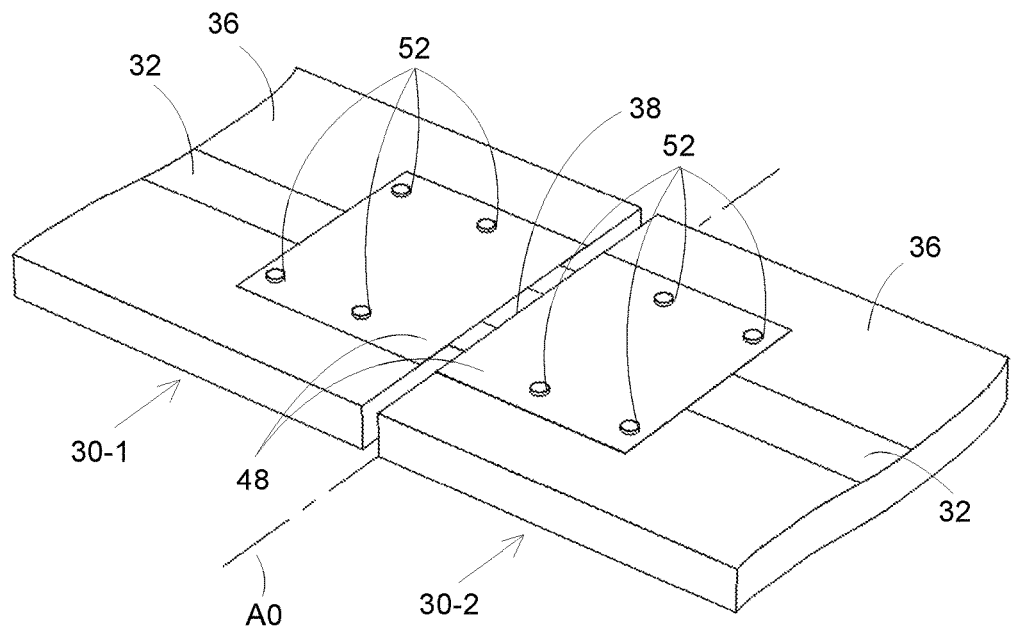
FIG. 25A is a trace view of a deployed two-section microstrip transmission line showing a symmetric trace-bridge, with dielectric guide cover in situ.
Figure 25B:
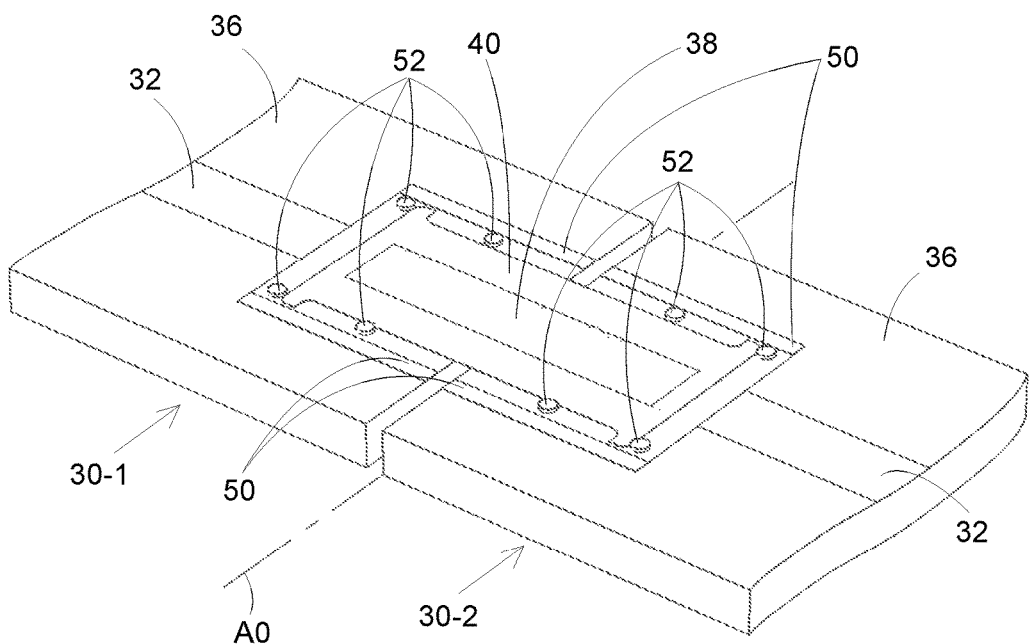
FIG. 25B is a trace view of a deployed two-section microstrip transmission line showing a symmetric trace-bridge, with dielectric guide cover removed to reveal more detail.
Figure 26:
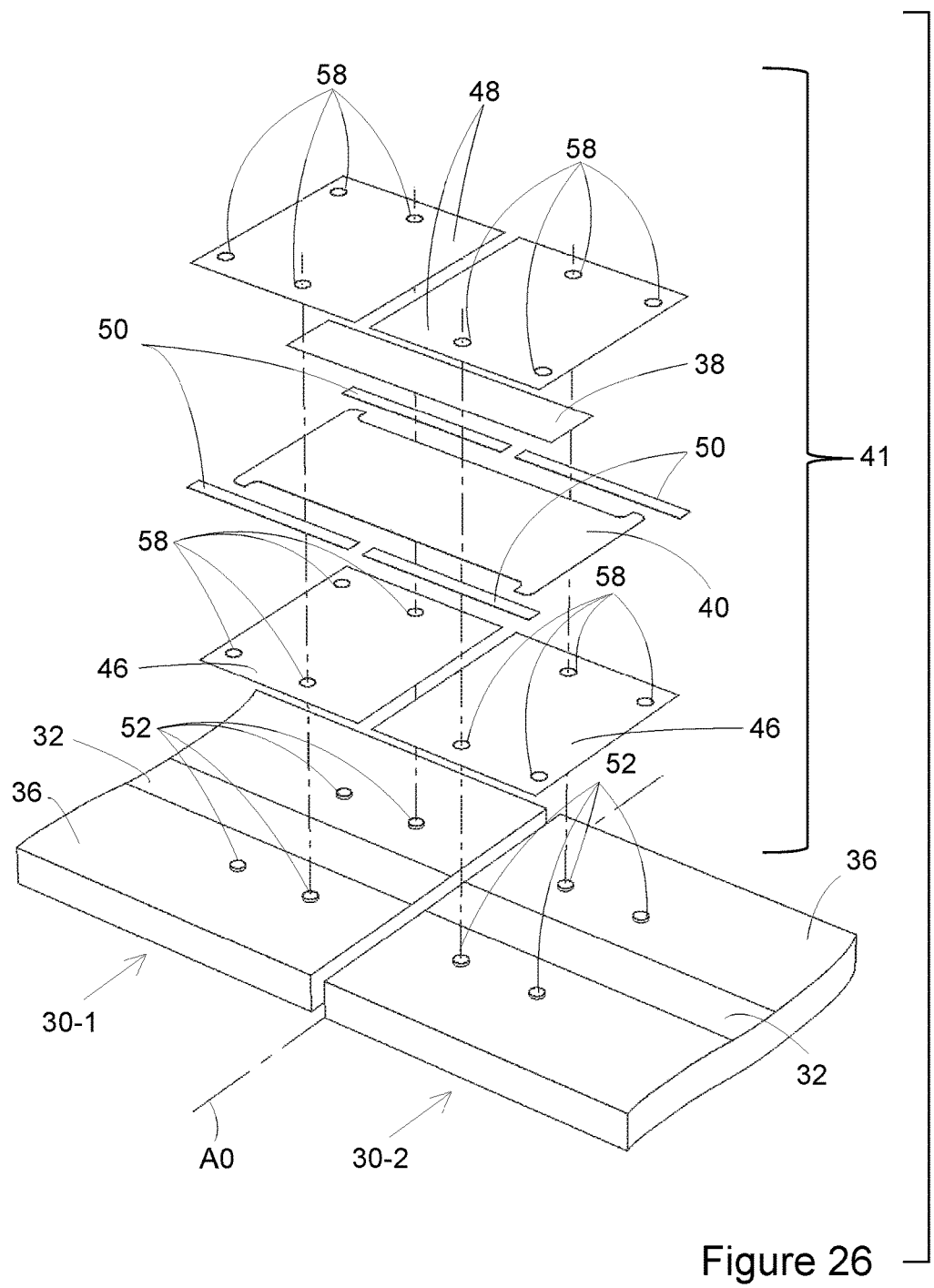
FIG. 26 is a trace view of a deployed two-section microstrip transmission line, with an exploded view of a symmetric trace-bridge.
Figure 27A:
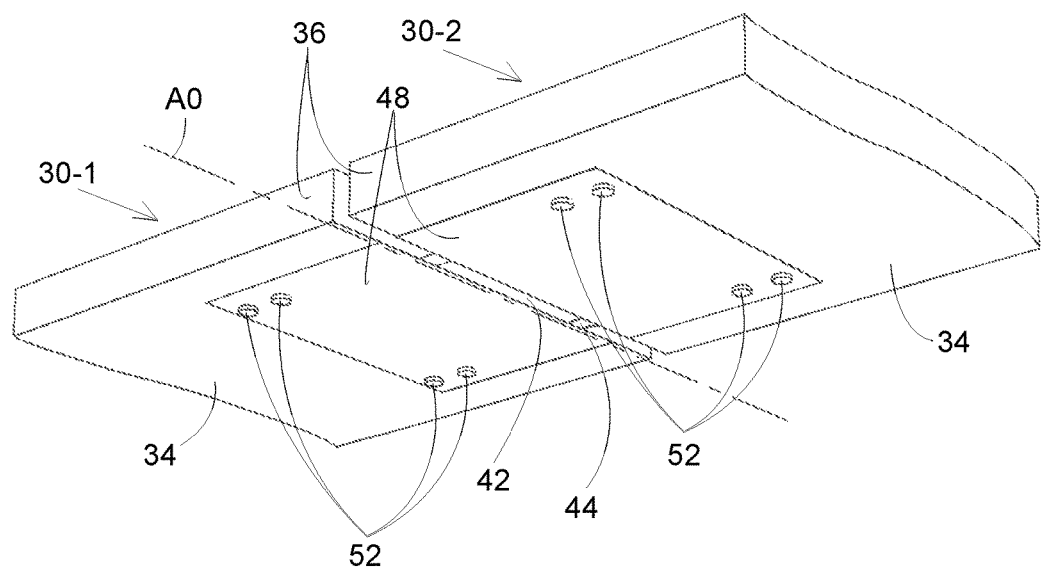
FIG. 27A is a ground plane view of a deployed two-section microstrip transmission line showing a symmetric ground-bridge, with dielectric guide cover in situ.
Figure 27B:
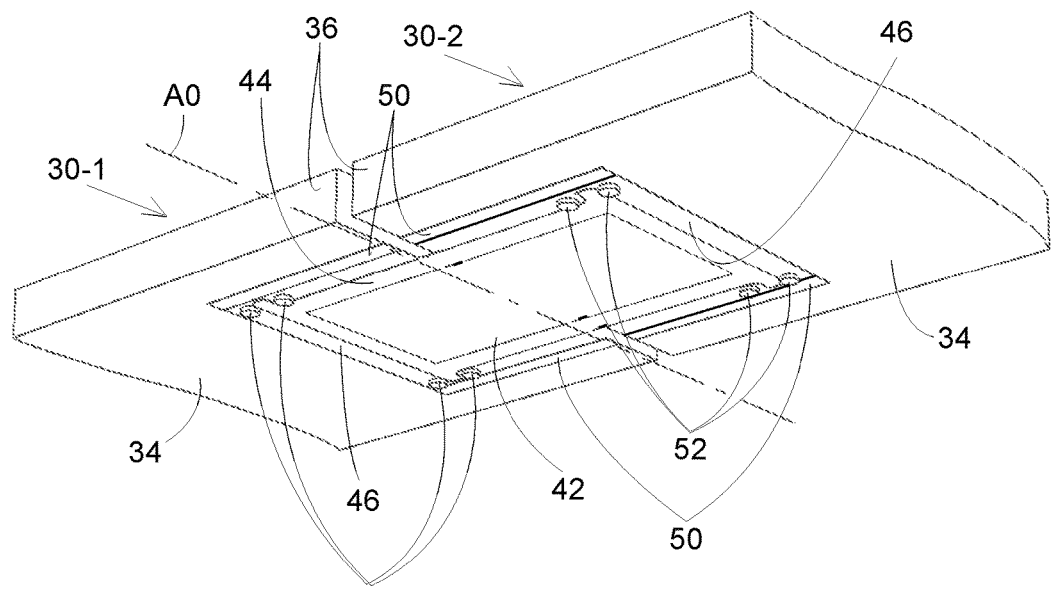
FIG. 27B is a ground plane view of a deployed two-section microstrip transmission line showing a symmetric ground-bridge, with dielectric guide cover removed to reveal more detail.
Figure 28:
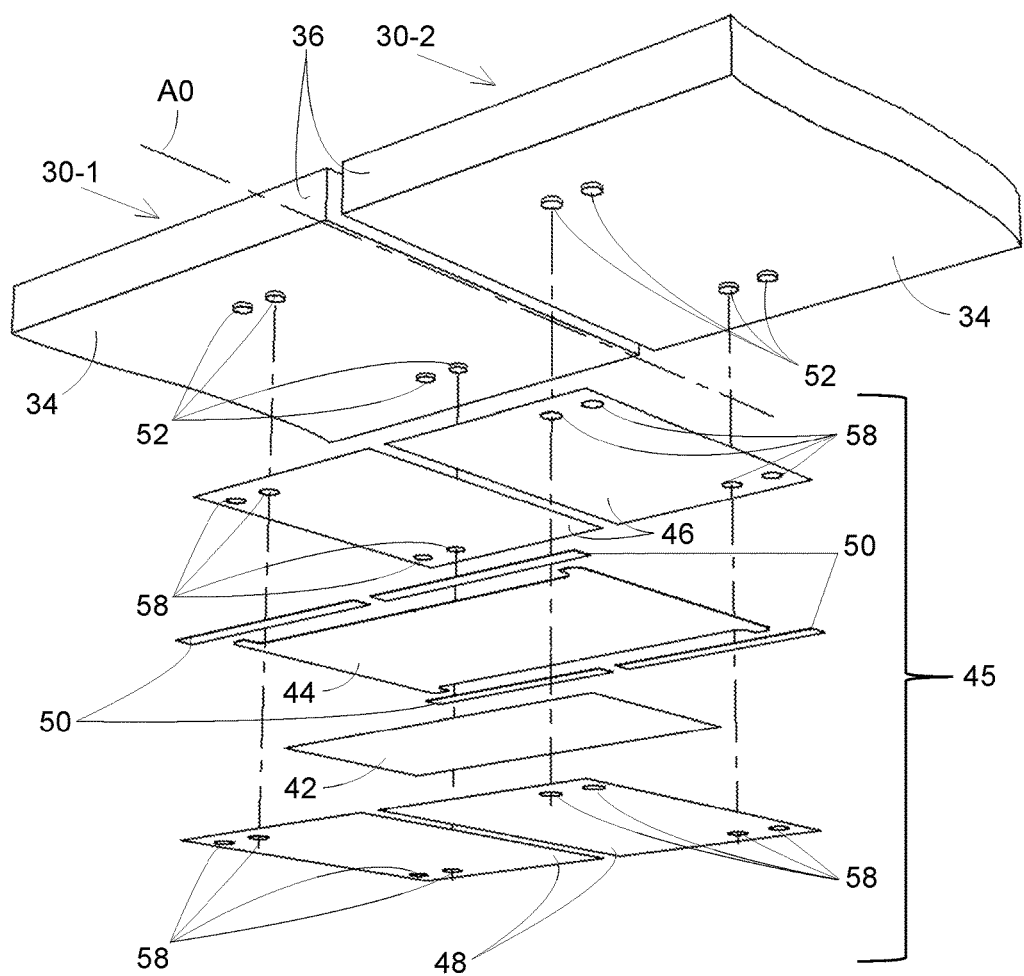
FIG. 28 is a ground plane view of a deployed two-section microstrip transmission line, with an exploded view of a symmetric ground-bridge.

For clarity, dielectric guide covers 48, which are shown in FIGS. 25A and 27A, and in the exploded views of FIGS. 26 and 28, are not shown in FIGS. 25B, 27B, 29A and 29B.

Electrically-conducting traces 32 are spaced apart from electrically-conducting ground planes 34 (FIG. 27) by rigid dielectric substrates 36 to form the respective first and second microstrip transmission lines 30-1, 30-2.

Referring to FIG. 25 and the exploded view in FIG. 26, flexible electrically-conducting trace 38 is bonded to flexible dielectric trace bridge 40. Flexible dielectric trace bridge 40 and flexible electrically-conducting trace 38 are kept in close proximity to microstrip transmission lines 30-1, 30-2 by dielectric guide covers 48, which, together with guide spacers 50, are firmly attached to microstrip transmission lines 30-1, 30-2.

Flexible dielectric trace bridge 40 is free to slide relative to both the first and second microstrip transmission lines 30-1, 30-2 during movement between stowed and deployed states. Dielectric guide bases 46 are firmly attached to respective microstrip transmission lines 30-1, 30-2. Dielectric guide bases 46, dielectric guide covers 48, flexible dielectric trace bridge 40 and flexible electrically-conducting trace 38 are all made of low-friction material to facilitate easy sliding of flexible dielectric trace bridge 40 during movement between stowed and deployed states.

Stops 52 are rigidly fixed to microstrip transmission lines 30-1, 30-2. In the deployed state, flexible dielectric trace bridge 40 is prevented from longitudinal movement and transverse movement by the respective distal and proximal stops (FIG. 25B). Trace-bridge assembly 41 (FIG. 26) thus provides a link between respective traces 32 of microstrip transmission lines 30-1, 30-2. Holes 58 (FIG. 26) in dielectric guide covers 48 and dielectric guide bases 46 assist alignment during assembly.

Referring to FIG. 27 and the exploded view in FIG. 28, flexible electrically-conducting ground plane 42 is bonded to flexible dielectric ground plane bridge 44. Flexible dielectric ground plane bridge 44 and flexible electrically-conducting ground plane 42 are kept in close proximity to microstrip transmission lines 30-1, 30-2 by dielectric guide covers 48, which, together with guide spacers 50 and dielectric guide bases 46, are firmly attached to respective microstrip transmission lines 30-1, 30-2.

Flexible dielectric ground plane bridge 44 is free to slide relative to both the first and second microstrip transmission lines 30-1, 30-2 during movement between stowed and deployed states.

Dielectric guide bases 46, dielectric guide covers 48, flexible dielectric ground plane bridge 44 and flexible electrically-conducting ground plane 42 are all made of low-friction material to facilitate easy sliding of flexible dielectric ground bridge 44 during movement between stowed and deployed states.

Stops 52 are rigidly fixed to microstrip transmission lines 30-1, 30-2. In the deployed state, flexible dielectric ground bridge 40 is prevented from longitudinal movement and transverse movement by the respective distal and proximal stops (FIG. 27B). Ground-bridge assembly 45 (FIG. 28) thus provides a link between respective electrically conducting ground planes 34 of the microstrip transmission lines 30-1, 30-2. Holes 58 (FIG. 28) in dielectric guide covers 48 and dielectric guide bases 46 assist alignment during assembly.

Figure 29A:
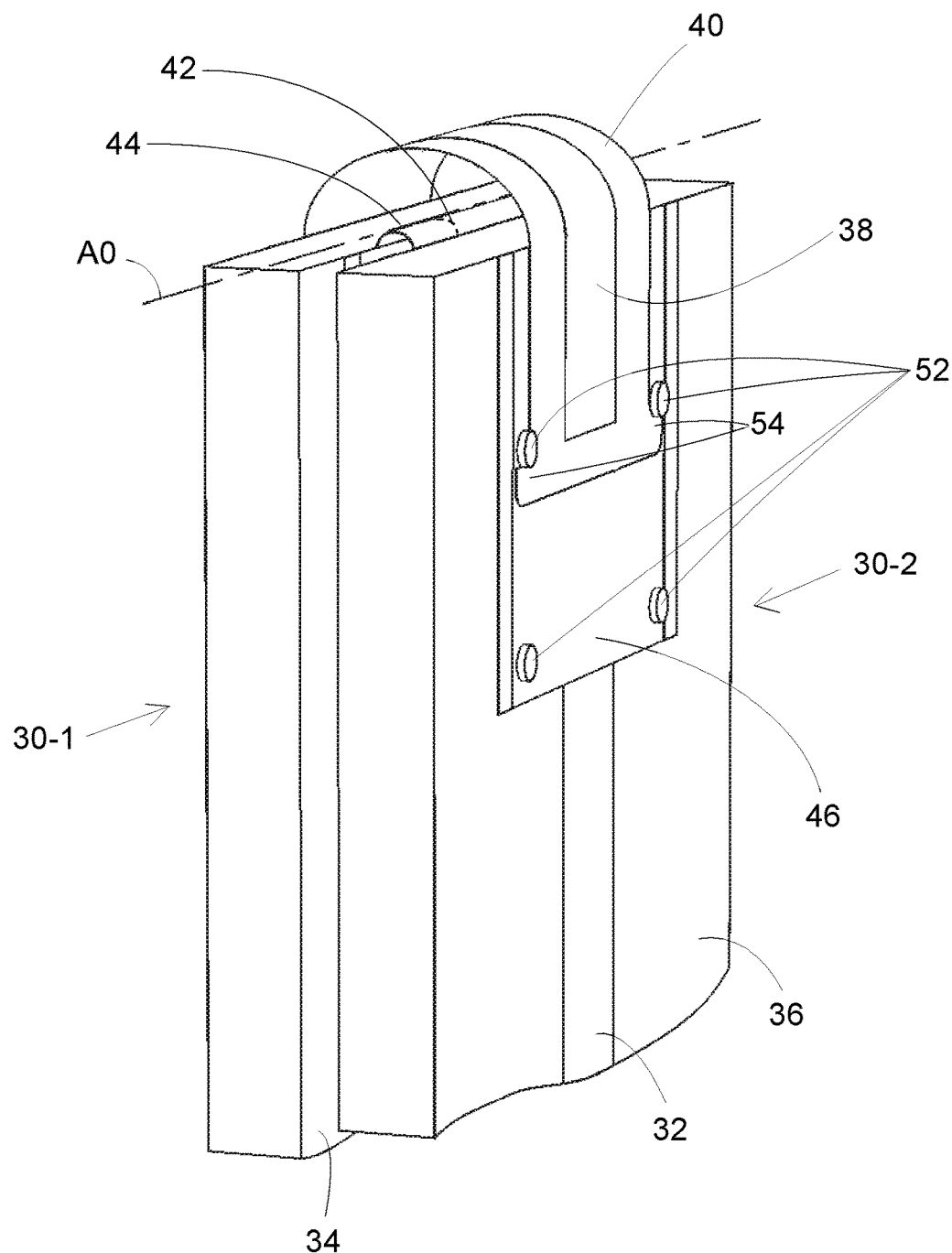
FIGS. 29A and 29B show different aspects of a stowed two-section microstrip transmission line incorporating a symmetric trace-bridge and a symmetric ground-bridge, with dielectric guide covers removed to reveal more detail.
Figure 29B:
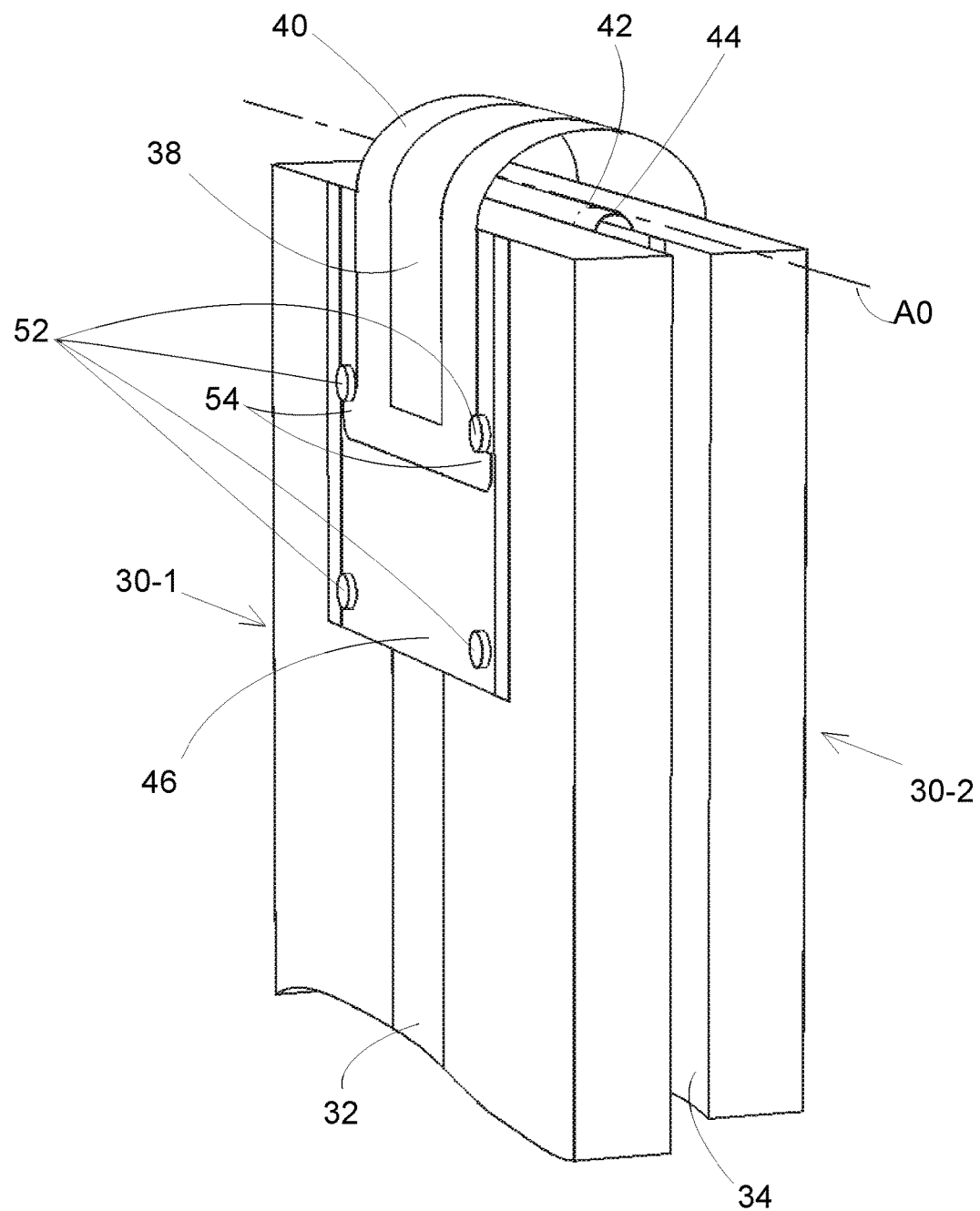

FIGS. 29A and 29B show different aspects of the deployable two-section microstrip transmission line in a stowed state, which is adopted for storage, shipment and launch. Flexible dielectric trace bridge 40 and flexible dielectric ground plane bridge 44, together with their respective flexible electrically-conducting trace 38 and flexible electrically-conducting ground plane 42, are bent in smooth curves through 180 degrees, all being constrained by their respective dielectric guide covers 48 (shown in FIGS. 25A and 27A but not shown in FIGS. 29A and 29B). Tabs 54, shown resting against proximal stops 52, restrain flexible dielectric trace bridges 40 and flexible dielectric ground plane bridges 44 to prevent their ejection and to withstand vibration during shipment and launch.

From the descriptions given thus far herein, it is obvious to a person skilled in the art that the bridge embodiments shown in FIGS. 10 to 14 can readily be adapted for use in symmetrical bridge embodiments. Furthermore, it is obvious to a person skilled in the art that such symmetrical bridge embodiments can readily be adapted for use in deployable stripline and other planar transmission line, such as coplanar waveguide, slotline and coplanar strip.

The following paragraphs give information on the preferred materials and on the ranges of dimensions for the various parts that are used in the described embodiments. The named materials and the given range of dimensions should be considered as indicative and by no means exclusive, since the optimum materials and dimensions used for a given application will depend on such factors as the operating radio frequency, environmental conditions, mission lifetime, budget and other system requirements.

Materials for use in microstrip and stripline transmission lines include a wide variety of pure materials and mixtures, many of which are available in sheet form and therefore convenient for constructing the microstrip and stripline transmission line embodiments described herein.

When large antenna panels are required, either a low density foam, e.g. a polymethacrylimide foam, or a quartz honeycomb is preferred for dielectric substrate 36. The thickness of the dielectric substrate 36 is typically in the range of a few millimetres through to about 100 mm, depending on the requirements of the antenna panel, which can range from a fraction of a square metre through to several square metres. When using these low density materials, electrically-conducting ground planes 34 and electrically-conducting traces 32 are conveniently realised through the use of a copper-clad laminated composite comprising polyimide film and copper foil bonded together with an acrylic adhesive. This copper-clad laminated composite is normally bonded to either the low density foam or quartz honeycomb sheet by means of an epoxy film adhesive.

Radiation loss from a microstrip transmission line can become significant if the thickness of dielectric substrate 36 is made too large, especially if the relative permittivity of the dielectric is low, e.g. when either polymethacrylimide foam or quartz honeycomb is used.

When the thickness of the dielectric substrate 36 is required to be less than about 6 mm, other materials for consideration include glass reinforced polytetrafluoroethylene, cross linked polystyrene, polyphenelene oxide, ceramic-filled resin, and quartz-loaded polytetrafluoroethylene. Such materials are usually available with copper laminated to one or both sides, thus making them convenient for providing a ready-made ground plane 34 and, by means of either an etching or machining process, electrically-conducting trace 32 of either the microstrip or stripline deployable transmission line embodiment can be realised.

In some applications, where for example the antenna radiating elements require a large separation from the ground plane, a thinner microstrip or stripline transmission line can be bonded to a thicker dielectric polymethacrylimide foam or quartz honeycomb panel to provide a composite assembly.

The flexible electrically-conducting trace 38 and flexible dielectric trace bridge 40 can be fabricated from a copper-clad laminated composite comprising polyimide film and copper foil bonded together with an acrylic adhesive. An additional polyimide layer of appropriate thickness, according to the stowed bend radius of the flexible dielectric bridge, can be bonded to this composite. The sliding property of the flexible dielectric trace bridge 40 can be improved by using a layer of polyimide film coated on the external side with fluorinated ethylene propylene resin to provide a lower coefficient of friction.

Similarly, the flexible electrically-conducting ground plane 42 and flexible dielectric ground plane bridge 44 can be fabricated from a copper-clad laminated composite comprising polyimide film and copper foil bonded together with an acrylic adhesive. An additional polyimide layer of appropriate thickness, according to the stowed bend radius of the flexible dielectric bridge, can be bonded to this composite. The sliding property of the flexible dielectric ground plane bridge 44 can be improved by using a layer of polyimide film coated on the external side with fluorinated ethylene propylene resin to provide a lower coefficient of friction.

Beryllium copper foil is an alternative material to use for flexible electrically-conducting trace 38 and flexible electrically-conducting ground plane 42. The use of beryllium copper for these parts can allow a relatively large amount of strain energy to be stored when a deployable transmission line is in its stowed state. This strain energy can be used to assist the deployment of the deployable transmission line and hence contribute to the deployment of an antenna in which the transmission line is incorporated. In some embodiments there may be sufficient such stored strain energy in the stowed state to permit reductions in the size, mass and power requirements specified for the actuator. Indeed, through careful design, the stored energy may even be sufficient to eliminate the need for a separate actuator to drive the deployment; in such a situation the deployable transmission line herein described provides both a means of conveying radio frequency energy and a means of mechanically powering the deployment of itself and the antenna in which it is incorporated. The behaviour of such a deployment would be different to that obtained with a conventional actuator and therefore the conventional mechanisms for release, damping and latching would need to be modified accordingly.

The overall thickness of each flexible dielectric trace bridge 40 and flexible dielectric ground plane bridge 44 is predetermined by consideration of the electrical and mechanical considerations but is typically in the range 100 micron to 0.5 mm, depending on their bend radii when in the stowed state.

The predetermined thicknesses of flexible electrically-conducting trace 38 and flexible electrically-conducting ground plane 42 depends on the skin depth, which is a function of the radio frequency, the conductivity and permeability of the material; typical thicknesses for suitable copper foil are 17.5 and 35 micron.

The predetermined lengths of flexible trace 38 and flexible ground plane 42 depend on the radio frequency and on the permittivity of the surrounding dielectric materials used in flexible dielectric trace bridge 40 and flexible dielectric ground plane bridge 44, as well as on the gap between the neighbouring sections of transmission line. Typical lengths range from 20 mm to 400 mm.

The predetermined lengths of flexible dielectric trace bridge 40 and flexible dielectric ground plane bridge 44 exceeds that of flexible electrically-conducting trace 38 and flexible electrically-conducting ground plane 42 by a distance that depends on the thickness of dielectric substrates 36 and on the inter-panel spacing in the stowed state. Typical lengths range from 30 mm to 800 mm.

In general, the flexible electrically-conducting strip and the flexible dielectric bridge form a composite structure in which the respective materials and dimensions of the component parts result in a flexural rigidity that determines the desired elastically bendable behaviour for successful deployment.

Dielectric guide base 46 and dielectric guide cover 48 can be fabricated from polyimide film that is coated on one side with FEP fluoropolymer resin to give low friction surfaces over which the respective flexible dielectric trace bridge 40 and flexible dielectric ground plane bridge 44 can slide freely.

Dielectric guide cover 48 is separated from dielectric guide base 46 by means of guide spacer 50, which can be fabricated from polyimde film of carefully chosen thickness to allow the free movement of flexible dielectric trace bridge 40 and flexible dielectric ground plane bridge 44 during deployment, while ensuring their close proximity to the trace and ground plane respectively when in the deployed state. The thickness of guide base 46 is typically in the range 25 to 100 microns. The thickness of dielectric guide cover 48 is typically in the range 75 to 250 microns.

Polytetrafluoroethylene sheet can be used for dielectric guide base 46 and dielectric guide cover 48 but fasteners are advised for fixing to the dielectric substrate because of possible peel-strength issues when adhesives are used with polytetrafluoroethylene.

Dielectric bridge support 56 can be fabricated from either polyimide film or, for a lower dissipation of radio frequency energy, from polytetrafluoroethylene sheet. However, fasteners are advised for fixing flexible dielectric trace bridge 40 and flexible dielectric ground plane bridge 44 to their respective bridge supports and to the dielectric substrate because of possible peel-strength issues when adhesives are used with polytetrafluoroethylene. The thickness of dielectric bridge support 46 is typically in the range 25 to 100 microns.

There are a wide variety of materials, either plastic or metal, from which to choose for making the stops 52, e.g. cross linked polystyrene or aluminium.

Mechanical control strips 70 can be made of either polyetherimide, acetal resin, or beryllium copper to provide additional design freedom, particularly when larger bend radii need to be accommodated. Tensioners 72 are preferably made of a lightweight, thermally stable material, such as bundled graphite or quartz fibre.

From the description above, a number of advantages of some embodiments become evident:

(a) Deployable coaxial cables, their associated coaxial connectors and cable drums can be eliminated by using the deployable transmission line described herein.
(b) The use of deployable stripline or microstrip transmission line, based on either a low density foam or quartz honeycomb, in a radar antenna can provide:
   an improvement in the sensitivity
   an improvement in the radiometric stability
   an enhancement in the scientific value of the mission
   a reduction in payload mass
   a reduction in power requirements
(c) For a given mass and performance, the use of deployable stripline or microstrip transmission lines can improve the stiffness of the deployed antenna.
(d) The use of deployable stripline or microstrip transmission lines can reduce the torque required to deploy the antenna and thus reduce the size, mass and power requirements of the actuators used for deployment.
(e) In some applications, the energy stored in the bridge assemblies may be sufficient to eliminate the need for a separate actuator to drive the deployment. In such a situation the deployable transmission line herein described provides both a means of conveying radio frequency energy and a means of mechanically powering the deployment of itself and the antenna in which it is incorporated.
(f) The use of deployable stripline or microstrip transmission lines can reduce the dissipation loss within the deployed antenna subsystem and thus improve the system performance of a communications system.
(g) By avoiding metal-to-metal contact through the use of deployable stripline or microstrip transmission lines, rather than coaxial cables and their connectors, some sources of passive intermodulation can be eliminated.

In some applications of the embodiments, herein described, it may be possible to eliminate some of the parts. For example, if the dielectric substrate and electrically conducting surfaces of the transmission line are made from sufficiently low-friction materials then it may be possible to eliminate the dielectric guide base; in such a situation, the dielectric support can also be eliminated. As another example, if the application of some embodiments allows the use of a relatively thin, flexible and low-friction material such as polytetrafluoroethylene sheet then the guide spacers may be eliminated provided the design dimensions and tolerances ensure that there is no risk of the flexible dielectric bridge becoming pinched or snagged during deployment.

Although the foregoing has been a description and illustration of specific embodiments of the invention, it should be understood that the present invention has been described above purely by way of example and various modifications and changes thereto can be made by persons skilled in the art without departing from the scope and spirit of the invention as defined in the following claims.

Reference numerals, designating the respective parts of the various embodiments described herein are listed below:
30 microstrip transmission line
32 electrically-conducting trace
34 electrically-conducting ground plane
36 rigid dielectric substrate
38 flexible electrically-conducting trace
40 flexible dielectric trace bridge
41 trace-bridge assembly
42 flexible electrically-conducting ground plane
44 flexible dielectric ground plane bridge
45 ground-bridge assembly
46 dielectric guide base
48 dielectric guide cover
50 guide spacer
52 stop
54 tab
56 dielectric bridge support
58 hole
60 stripline transmission line
62 dielectric-substrate spacer
64 flexible dielectric bridge
66 flexible electrically-conducting strip
68 adhesive film
70 mechanical control strips
72 tensioner
74 sprocket hole
76 short flexible trace-bridge composite
77 short trace-bridge assembly
78 short flexible ground-bridge composite
79 short ground-bridge assembly
80 notch
82 trace connection point
84 ground plane connection point
86 fixed subarray
88 first deployable subarray
90 second deployable subarray
92 fixed stripline panel
94 first deployable stripline panel
96 second deployable stripline panel
98 coaxial connector
100 patch radiator panel
102 patch radiating element
104 connecting feed trace
A0 rotation axis
A1 first rotation axis
A2 second rotation axis

The invention claimed is:
1. An apparatus for conveying an electrical signal, comprising:
   a first member;
   a second member, hinged to the first member via hinge means; and
   at least one bridge component arranged to provide an electromagnetic coupling between the first and second members, whereby a portion of the at least one bridge component member spans a gap between the first and second members;
   wherein the bridge component is free to slide relative to at least one of the first member or second member while maintaining the electromagnetic coupling between the first and second members, such that the length of said portion of the bridge component that spans the gap between the first and second members is variable so as to allow the first and second members to move between a folded state and an unfolded state.
2. The apparatus of claim 1, wherein the at least one bridge component is arranged to be moveable relative to both the first member and second member while remaining attached thereto.
3. The apparatus of claim 1, further comprising at least one guide assembly provided on at least one of the first member or second member within which the at least one bridge component is arranged to slide.
4. The apparatus of claim 3, wherein the guide assembly is arranged to limit the range of movement of the at least one bridge component, preferably wherein the guide assembly comprises means for limiting the range of movement of the at least one bridge component.

5. The apparatus of claim 3, wherein the at least one guide assembly comprises a cover arranged to retain the at least one bridge component within the guide assembly.

6. The apparatus of claim 1, wherein the at least one bridge component is sufficiently flexible to allow it to be moved between a folded state, preferably where an angle between the first and second member is less than about 15 degrees, and an unfolded state, preferably where the angle between the first member and second member is between about 90 degrees and about 180 degrees.

7. The apparatus of claim 1, wherein the at least one bridge component is arranged to bias apart the first and second hinged members from a folded state to an unfolded state, optionally wherein the at least one bridge component is resiliently deformable such that it is placed under strain when the first and second members are folded together.

8. The apparatus of claim 1, further comprising a further bridge component arranged to provide an electromagnetic coupling between the first and second members, wherein said at least one (first) bridge component is arranged on a first surface of each of the first and second hinged members, and the further (second) bridge component is arranged on a second surface of each of the first and second hinged members.

9. The apparatus of claim 8, wherein the further (second) bridge component is configured to be able to move relative to at least one of the first member or second member while maintaining the electromagnetic coupling between the first and second members, such that the length of a portion of said further (second) bridge component that spans the gap between the first and second members is variable so as to allow the first and second members to move between a folded state and an unfolded state.

10. The apparatus of claim 9, wherein the further (second) bridge component arranged on said second surface is configured to move relative to said at least one of the first member or second member in an opposing direction to said (first) bridge component arranged on said first surface.

11. The apparatus of claim 10, wherein the further (second) bridge component is arranged to act as a ground plane, optionally wherein the further (second) bridge component is wider than said (first) bridge component.

12. The apparatus of claim 11, wherein at least one of the ground plane or the electrically conductive trace has a length that is approximately equal to a fraction of the wavelength corresponding to a desired operating frequency of an electrical signal to be conveyed by the bridge component.

13. The apparatus of claim 12, wherein the fraction is a multiple of about one eighth; optionally wherein the fraction is about one eighth; optionally wherein the fraction is about one quarter, or optionally wherein the fraction is about one half.

14. The apparatus of claim 1, wherein at least one of said (first) bridge component or the further (second) bridge component comprises at least one electrically conductive trace.

15. The apparatus of claim 1, further comprising means for inhibiting passive intermodulation in the electrical signal.

16. The apparatus of claim 1, wherein said at least one bridge component comprises a dielectric medium.

17. The apparatus of claim 1, further comprising a low-friction film provided between the at least one bridge component and at least one of the first member or second member, optionally a film comprising fluorinated ethylenepropylene.

18. The apparatus of claim 1, wherein at least one of the first member or second member comprises a transmission line medium, optionally a planar transmission line medium, optionally a stripline transmission line or a microstrip transmission line.

19. A deployable radio frequency (RF) transmission line, comprising:
at least two members, hinged together for deployment between a folded state and an unfolded state; and
at least one bridge component disposed at each inter-member junction to provide RF coupling for the transfer of RF energy between the at least two hinged members, whereby a portion of the at least one bridge component spans a gap between the at least two members; and
wherein the at least one bridge component is free to slide relative to at least one of the at least two members while maintaining the RF coupling between the at least two members, such that the length of said portion of the at least one bridge component that spans the gap between the at least two members is variable so as to allow the at least two members to move between a folded state and an unfolded state.

20. The deployable RF transmission line of claim 19, wherein the at least one bridge component is resiliently deformable such that folding the first member and second member together places the at least one bridge component under at least one of compressive stress, tensile stress or strain, whereby the at least one bridge component acts to bias apart the first and second hinged members from a folded state to an unfolded state, for example during deployment of the RF transmission line.

21. The deployable RF transmission line of claim 19, whereby RF energy may be conveyed throughout the at least two hinged members once deployed to feed one or more radiating elements of an antenna.

22. The deployable RF transmission line of claim 19, wherein each member is a panel of a deployable antenna.

23. The deployable RF transmission line of claim 19 arranged to convey RF energy between the body of a satellite and at least one radiating component disposed on a deployable panel, optionally for the purpose of illuminating a reflector antenna of the satellite.

* * * * *